US011657953B2

(12) United States Patent
Osada et al.

(10) Patent No.: US 11,657,953 B2
(45) Date of Patent: May 23, 2023

(54) SEMICONDUCTOR DEVICE AND SEMICONDUCTOR MODULE

(71) Applicant: ROHM CO., LTD., Kyoto (JP)

(72) Inventors: Kosei Osada, Kyoto (JP); Isamu Nishimura, Kyoto (JP); Tetsuya Kagawa, Kyoto (JP); Daiki Yanagishima, Kyoto (JP); Toshiyuki Ishikawa, Kyoto (JP); Michihiko Mifuji, Kyoto (JP); Satoshi Kageyama, Kyoto (JP); Nobuyuki Kasahara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 224 days.

(21) Appl. No.: 17/230,356

(22) Filed: Apr. 14, 2021

(65) Prior Publication Data

US 2021/0233700 A1 Jul. 29, 2021

Related U.S. Application Data

(63) Continuation of application No. 16/803,522, filed on Feb. 27, 2020, now Pat. No. 11,011,297, which is a
(Continued)

(30) Foreign Application Priority Data

Nov. 13, 2013 (JP) .................................. 2013-235190
Nov. 13, 2013 (JP) .................................. 2013-235191
(Continued)

(51) Int. Cl.
*H01F 27/28* (2006.01)
*H01L 23/64* (2006.01)
(Continued)

(52) U.S. Cl.
CPC ....... *H01F 27/288* (2013.01); *H01F 27/2804* (2013.01); *H01L 23/49575* (2013.01);
(Continued)

(58) Field of Classification Search
CPC .............. H01F 27/288; H01F 27/2804; H01F 2027/2819; H01L 23/49575;
(Continued)

(56) References Cited

U.S. PATENT DOCUMENTS 5,245,216 A 9/1993 Sako
6,870,503 B2 3/2005 Mohamadi
(Continued)

FOREIGN PATENT DOCUMENTS

JP 2004311655 A 11/2004
JP 2005077484 A 3/2005
(Continued)

OTHER PUBLICATIONS

JP: Office Action of 2018-158636 (related application); dated May 9, 2019; 8 pages.
(Continued)

*Primary Examiner* — Bitew A Dinke
(74) *Attorney, Agent, or Firm* — Gregory M. Howison

(57) ABSTRACT

The semiconductor device of the present invention includes an insulating layer, a high voltage coil and a low voltage coil which are disposed in the insulating layer at an interval in the vertical direction, a low potential portion which is provided in a low voltage region disposed around a high voltage region for the high voltage coil in planar view and is connected with potential lower than the high voltage coil, and an electric field shield portion which is disposed between the high voltage coil and the low voltage region and includes an electrically floated metal member.

22 Claims, 41 Drawing Sheets

Related U.S. Application Data continuation of application No. 15/624,205, filed on Jun. 15, 2017, now abandoned, which is a continuation of application No. 14/537,234, filed on Nov. 10, 2014, now Pat. No. 9,697,948.

(30) Foreign Application Priority Data

Jul. 15, 2014 (JP) .................................. 2014-145041
Oct. 28, 2014 (JP) .................................. 2014-219492

(51) Int. Cl.
*H01L 23/522* (2006.01)
*H01L 23/58* (2006.01)
*H01L 23/495* (2006.01)
*H01L 23/31* (2006.01)

(52) U.S. Cl.
CPC ...... *H01L 23/5225* (2013.01); *H01L 23/5227* (2013.01); *H01L 23/585* (2013.01); *H01L 23/645* (2013.01); *H01F 2027/2819* (2013.01); *H01L 23/3107* (2013.01); *H01L 2224/04042* (2013.01); *H01L 2224/05554* (2013.01); *H01L 2224/05567* (2013.01); *H01L 2224/06135* (2013.01); *H01L 2224/48137* (2013.01); *H01L 2224/48195* (2013.01); *H01L 2224/48247* (2013.01); *H01L 2224/49113* (2013.01); *H01L 2224/49175* (2013.01); *H01L 2924/10253* (2013.01); *H01L 2924/10272* (2013.01); *H01L 2924/13091* (2013.01); *H01L 2924/14* (2013.01); *H01L 2924/19041* (2013.01); *H01L 2924/19042* (2013.01); *H01L 2924/19104* (2013.01)

(58) Field of Classification Search
CPC ............. H01L 23/5225; H01L 23/5227; H01L 23/585; H01L 23/645; H01L 23/3107; H01L 2224/04042; H01L 2224/05554; H01L 2224/05567; H01L 2224/06135; H01L 2224/48137; H01L 2224/48195; H01L 2224/48247; H01L 2224/49113; H01L 2224/49175; H01L 2924/10253; H01L 2924/10272; H01L 2924/13091; H01L 2924/14; H01L 2924/19041; H01L 2924/19042; H01L 2924/19104
See application file for complete search history.

(56) References Cited

U.S. PATENT DOCUMENTS

| | | | |
|---|---|---|---|
| 6,882,034 B2 | 4/2005 | Corisis et al. | |
| 6,963,307 B2 | 11/2005 | Mohamadi | |
| 7,064,442 B1 | 6/2006 | Lane et al. | |
| 8,378,776 B1 | 2/2013 | Gabrys et al. | |
| 8,921,988 B2 | 12/2014 | Hsu et al. | |
| 9,697,948 B2 * | 7/2017 | Osada | H01L 23/49575 |
| 9,831,161 B2 | 11/2017 | Matsubara et al. | |
| 10,056,318 B2 | 8/2018 | Matsubara et al. | |
| 11,011,297 B2 * | 5/2021 | Osada | H01F 27/288 |
| 11,094,443 B2 * | 8/2021 | Tanaka | H01F 17/0013 |
| 2003/0042571 A1 * | 3/2003 | Chen | H01F 17/0006 336/200 |
| 2004/0056749 A1 | 3/2004 | Kahlmann et al. | |
| 2004/0164825 A1 | 8/2004 | Volant et al. | |
| 2005/0156305 A1 | 7/2005 | Moriguchi et al. | |
| 2005/0230837 A1 | 10/2005 | Taghizadeh-Kaschani | |
| 2006/0263727 A1 | 11/2006 | Lee et al. | |
| 2007/0205855 A1 | 9/2007 | Hashimoto | |
| 2008/0061631 A1 | 3/2008 | Fouquet et al. | |
| 2008/0079636 A1 | 4/2008 | Mohamadi | |
| 2008/0079652 A1 * | 4/2008 | Mohamadi | H01L 23/66 343/893 |
| 2008/0197963 A1 | 8/2008 | Muto | |
| 2009/0160011 A1 | 6/2009 | Park | |
| 2009/0243782 A1 * | 10/2009 | Fouquet | H03F 3/45192 336/200 |
| 2009/0243783 A1 * | 10/2009 | Fouquet | H04L 25/0266 336/200 |
| 2009/0244866 A1 | 10/2009 | Kawano et al. | |
| 2009/0289347 A1 | 11/2009 | Ochi | |
| 2009/0302420 A1 | 12/2009 | Nakashiba | |
| 2010/0157565 A1 | 6/2010 | Yoshida et al. | |
| 2010/0230782 A1 * | 9/2010 | Uchida | H01L 23/645 257/E29.325 |
| 2010/0230783 A1 | 9/2010 | Nakashiba | |
| 2010/0259909 A1 * | 10/2010 | Ho | H03H 7/46 361/767 |
| 2010/0264515 A1 * | 10/2010 | Nakashiba | H01L 23/48 257/734 |
| 2010/0265024 A1 | 10/2010 | Nakashiba | |
| 2011/0095620 A1 * | 4/2011 | Fouquet | H03F 3/45475 336/200 |
| 2011/0133561 A1 | 6/2011 | Kanazawa et al. | |
| 2011/0148549 A1 | 6/2011 | Kanschat et al. | |
| 2011/0175193 A1 | 7/2011 | Nakagawa | |
| 2011/0241160 A1 | 10/2011 | Kerber et al. | |
| 2012/0020419 A1 | 1/2012 | Kaeriyama | |
| 2012/0062040 A1 | 3/2012 | Kaeriyama | |
| 2012/0162947 A1 | 6/2012 | O'Donnell et al. | |
| 2012/0168901 A1 | 7/2012 | Santangelo et al. | |
| 2012/0249279 A1 | 10/2012 | Itou et al. | |
| 2012/0256290 A1 * | 10/2012 | Renna | H01L 25/0657 438/118 |
| 2013/0043970 A1 * | 2/2013 | Poddar | H01F 27/36 336/84 C |
| 2013/0075861 A1 * | 3/2013 | Kerber | H01L 24/05 257/532 |
| 2013/0135076 A1 | 5/2013 | Nasase | |
| 2013/0154071 A1 * | 6/2013 | Haigh | H01L 23/49531 257/676 |
| 2013/0249302 A1 | 9/2013 | An et al. | |
| 2013/0278372 A1 * | 10/2013 | Stecher | H01L 23/5227 336/200 |
| 2013/0280879 A1 * | 10/2013 | Stecher | H01L 21/76802 257/E21.022 |
| 2013/0321094 A1 | 12/2013 | Sumida et al. | |
| 2014/0061643 A1 | 3/2014 | Kaeriyama | |
| 2014/0175602 A1 | 6/2014 | Funaya et al. | |
| 2014/0252533 A1 * | 9/2014 | O'Sullivan | H01L 23/49575 257/506 |
| 2014/0253225 A1 | 9/2014 | Lee et al. | |
| 2014/0264722 A1 * | 9/2014 | Nakashiba | H01L 23/5227 257/506 |
| 2015/0001948 A1 * | 1/2015 | Brauchler | H01L 23/49575 438/109 |
| 2015/0069572 A1 * | 3/2015 | Khanolkar | H01L 28/10 257/531 |
| 2015/0130022 A1 * | 5/2015 | Watanabe | H01L 23/49575 257/531 |
| 2015/0132890 A1 * | 5/2015 | Kerber | H01F 27/2804 438/107 |
| 2015/0280785 A1 | 10/2015 | Brauchler et al. | |
| 2015/0318245 A1 | 11/2015 | Uchida et al. | |
| 2016/0035672 A1 | 2/2016 | Funaya et al. | |
| 2016/0072167 A1 | 3/2016 | Kawai et al. | |
| 2017/0287624 A1 | 10/2017 | Osada et al. | |
| 2018/0130587 A1 | 5/2018 | Tanaka et al. | |
| 2022/0367603 A1 * | 11/2022 | Tanaka | H01F 27/2804 |

FOREIGN PATENT DOCUMENTS

| | | |
|---|---|---|
| JP | 2005236033 A | 9/2005 |
| JP | 2008270720 A | 11/2008 |
| JP | 2009076483 A | 4/2009 |
| JP | 2009232637 A | 10/2009 |
| JP | 2009302268 A | 12/2009 |
| JP | 2010080773 A | 4/2010 |

(56) References Cited

FOREIGN PATENT DOCUMENTS

| | | | |
|---|---|---|---|
| JP | 2010080774 | A | 4/2010 |
| JP | 2010114283 | A | 5/2010 |
| JP | 2010123898 | A | 6/2010 |
| JP | 2010212669 | A | 9/2010 |
| JP | 2012182740 | A | 9/2012 |
| JP | 2012257421 | A | 12/2012 |
| JP | 2013115131 | A | 6/2013 |
| JP | 2013149940 | A | 8/2013 |
| JP | 2013229815 | A | 11/2013 |
| JP | 2014053365 | A | 3/2014 |
| JP | 2016028407 | A | 2/2016 |
| JP | 2019016799 | A | 1/2019 |
| WO | 2010113383 | A1 | 10/2010 |
| WO | 2010137090 | A1 | 12/2010 |
| WO | 2012008171 | A1 | 1/2012 |
| WO | 2014097425 | A1 | 6/2014 |

OTHER PUBLICATIONS

Notice of Reasons for Refusal of JP Patent Application No. JP 2019-169505 (related application); Iwamoto, Tsutomu; dated Aug. 13, 2020; 6 pages.
Japanese Patent Office: Notice of Reasons for Refusal of JP Patent Application No. JP 2020-218502 (related application); Ichikawa, Takenori; dated Dec. 23, 2021; 6 pages.

* cited by examiner

FIG. 3 (FINISHED PLANE)

FIG. 4 (LOWER COIL PLANE)

FIG. 13 (FINISHED PLANE)

FIG. 16 (FINISHED PLANE)

FIG. 20 (FINISHED PLANE)

FIG. 22 (UPPER COIL PLANE)

FIG. 25 (FINISHED PLANE)

FIG. 26 (LOWER COIL PLANE)

FIG. 27 (UPPER COIL PLANE)

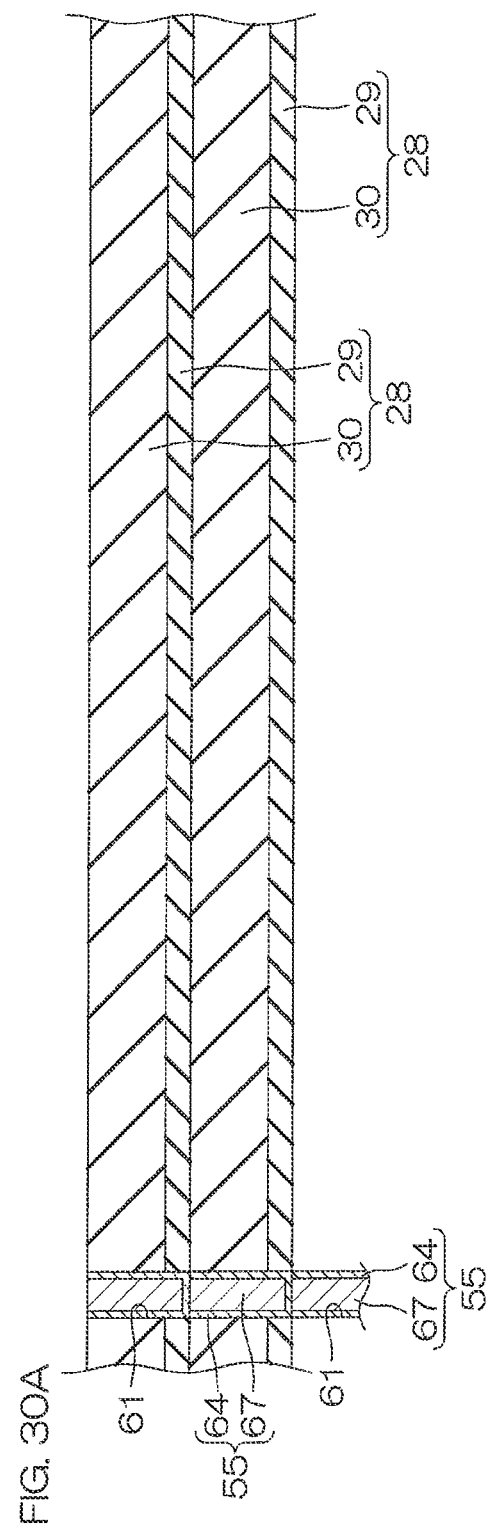

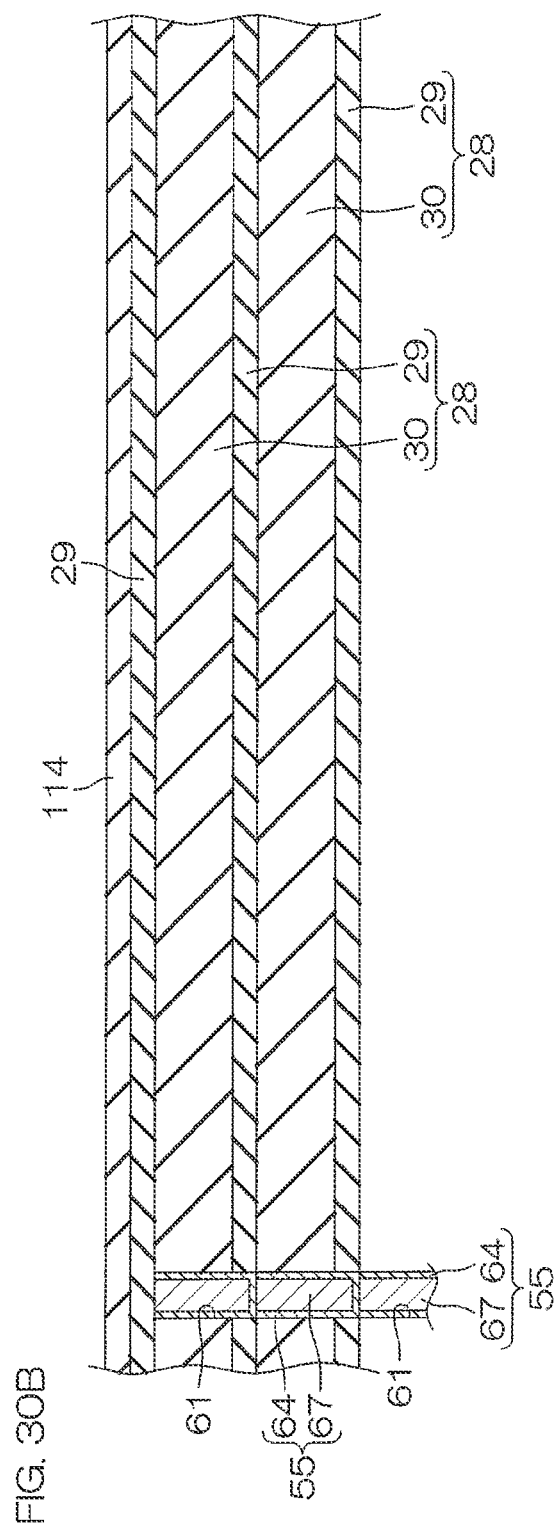

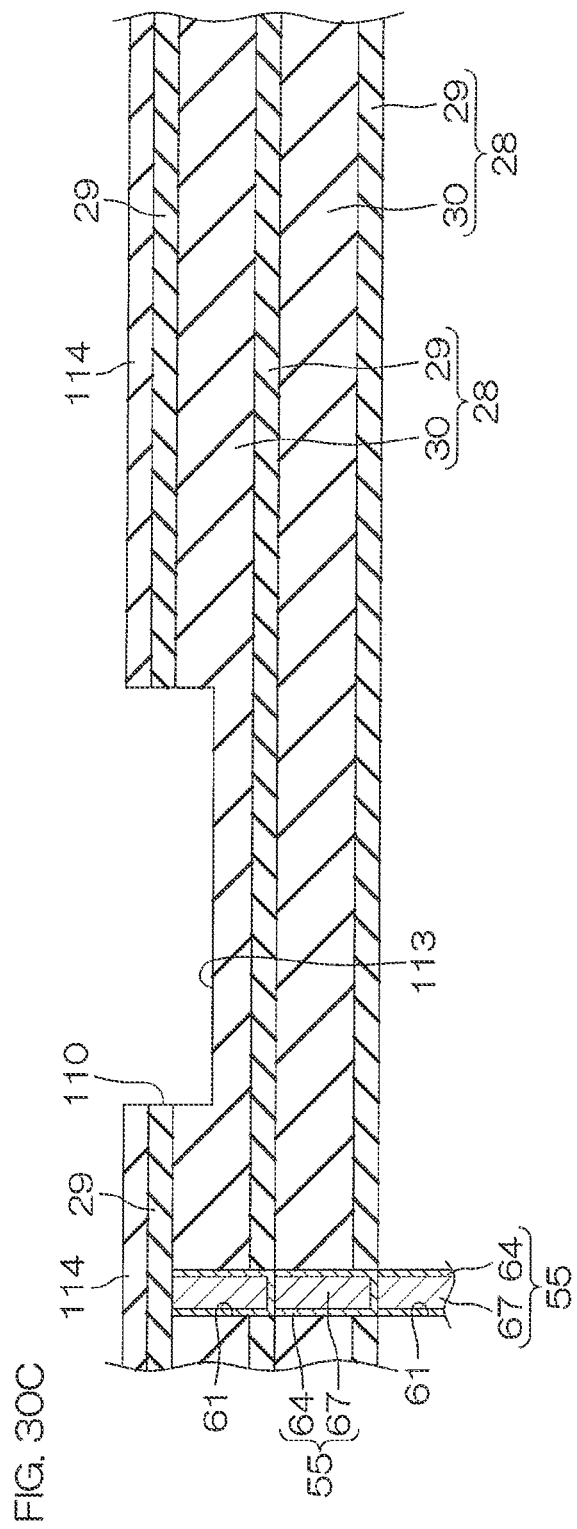

SEMICONDUCTOR DEVICE AND SEMICONDUCTOR MODULE

CROSS-REFERENCE TO RELATED APPLICATIONS

This application is a continuation of U.S. application Ser. No. 16/803,522, filed Feb. 27, 2020, which is a continuation of U.S. application Ser. No. 15/624,205, filed Jun. 15, 2017, and entitled SEMICONDUCTOR DEVICE AND SEMICONDUCTOR MODULE, which is a continuation of U.S. application Ser. No. 14/537,234, filed on Nov. 10, 2014, issued as U.S. Pat. No. 9,697,948 on Jul. 4, 2017, which claims the benefit of priority of the Japanese Patent Application No. 2013-235190 filed in the Japan Patent Office on Nov. 13, 2013, Japanese Patent Application No. 2013-235191 filed in the Japan Patent Office on Nov. 13, 2013, Japanese Patent Application No. 2014-145041 filed in the Japan Patent Office on Jul. 15, 2014, and Japanese Patent Application No. 2014-219492 filed in the Japan Patent Office on Oct. 28, 2014, the entire disclosures of which are hereby incorporated by reference.

FIELD OF THE INVENTION

The present invention relates to a semiconductor device provided with a transformer, and a semiconductor module provided with the semiconductor device.

BACKGROUND ART

In the power electronics field, for example, a transformer having a pair of coils which are disposed so as to face each other is under development.

Disclosed in Patent Document 1 (Japanese Patent Application Publication No. 2013-11531) is a transformer having a pair of inductors. One inductor and the other inductor are disposed to face each other at positions 180 degrees apart around the central axis as the axis of rotation.

SUMMARY OF THE INVENTION

A part of a transformer where a countermeasure to enhance voltage resistance is required is typically an insulating film between a pair of coils. The reason is that high voltage between the coils of the transformer is applied to the insulating film and a thin insulating film cannot resist such high voltage.

Meanwhile, a low voltage region (e.g., a region where wiring for a low voltage coil is formed) is sometimes provided in a region apart from a transformer in an in-plane direction (horizontal direction) of the insulating film. The distance between the low voltage region and the transformer is usually set several tens of times or more as large as the distance between the coils of the transformer. Therefore, occurrence of dielectric breakdown in a region between the low voltage region and the transformer has hardly been studied.

However, as a result of diligent study by the present inventors, it has been found in surge breakdown tests between the coils of the transformer that the insulating film sometimes breaks down along a horizontal direction even when breakdown does not occur between the coils.

One embodiment of the present invention provides a semiconductor device which can enhance voltage resistance between a high voltage coil and a low potential portion in a low voltage region around the high voltage coil.

Moreover, one embodiment of the present invention provides a semiconductor module which can enhance voltage resistance between a high voltage coil and a low potential portion in a low voltage region around the high voltage coil.

BRIEF DESCRIPTION OF THE DRAWINGS

FIGS. 30A to 30H are sectional views for explaining processes involved in formation of a homogeneous interface structure.

DETAILED DESCRIPTION OF THE EMBODIMENT

Figure 1:
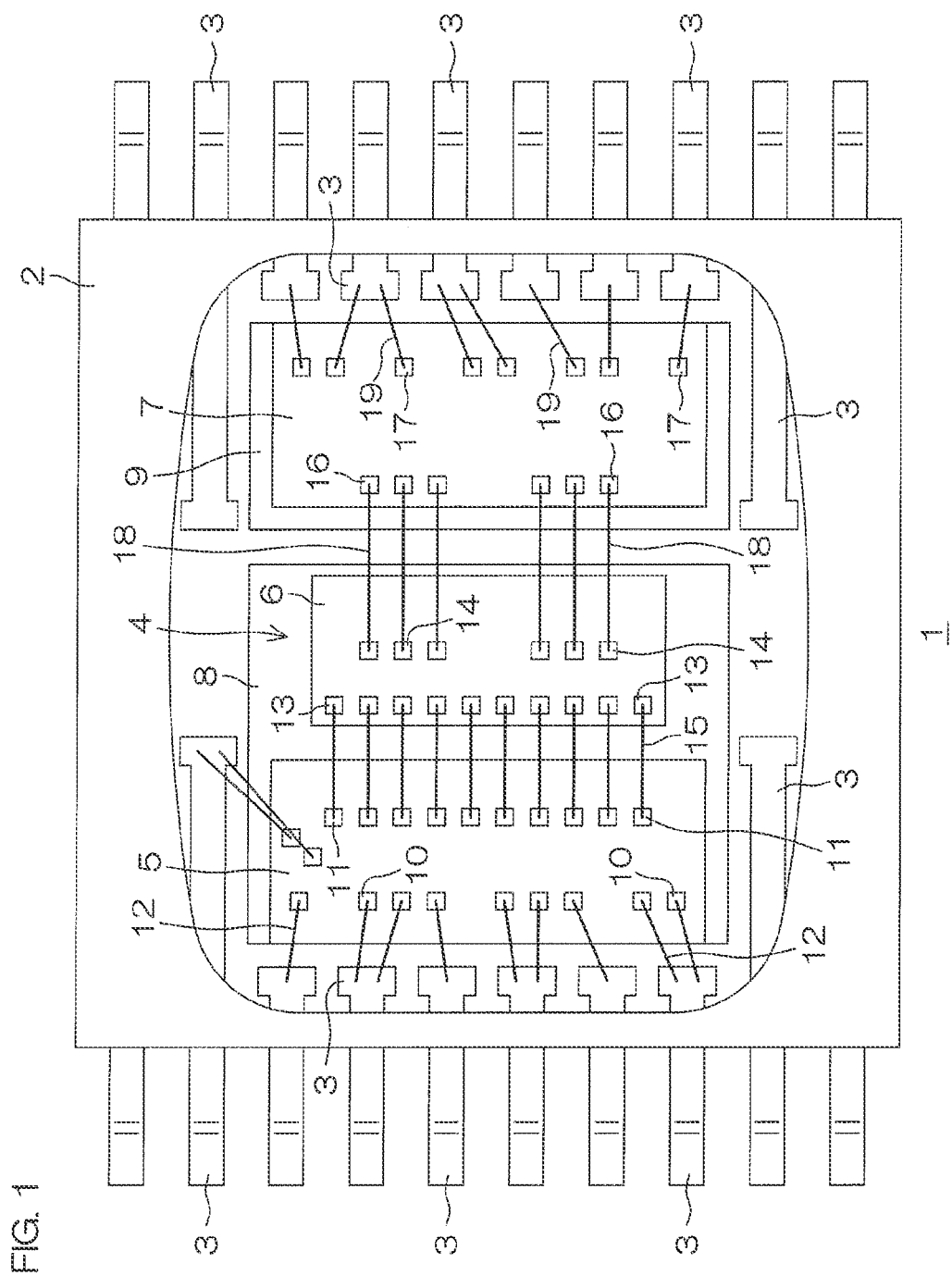
FIG. 1 is a schematic plan view of a semiconductor module for illustrating one embodiment of the present invention.

One embodiment of the present invention provides a semiconductor device including: an insulating layer, a high voltage coil and a low voltage coil which are disposed in the insulating layer at an interval in the vertical direction, a low potential portion which is provided in a low voltage region disposed around a high voltage region for the high voltage coil in planar view and is connected with potential lower than the high voltage coil, and an electric field shield portion which is disposed between the high voltage coil and the low voltage region and includes an electrically floated metal member.

Since the electric field shield portion is provided between the high voltage coil and the low voltage region, it is possible to relax electric field concentration on the low potential portion. Thus, it is possible to enhance voltage resistance between the high voltage coil and the low voltage region.

In one embodiment of the present invention, the electric field shield portion includes a capacitor composed of a plurality of electrode plates which face each other at intervals in a horizontal direction. In such a case, three or more electrode plates may be provided at equal intervals or at unequal intervals.

In one embodiment of the present invention, the low potential portion includes low voltage wiring which is connected with the low voltage coil.

In one embodiment of the present invention, the low potential portion includes a low voltage pad which is exposed to the surface of the insulating layer and is connected with the low voltage wiring, and the electric field shield portion is disposed between the high voltage coil and the low voltage pad.

When the low voltage pad has a corner portion, electric field tends to concentrate on the corner portion, causing surge breakdown. By disposing the electric field shield portion between the high voltage coil and the low voltage pad, it is possible to effectively prevent such surge breakdown.

In one embodiment of the present invention, the insulating layer includes an insulating film laminated structure including a plurality of insulating films which are laminated successively, the high voltage coil and the low voltage coil are respectively embedded in separate insulating films, one or more insulating films are interposed between the high voltage coil and the low voltage coil, and the electric field shield portion is composed of electrode plates which are embedded in at least one insulating film.

In such a case, a plurality of electrode plates may face the same insulating film at intervals and constitute a capacitor. In addition, three or more electrode plates may be provided at equal intervals or at unequal intervals.

Moreover, the electrode plates may be provided in the same insulating film independently so as not to overlap each other in a horizontal direction.

In one embodiment of the present invention, the electrode plates are embedded in an insulating film for the high voltage coil, an insulating film for the low voltage coil, and an insulating film disposed therebetween. In such a case, the insulating film between the insulating film for the high voltage coil and the insulating film for the low voltage coil may be a plurality of films or a single film. In a case of a plurality of films, the electrode plates may be embedded in all of the films or in some of the films selectively.

In one embodiment of the present invention, the electrode plates embedded in the respective insulating films are arranged continuously in the vertical direction.

In one embodiment of the present invention, the electrode plates are embedded selectively in an insulating film for the high voltage coil and an insulating film for the low voltage coil. That is, the electrode plates may be embedded only in the insulating films for the high voltage coil and for the low voltage coil and not in insulating films disposed therebetween.

In one embodiment of the present invention, the low potential portion includes a shield layer which is embedded in a plurality of insulating films so as to surround the high voltage region, and the electrode plates are embedded in the same insulating film as the shield layer. In such a structure, it is possible to form the shield layer and the electric field shield portion (electrode plates) in the same process.

In one embodiment of the present invention, the high voltage coil is an upper coil which is disposed at a side relatively near to the surface of the insulating film laminated structure, the low voltage coil is a lower coil which is disposed below the upper coil, and the low potential portion includes low voltage wiring which is connected with the lower coil and penetrates the insulating film laminated structure in the lamination direction.

In one embodiment of the present invention, the low potential portion includes a low voltage pad which is exposed to the surface of the insulating layer laminated structure and is connected with the low voltage wiring.

When the low voltage pad has a corner portion, electric field tends to concentrate on the corner portion, causing surge breakdown. By disposing the electric field shield portion between the high voltage coil and the low voltage pad, it is possible to effectively prevent such surge breakdown.

In one embodiment of the present invention, a distance L1 between the high voltage coil and the electric field shield portion in a horizontal direction is larger than a distance L2 between the high voltage coil and the low voltage coil in the vertical direction.

In one embodiment of the present invention, the electric field shield portion surrounds the high voltage coil. Thus, an electric field emitted from the high voltage coil is relaxed regardless of the direction thereof.

One embodiment of the present invention includes a substrate arranged to support the insulating layers, and the low voltage coil is connected with the substrate.

One embodiment of the present invention provides a semiconductor module including a semiconductor device according to one embodiment of the present invention, a low voltage element which is electrically connected with the low voltage coil of the semiconductor device, a high voltage element which is electrically connected with the high voltage coil of the semiconductor device, and a resin package arranged to collectively seal the semiconductor device, the low voltage element and the high voltage element.

The following description will explain one embodiment of the present invention in detail with reference to accompanying drawings.

FIG. 1 is a schematic plan view of a semiconductor module 1 for illustrating one embodiment of the present invention. In FIG. 1, a central portion of the module 1 is drawn perspectively for the purpose of clarification of the inner structure of the semiconductor module 1.

The semiconductor module 1 is a module obtained by arranging a plurality of chips in one package, and includes a resin package 2, a plurality of leads 3, and a plurality of chips 4.

The resin package 2 is formed in a quadrilateral (square) plate shape using epoxy resin, for example.

The plurality of leads 3 are provided astride inside and outside of the resin package 2 via a pair of end faces, which face each other, of the resin package 2. Thus, the package type of the semiconductor module 1 is SOP (Small Outline Package). It is to be noted that the semiconductor module 1 is not limited to SOP, and various types of packages such as QFP (Quad Flat Package) or SOJ (Small Outline J-lead Package) can be employed, for example.

The plurality of chips 4 include a controller chip 5 (controller IC) as an example of a low voltage element of the present invention, a transformer chip 6 as an example of a semiconductor device of the present invention, and a driver chip 7 (driver IC) as an example of a high voltage element of the present invention.

The transformer chip 6 is disposed at a substantially central portion of the resin package 2, and the controller chip 5 and the driver chip 7 are respectively disposed at one lead 3 side and at the other lead 3 side of the transformer chip 6. That is, the controller chip 5 and the driver chip 7 are disposed so as to sandwich the transformer chip 6 therebetween and are respectively adjacent to a plurality of leads 3.

The respective chips 5 to 7 are formed in a quadrilateral (rectangular) shape and, in this embodiment, the transformer chip 6 is formed smaller than the controller chip 5 and the driver chip 7 which have substantially equal sizes. Moreover, the controller chip 5 and the transformer chip 6 are disposed on a common first die pad 8, and the driver chip 7 is disposed on a second die pad 9 which is provided at an interval from the first die pad 8.

A plurality of pads 10 and pads 11 are formed on the surface of the controller chip 5. The plurality of pads 10 are arranged along a long side of the controller chip 5 at a side near to the leads 3 and are connected with the leads 3 by bonding wires 12. The plurality of pads 11 are arranged along a long side of the controller chip 5 at a side far from the lead 3 (side near to the transformer chip 6).

A plurality of low voltage pads 13 and high voltage pads 14 are formed on the surface of the transformer chip 6. The plurality of low voltage pads 13 are arranged along a long side of the transformer chip 6 at a side near to the controller chip 5 and are connected with the pads 11 of the controller chip 5 by bonding wires 15. That is, in this embodiment, the pads 11 of the controller chip 5 are connected with the primary side of the transformer chip 6. The plurality of high voltage pads 14 are arranged at a central portion of the transformer chip 6 in the width direction along a long side of the transformer chip 6.

A plurality of pads 16 and pads 17 are formed on the surface of the driver chip 7. The plurality of pads 16 are arranged along a long side of the driver chip 7 at a side near to the transformer chip 6 and are connected with the high voltage pads 14 of the transformer chip 6 by bonding wires 18. That is, in this embodiment, the pads 16 of the driver chip 7 are connected with the secondary side of the transformer chip 6. The plurality of pads 17 are arranged along a long side of the driver chip 7 at a side far from the transformer chip 6 (side near to the leads 3) and are connected with the leads 3 by bonding wires 19.

It is to be noted that the arrangement configuration of the pads of the respective chips 5 to 7 illustrated in FIG. 1 is only an example, and may be changed suitably depending on the package type or the arrangement configuration of the chips 4.

Figure 2:
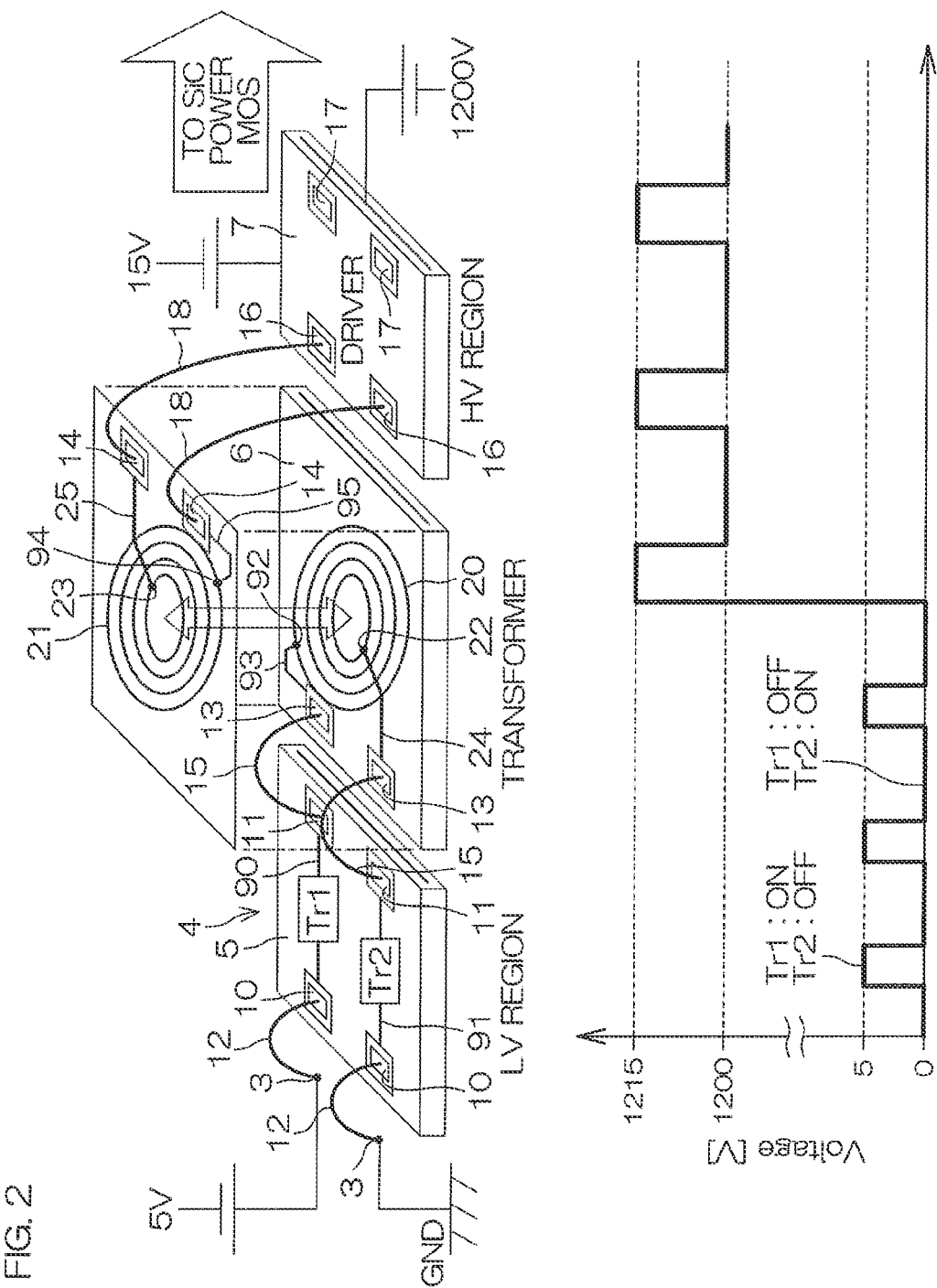
FIG. 2 is a view illustrating the connection configuration of the semiconductor module and potential of respective portions.

FIG. 2 is a view illustrating the connection configuration of the semiconductor module 1 in FIG. 1 and potential of respective portions.

As illustrated in FIG. 2, in the transformer chip 6 of the semiconductor module 1, a lower coil 20 at the primary side (low voltage side) as an example of a low voltage coil of the present invention and an upper coil 21 at the secondary side (high voltage side) as an example of a high voltage coil of the present invention face each other at an interval in the vertical direction. The lower coil 20 and the upper coil 21 are respectively formed in a spiral shape.

An inner coil end 22 (inner end of the spiral) and an outer coil end 92 (outer end of the spiral) of the lower coil 20 are connected respectively with low voltage wiring 24 and low voltage wiring 93. Ends of the low voltage wiring 24 and 93 are exposed as the low voltage pads 13.

An inner coil end 23 and an outer coil end 94 of the upper coil 21 are connected respectively with high voltage wiring 25 (inner coil end wiring) and high voltage wiring 95 (outer coil end wiring). Ends of the high voltage wiring 25 and 95 are exposed as the high voltage pads 14.

The controller chip 5 is provided with a transistor Tr1 disposed in the middle of wiring 90 arranged to connect one pad 10 with one pad 11. The controller chip 5 is also provided with a transistor Tr2 disposed in the middle of wiring 91 arranged to connect another pad 10 with another pad 11. The transistors Tr1 and Tr2 are respectively switching elements arranged to conduct/shut off the wiring 90 and 91. Pads 10 and 11 at the wiring 90 side are connected respectively with input voltage and a low voltage pad 13 at the outer coil end 92 side through the bonding wires 12 and 15. Pads 10 and 11 at the wiring 91 side are connected respectively with ground voltage and a low voltage pad 13 at the inner coil end 22 side through the bonding wires 12 and 15.

By controlling the controller chip 5 so that a first application state (Tr1: ON, Tr2: OFF) and a second application state (Tr1: OFF, Tr2: ON) are alternated, periodic pulse voltage is generated at the lower coil 20 of the transformer chip 6. For example, in FIG. 2, pulse voltage of 5V on the basis of reference voltage=0V (ground voltage) is generated at the lower coil 20.

In the transformer chip 6, a DC signal is interrupted between the lower coil 20 and the upper coil 21 while only an AC signal based on pulse voltage generated at the lower coil 20 is selectively transmitted to the high voltage side (upper coil 21) by electromagnetic induction. An AC signal to be transmitted is boosted corresponding to the transformation ratio between the lower coil 20 and the upper coil 21, and is taken out to the driver chip 7 through the bonding wires 18. For example, in FIG. 2, pulse voltage of 5V is taken out to the driver chip 7 as pulse voltage of 15V on the basis of reference voltage=1200V. By applying inputted pulse voltage of 15V to a gate electrode (unillustrated) of an SiC power MOSFET (e.g., voltage between source and drain=1200V), the driver chip 7 performs switching operation of the MOSFET.

It is to be noted that a specific voltage value illustrated in FIG. 2 is only an example to be used for explaining the operation of the semiconductor module 1. The reference voltage of the driver chip 7 (HV region) may be a value exceeding 1200V (e.g., 3750V).

Figure 3:
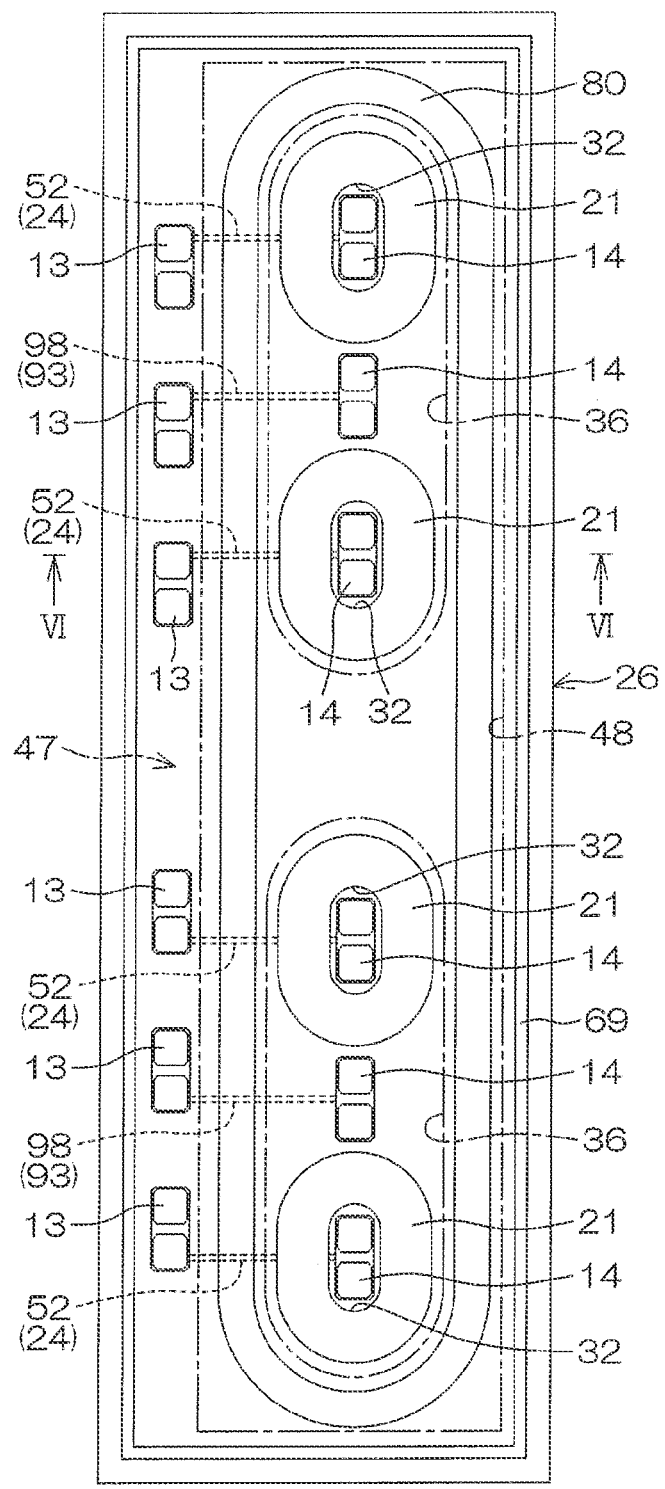
FIG. 3 is a schematic view for explaining the planar structure of a transformer chip.
Figure 4:
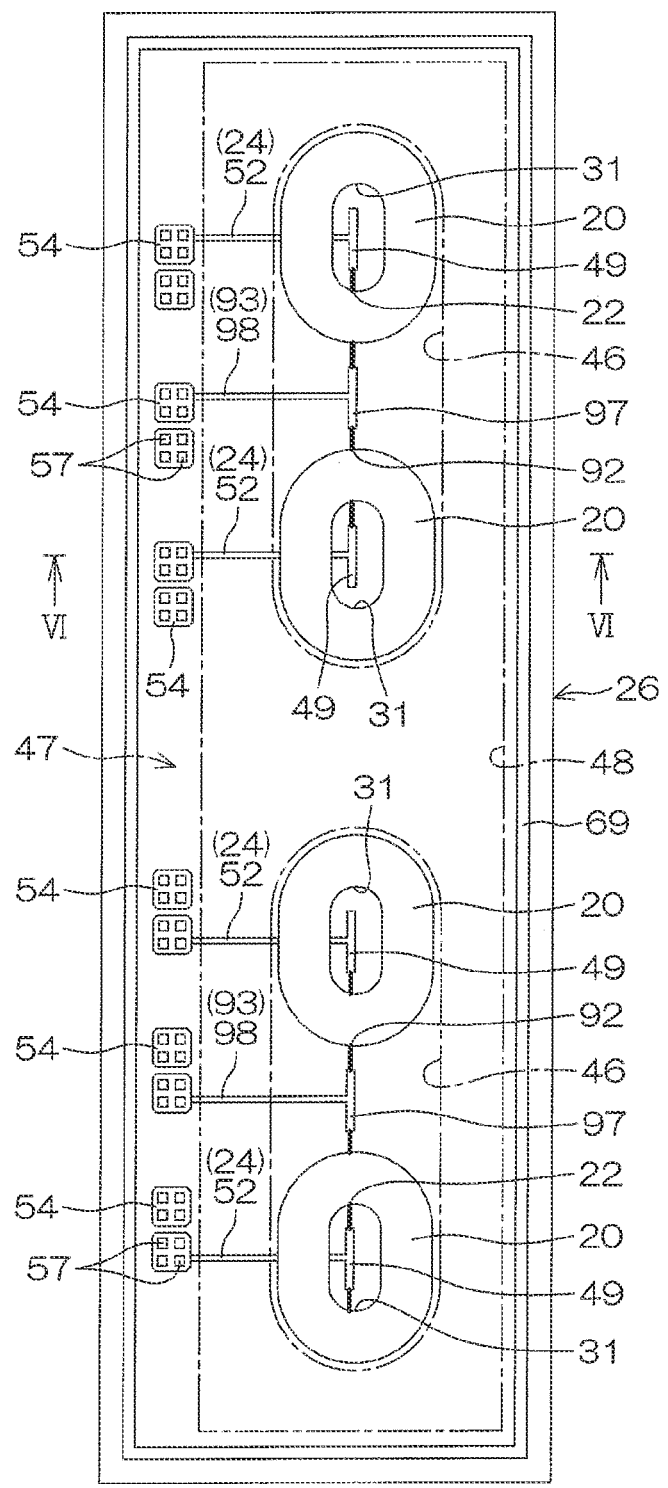
FIG. 4 is a schematic view for explaining the planar structure of a lower coil of the transformer chip.
Figure 5:
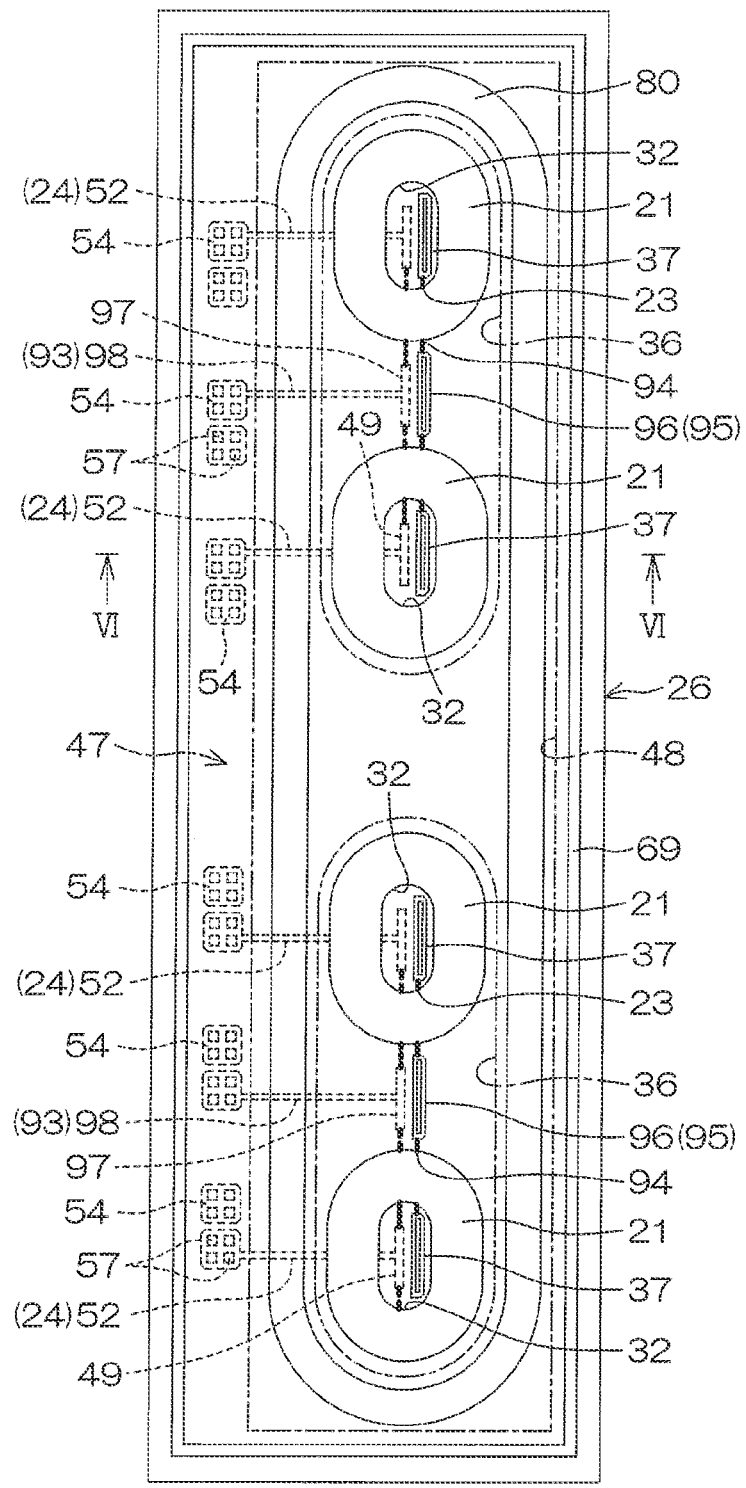
FIG. 5 is a schematic view for explaining the planar structure of an upper coil of the transformer chip.
Figure 6:
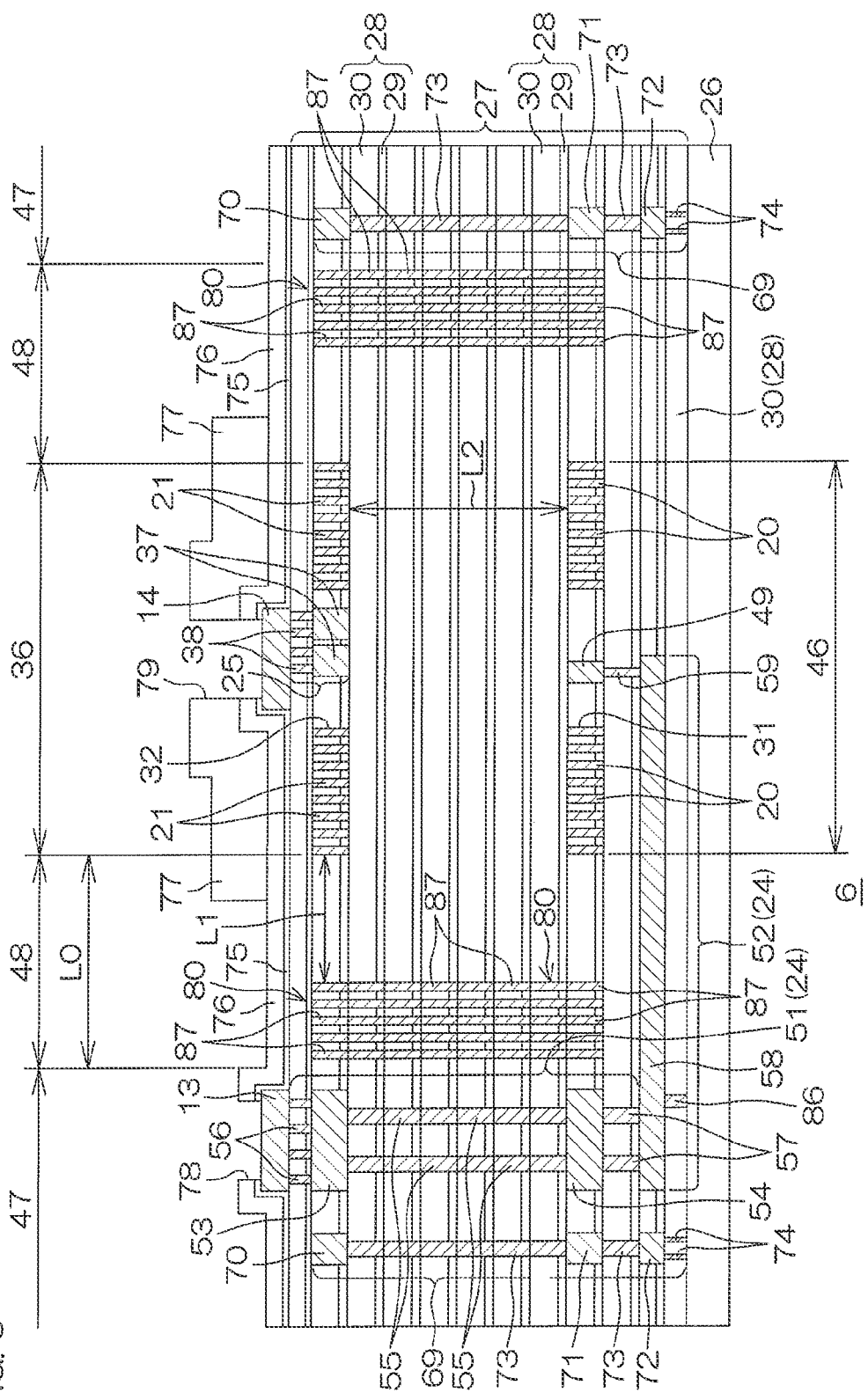
FIG. 6 is a sectional view of the transformer chip (sectional view taken along line VI-VI in FIG. 3).
Figure 7:
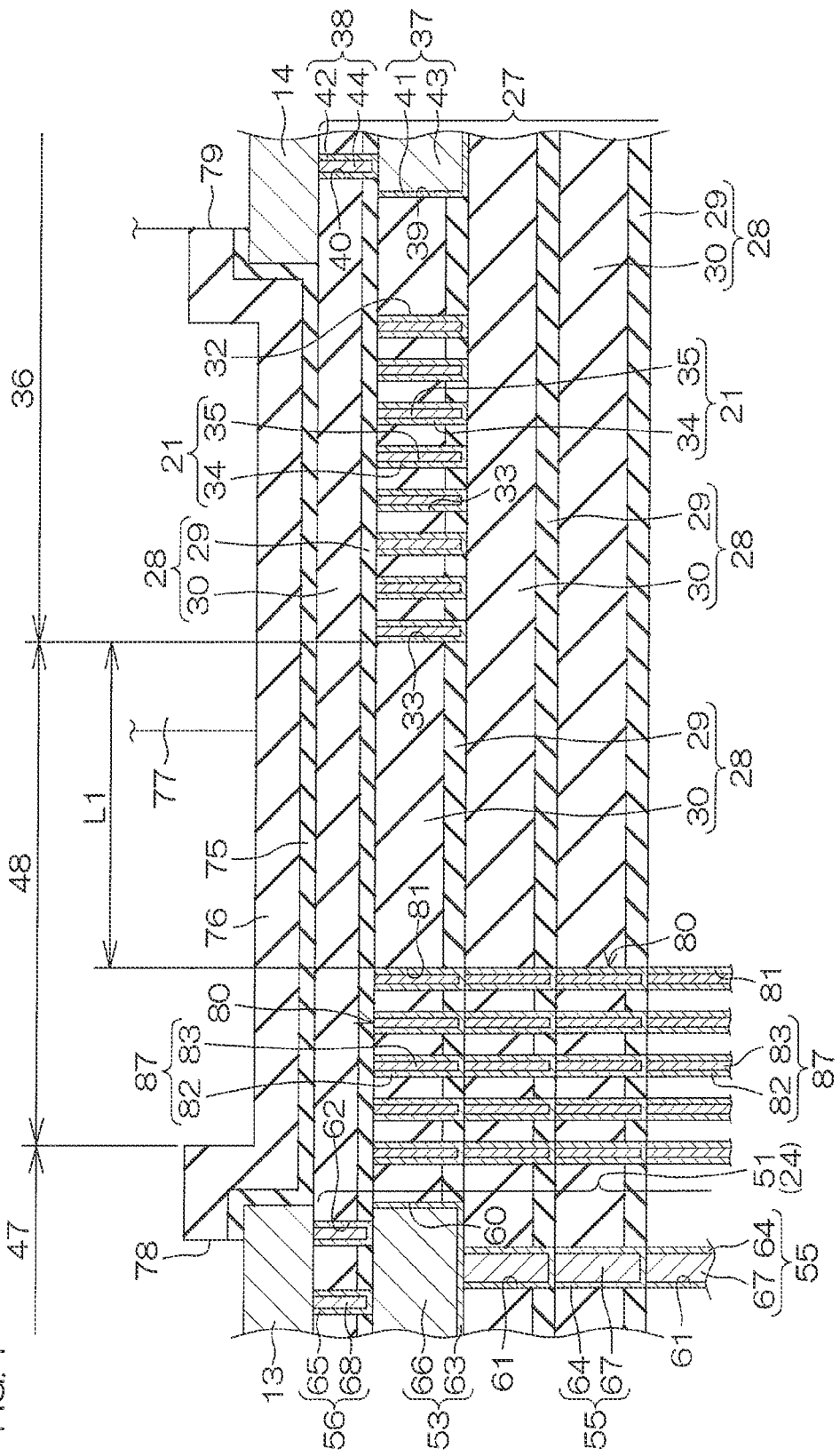
FIG. 7 is an enlarged view of a main portion of the transformer chip in FIG. 6.

FIG. 3 is a schematic view for explaining the planar structure of the transformer chip 6 in FIG. 1. FIG. 4 is a schematic view for explaining the planar structure of a layer where the lower coil 20 of the transformer chip 6 is disposed. FIG. 5 is a schematic view for explaining the planar structure of a layer where the upper coil 21 of the transformer chip 6 is disposed. FIG. 6 is a sectional view of the transformer chip 6 (sectional view taken along line VI-VI in FIG. 3). FIG. 7 is an enlarged view of the upper coil 21 in FIG. 6 and a surrounding area. In FIG. 6, only a metal part is marked by hatching for the purpose of clarification.

Next, the inner structure of the transformer chip 6 will be explained in more detail.

As illustrated in FIG. 6, the transformer chip 6 includes a semiconductor substrate 26 and an insulating layer laminated structure 27 which is formed on the semiconductor substrate 26. As the semiconductor substrate 26, an Si (silicon) substrate, an SiC (silicon carbide) substrate etc., can be utilized.

The insulating layer laminated structure 27 is composed of a plurality of (twelve in FIG. 6) insulating layers which are laminated successively from the surface of the semiconductor substrate 26. Each of the insulating layers 28 is constituted of a laminated structure of an etching stopper film 29 at a lower layer and an interlayer insulating film 30 at an upper layer, except an insulating layer 28 at the bottom layer in contact with the surface of the semiconductor substrate 26. The insulating layer 28 at the bottom layer is constituted of only an interlayer insulating film 30. As the etching stopper film 29, an SiN film, an SiC film, an SiCN film etc., can be used, for example. As the interlayer insulating film 30, an $SiO_2$ film can be used, for example.

The lower coil 20 and the upper coil 21 are formed in different insulating layers 28 in the insulating layer laminated structure 27 and face each other with one or more insulating layers 28 sandwiched therebetween. In this embodiment, the lower coil 20 is formed in an insulating layer 28, which is the fourth layer from the semiconductor substrate 26, and the upper coil 21 is formed in an insulating layer 28, which is the eleventh layer, with six insulating layers 28 sandwiched between the upper coil 21 and the lower coil 20.

As illustrated in FIGS. 3 to 5, the lower coil 20 and the upper coil 21 are respectively formed in an ellipse annular region surrounding inner regions 31 and 32 so that elliptical inner regions 31 and 32 in planar view are marked out in the center.

The structure of the lower coil 20 and the upper coil 21 in regions surrounding the inner regions 31 and 32 can be explained with reference to the upper coil 21 illustrated in FIG. 7. That is, as illustrated in FIG. 7, a coil groove 33 in an ellipse spiral shape is formed in the insulating layer 28 at a region surrounding the inner region 32. The coil groove 33 is formed so as to penetrate the interlayer insulating film 30 and the etching stopper film 29 below the interlayer insulating film 30. Thus, the upper end and the lower end of the coil groove 33 respectively form planes which are open to the etching stopper film 29 of an upper insulating layer 28 and the interlayer insulating films 30 of a lower insulating layer 28.

Barrier metal 34 is formed on an inner face (side face and bottom face) of the coil groove 33. The barrier metal 34 is formed in a film shape in accordance with the side face and the bottom face of the coil groove 33 so that space opened upward is formed at the coil groove 33. In this embodiment, the barrier metal 34 is formed by laminating a Ta (tantalum) film, a TaN (tantalum nitride) film and a Ta film in this order from a side near to the inner face of the coil groove 33. In addition, by embedding Cu (copper) wiring material 35 inside the barrier metal 33 at the coil groove 33, the upper coil 21 is formed as an example of an embedded coil which is composed of the barrier metal 34 and the Cu wiring material 35.

The upper coil 21 is formed so that the top face thereof becomes flush with the top face of the insulating layer 28. Thus, the upper coil 21 is in contact with different insulating layers 28 respectively at the side face, the top face and the bottom face. Specifically, an etching stopper film 29 and an interlayer insulating film 30 of an insulating layer 28 where the upper coil 21 is embedded are in contact with the side face of the upper coil 21, and only an etching stopper film 29 at the lower layer of an insulating layer 28 which is formed at the upper side of the insulating film 28 is in contact with the top face of the upper coil 21. Moreover, only an interlayer insulating film 30 at the upper layer of an insulating layer 28 at the lower side is in contact with the bottom face of the upper coil 21.

It is to be noted that the lower coil 20 is also formed by embedding barrier metal and Cu wiring material in a coil groove in a manner similar to the upper coil 21, though the explanation is omitted here.

As illustrated in FIGS. 3, 6 and 7, the high voltage pads 14 are formed on the surface of the insulating layer laminated structure 27 (on an interlayer insulating film 30 of an insulating layer 28 at the uppermost layer). The high voltage pads 14 are disposed in a central high voltage region (HV region) 36 where the upper coil 21 is disposed, in planar view in which the transformer chip 6 is seen from above along the lamination direction of the insulating layer laminated structure 27.

Here, the high voltage region 36 includes a region where the upper coil 21 and wiring having the same potential as the upper coil 21 are formed, and a surrounding portion of the formation region in the insulating layer 28 where the upper coil 21 is embedded. In this embodiment, as illustrated in FIG. 5, four upper coils 21 are formed with two pairs disposed at an interval in the longitudinal direction of the transformer chip 6. Inner coil end wiring 37 and outer coil end wiring 96 are respectively formed in the inner regions 32 of the upper coils 21 of each pair and between adjacent upper coils 21. Thus, one upper coil 21 and the other upper coil 21 of each pair are electrically connected to each other by common outer coil end wiring 96 disposed therebetween, and both of the upper coils 21, the outer coil end wiring 96 disposed therebetween and the inner coil end wiring 37 in each upper coil 21 all have the same potential. Accordingly, an inner region 32 of each upper coil 21 and a region between upper coils 21 of each pair in the insulating layer 28 are also included in the high voltage region 36 as a range to be affected by an electric field from the upper coil 21, the inner coil end wiring 37 or the outer coil end wiring 96. It is to be noted that a region where the lower coil 21 (low voltage coil) is disposed is not included in the high voltage region 36 in this embodiment though the region corresponds to the high voltage region 36 in planar view, since the region is separated from the high voltage coil 21 by a plurality of insulating layers 28 and is hardly affected by an electric field from the upper coil 21.

Specifically, as illustrated in FIG. 3, six high voltage pads 14 are disposed respectively above the inner regions 32 of the respective upper coils 21 and above regions between upper coils 21 of the respective pairs.

For example, as illustrated in FIGS. 6 and 7, one high voltage pad 14 is connected with inner coil end wiring 37, which is embedded in the same insulating layer 28 as the upper coil 21, through a via 38. Another high voltage pad 14 is connected with outer coil end wiring 96, which is embedded in the same insulating layer 28 as the upper coil 21, through a via in a similar structure, though this is not illustrated in the figures. Thus, an AC signal transmitted to the upper coil 21 can be outputted from the high voltage pad 14 via the inner coil end wiring 37 and the via 38, and the outer coil end wiring 96 and a via (unillustrated). That is, a combination of the inner coil end wiring 37 and the via 38 connected therewith, and a combination of the outer coil end wiring 96 and a via connected therewith respectively constitute the high voltage wiring 25 and the high voltage wiring 95 in FIG. 2.

It is to be noted that the inner coil end wiring 37 and the via 38 are respectively formed by embedding barrier metal 41 and 42 and Cu wiring material 43 and 44 in wiring grooves 39 and 40 in a manner similar to the upper coil 21 as illustrated in FIG. 7 (the same goes for the outer coil end wiring 96 and a via connected therewith). The same material as the above barrier metal 34 can be utilized as the barrier metal 41 and 42.

Meanwhile, a low voltage region 46 (FIGS. 4 and 6), an outer low voltage region 47 (FIGS. 3 to 7) and an intermediate region 48 (FIGS. 3 to 7) are set in the insulating layer laminated structure 27 as a low potential region (LV region) which is electrically separated from the high voltage region 36.

The low voltage region 46 includes a region where the lower coil 20 and wiring having the same potential as the lower coil 20 are formed, and a surrounding portion of the formation region in the insulating layer 28 where the lower coil 20 is embedded. Similar to the relationship between the lower coil 20 and the upper coil 21, the low voltage region 46 faces the high voltage region 36 with one or more insulating layers 28 sandwiched therebetween. In this embodiment, as illustrated in FIG. 4, four lower coils 20 are formed with two pairs disposed at positions to face the upper coils 21, that is, at an interval in the longitudinal direction of the transformer chip 6. Inner coil end wiring 49 and outer coil end wiring 97 are respectively formed in the inner regions 31 of the lower coils 20 of each pair and between adjacent lower coils 20. Thus, one lower coil 20 and the other lower coil 20 of each pair are electrically connected to each other by common outer coil end wiring 97 disposed therebetween, and both of the lower coils 20, the outer coil end wiring 97 disposed therebetween and the inner coil end wiring 49 in each lower coil 20 all have the same potential. Accordingly, an inner region 31 of each lower coil 20 and a region between lower coils 20 of each pair in the insulating layer 28 are also included in the low voltage region 46 as a range to be affected by an electric field from the lower coil 20, the inner coil end wiring 49 or the outer coil end wiring 97. It is to be noted that the inner coil end wiring 49 is disposed at a position shifted from the inner coil end wiring 37 at the high voltage side in planar view as illustrated in FIG. 5.

As illustrated in FIGS. 3 to 5, the outer low voltage region 47 is set so as to surround the high voltage region 36 and the low voltage region 46, and the intermediate region 48 is set between the outer low voltage region 47 and the high voltage region 36 and low voltage region 46.

As illustrated in FIGS. 3, 6 and 7, the low voltage pads 13 are formed on the surface of the insulating layer laminated structure 27 at the outer low voltage region 47 (on the interlayer insulating film 30 of the uppermost insulating layer 28). In this embodiment, six low voltage pads 13 are disposed respectively at lateral sides of six high voltage pads 14 disposed at intervals in the longitudinal direction of the transformer chip 6. Each low voltage pad 13 is connected with a lower coil 20 by low voltage wiring 24 and 93 led in the insulating layer laminated structure 27.

The low voltage wiring 24 includes through wiring 51 and lead-out wiring 52.

The through wiring 51 is formed in a columnar shape to penetrate at least an insulating layer 28 where the lower coil 20 is formed from each low voltage pad 13 in the outer low voltage region 47 and reach an insulating layer 28 at a lower position than that of the lower coil 20. Specifically, the through wiring 51 respectively includes insular (quadrangular) low voltage layer wiring 53 and 54 which are embedded in the same insulating layer 28 as the upper coil 21 and the lower coil 20, a plurality of vias 55 arranged to connect the low voltage layer wiring 53 and 54 to each other, a via 56 arranged to connect the low voltage layer wiring 53 at the upper side with the low voltage pad 13, and a via 57 arranged to connect the low voltage layer wiring 54 at the lower side with the lead-out wiring 52.

The lead-out wiring 52 is formed in a linear shape which is led out from the low voltage region 46 via an insulating layer 28 at a lower position than that of the lower coil 20 to the outer low voltage region 47. Specifically, the lead-out wiring 52 includes the above inner coil end wiring 49, linear lead-out layer wiring 58 which is embedded in an insulating layer 28 at a lower position than that of the lower coil 20 and crosses the lower coil 20 at a lower position, and a via 59 arranged to connect the lead-out layer wiring 58 with the inner coil end wiring 49. The lead-out layer wiring 58 is connected with the semiconductor substrate 26 through a via 86. Thus, the lower voltage wiring 24 is fixed to substrate voltage (e.g., ground voltage).

It is to be noted that the wiring 49, 53, 54 and 58 and the vias 55 to 57 and 59 are respectively formed by embedding barrier metal and Cu wiring material in wiring grooves in a manner similar to the upper coil 21. As an example, as illustrated in FIG. 7, the low voltage layer wiring 53 and the vias 55 and 56 are respectively formed by embedding barrier metal 63 to 65 and Cu wiring material 66 to 68 in wiring grooves 60 to 62. The same material as the above barrier metal 34 can be utilized as the barrier metal 63 to 65.

It is to be noted that the low voltage wiring 93 is also constituted of wiring which includes through wiring (unillustrated) and lead-out wiring 98 (FIGS. 3 to 5), though detailed explanation thereof will be omitted.

With the above structure, one low voltage pad 13 is connected with inner coil end wiring 49 of a lower coil 20 via the through wiring 51 and the lead-out wiring 52 as illustrated in FIGS. 3 to 6. Moreover, another low voltage pad 13 is connected with outer coil end wiring 96 of a lower coil 20 via through wiring and the lead-out wiring 98 as illustrated in FIGS. 3 to 6. Thus, a signal inputted to the low voltage pad 13 can be transmitted via the through wiring 51 and the lead-out wiring 52 to the lower coil 21.

In the insulating layer laminated structure 27, a shield layer 69 is formed at a side further outside than the low voltage wiring 24. The shield layer 69 prevents infiltration of moisture from the outside into the device or expansion of a crack at an end face to the inside.

As illustrated in FIGS. 3 to 6, the shield layer 69 is formed to form a wall along the end face of the transformer chip 6 and is connected with the semiconductor substrate 26 at the bottom portion. Thus, the shield layer 69 is fixed to substrate voltage (e.g., ground voltage). Specifically, the shield layer 69 includes shield layer wiring 70 to 72 which is respectively embedded in the same insulating layers 28 as the upper coil 21, the lower coil 20 and the lead-out layer wiring 58, a plurality of vias 73 arranged to connect the shield layer wiring 70 to 72 to each other, and a via 74 arranged to connect the shield layer wiring 72 at the undermost layer with the semiconductor substrate 26 as illustrated in FIG. 6. The shield layer wiring 70 to 72 and the vias 73 and 74 are respectively formed by embedding barrier metal and Cu wiring material in wiring grooves in a manner similar to the upper coil 21.

Furthermore, a protective film 75 and a passivation film 76 are laminated successively all over the insulating layer laminated structure 27. An ellipse annular coil protective film 77 for selectively covering a region right above the upper coil 21 is formed on the passivation film 76. These films 75 to 77 are provided with pad openings 78 and 79 formed to respectively expose the low voltage pad 13 and the high voltage pad 14.

The protective film 75 is made of $SiO_2$, for example, and has a thickness of approximately 150 nm. The passivation film 76 is made of SiN, for example, and has a thickness of approximately 1000 nm. The coil protective film 77 is made of polyimide, for example, and has a thickness of approximately 4000 nm.

Next, the following description will give a further explanation on details of the respective portions of the transformer chip 6.

As described with reference to FIG. 2, a large potential difference (e.g., approximately 1200V) is generated between the lower coil 20 and the upper coil 21 of the transformer chip 6. Therefore, the insulating layers 28 disposed between the lower coil 20 and the upper coil 21 are required to have a thickness which can realize sufficient voltage resistance without causing dielectric breakdown due to the potential difference. Thereupon, in this embodiment, DC insulation in the vertical direction between the lower coil 20 and the upper coil 21 is realized by interposing a plurality of (e.g., six) insulating layers 28, which are constituted of laminated structures of etching stopper films 29 of approximately 300 nm and interlayer insulating films 30 of approximately 2100 nm, between the coils and setting a total thickness L2 of the insulating layers 28 at 12.0 μm to 16.8 μm as illustrated in FIG. 6.

Figure 8:
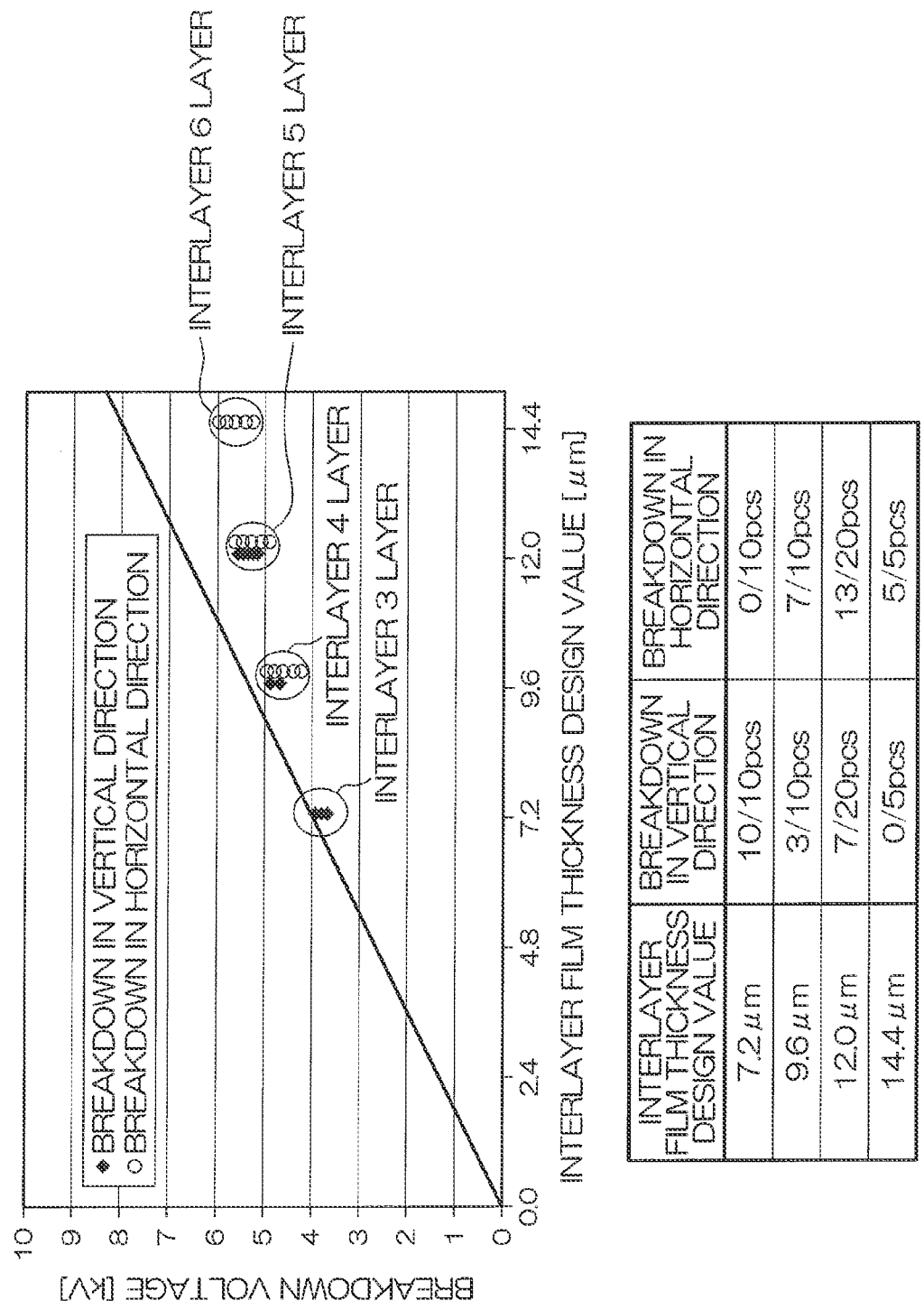
FIG. 8 is a view illustrating the relationship between thickness of an interlayer film and breakdown voltage regarding a semiconductor chip provided with a transformer.

However, the present inventors have made experiments on the relationship between thickness of interlayer films and surge breakdown voltage regarding a semiconductor chip provided with a transformer and obtained a result illustrated in FIG. 8. In FIG. 8, an interlayer film means a film which has a structure similar to the insulating layer 28 in this embodiment. As is understood from FIG. 8, as a larger number of interlayer films are interposed between coils and the thickness of the films becomes larger, breakdown in a horizontal direction between the upper coil 21 and the low voltage pad 13 (between coil and pad) or between the upper coil 21 and the shield layer 26 (between coil and shield), for example, becomes dominant, though DC insulation in the vertical direction can be realized.

A distance L0 between the upper coil 21 and the outer low voltage region 47 (width of the intermediate region 48 in this embodiment) is usually larger than the total thickness L2 of the insulating layers 28 between the lower coil 20 and the upper coil 21. For example, a typical distance L0 is 100 μm to 450 μm, and has a ratio to the above thickness L2 (distance L0/thickness L2) of 6/1 to 40/1. Accordingly, even though a potential difference equivalent to the potential difference between the lower coil 20 and the upper coil 21 (between high voltage region 36 and low voltage region 46) is generated between the high voltage region 36 and the outer low voltage region 47, dielectric breakdown does not theoretically occur in consideration of only the distance between these regions since distance L0>thickness L2 is satisfied. However, as is proved by FIG. 8, breakdown in a horizontal direction becomes more dominant as the thickness of interlayer films between coils becomes larger. It is to be noted that distance L0>>thickness L2 is actually satisfied, though the thickness L2 is drawn larger than the distance L0 in FIG. 6.

In this respect, the present inventors have found that it is possible to relax electric field concentration on a specific part of the outer low voltage region 47 and prevent breakdown in horizontal directions by providing a shield constituted of an electrically floated metal member between the high voltage region 36 and the outer low voltage region 47.

Thereupon, in this embodiment, a capacitor 80 surrounding the high voltage region 36 in planar view is provided in the intermediate region 48 as illustrated in FIGS. 3 and 5. The respective high voltage regions 36 may be surrounded by separate capacitors, though the plurality of high voltage regions 36 in FIGS. 3 and 5 are surrounded by a common capacitor 80.

The cross section structure of the capacitor 80 is illustrated in FIGS. 6 and 7. That is, the capacitor 80 is embedded in each of an insulating layer 28 where the upper coil 21 is embedded, an insulating layer 28 where the lower coil 20 is embedded and insulating layers 28 disposed therebetween, and is formed as a whole to form a wall surrounding the coil formation region of the insulating layers 28.

Each capacitor 80 is composed of a plurality of electrode plates 87 which are embedded in the respective insulating layers 28. As the plurality of electrodes plates 87, three or more (five in FIGS. 6 and 7) electrode plates 87 are provided at equal intervals and are respectively floated electrically. Moreover, electrode plates 87 embedded in the respective insulating layers 28 are arranged continuously in the vertical direction. That is, when the insulating layer laminated structure 27 is seen at a cross section, an electrode plate 87 which constitutes one capacitor 80 overlaps with electrode plates 87 disposed above and below said electrode plates 87. Thus, a plurality of electrode plates 87 which are embedded in different insulating layers 28 constitute a shield plate with no gap along the lamination direction of the insulating layer laminated structure 27.

Each electrode plate 87 is formed by embedding barrier metal 82 and Cu wiring material 83 in a wiring groove 81 as illustrated in FIG. 7 in a manner similar to the upper coil 21. The same material as the above barrier metal 34 can be utilized as the barrier metal 82.

Moreover, a distance L1 between the upper coil 21 and the capacitor 80 in a horizontal direction is larger than a total thickness L2 of insulating layers 28 between the upper coil 21 and the lower coil 20. For example, the distance L1 is 25 μm to 400 μm. It is to be noted that distance L1>>thickness L2 is actually satisfied, though the thickness L2 is drawn larger than the distance L1 in FIG. 6.

The capacitor 80 makes it possible to relax concentration of an electric field on a conductive portion (e.g., the low voltage pad 13, the low voltage layer wiring 53, the via 55, the low voltage layer wiring 54 and the shield layer 69) having low potential, which is disposed in the outer low voltage region 47, when high voltage is applied between the upper coil 21 and the lower coil 20. In particular, regarding a rectangular low voltage pad 13 or the low voltage layer wiring 53 disposed in the same layer as the upper coil 21 (high voltage coil) or a layer in the vicinity, an electric field tends to concentrate on a corner portion, causing surge breakdown. However, by disposing the capacitor 80, it is possible to effectively prevent such surge breakdown. Furthermore, in this embodiment, an electric field emitted from the upper coil 21 is relaxed regardless of the direction thereof, since the capacitor 80 surrounds the high voltage region 36. As a result, voltage resistance between the high voltage region 36 and the outer low voltage region 47 can be enhanced.

Moreover, the capacitor 80 and the shield layer 69 can be formed in the same process, since the electrode plates 87 which constitute the capacitor 80 are embedded in the same insulating layer 28 as elements which constitute the shield layer 69.

<Variations>

(1) Variation Regarding Pattern of Capacitor 80

FIGS. 9 to 13 illustrate a variation regarding the pattern of the capacitor 80.

Figure 9:
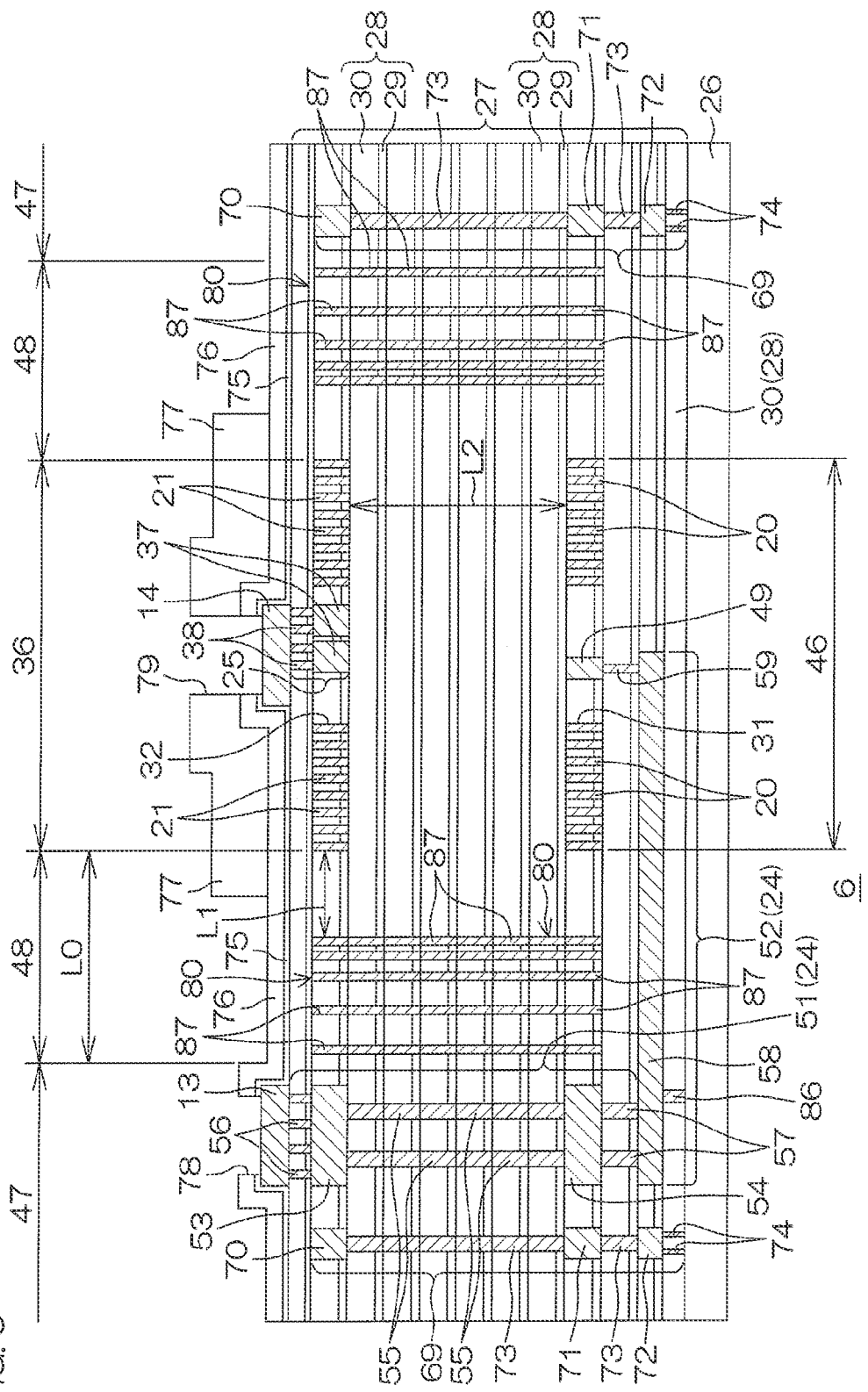
FIG. 9 illustrates a variation regarding the pattern of a capacitor in the transformer chip.

In the structure of FIG. 9, three or more electrode plates 87 which constitute each capacitor 80 are provided at unequal intervals. For example, the plurality of electrode plates 87 are arranged so that the interval becomes larger with increase in the distance from the high voltage region 36.

Figure 10:
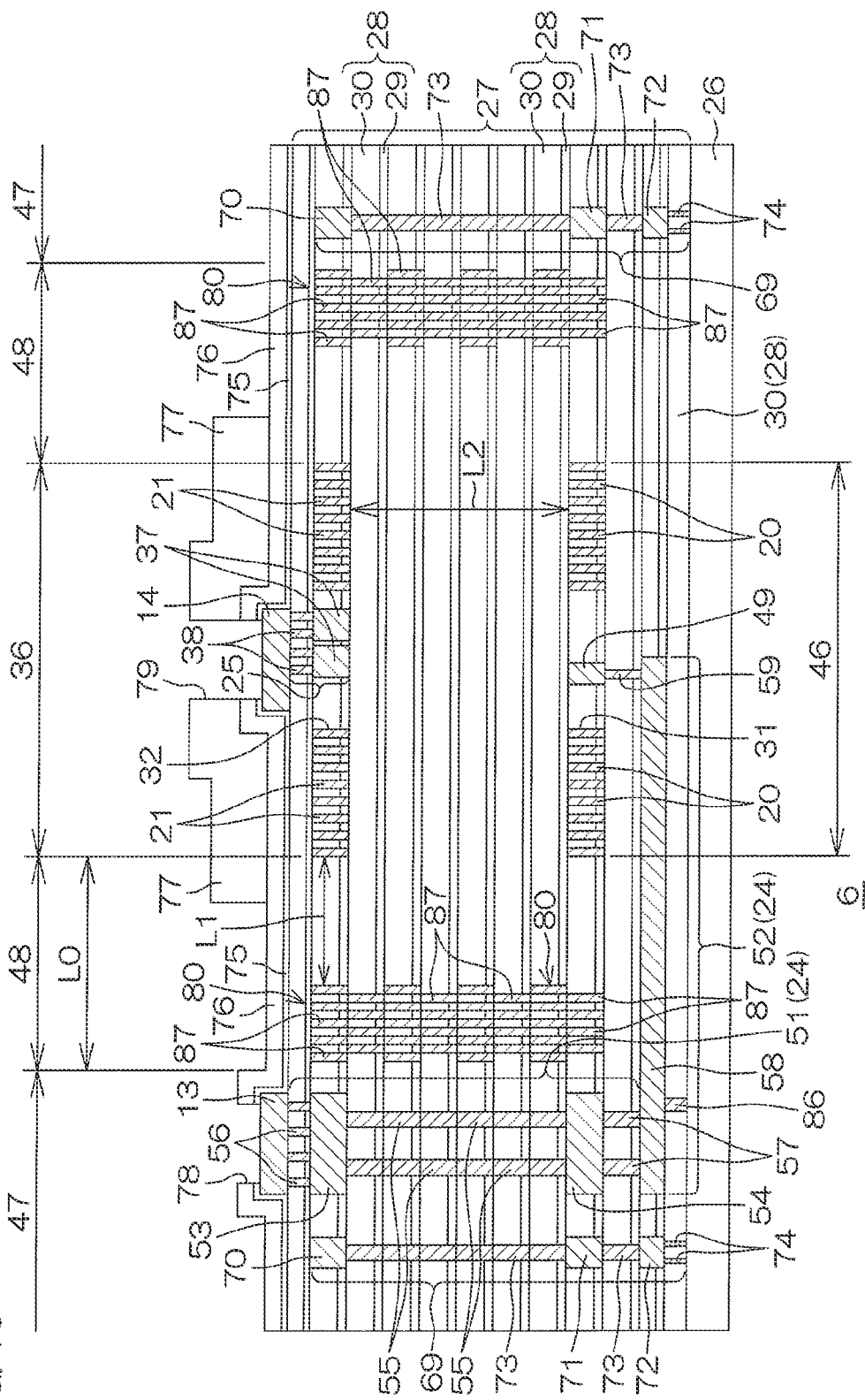
FIG. 10 illustrates a variation regarding the pattern of the capacitor in the transformer chip.

In the structure of FIG. 10, the electrode plates 87 embedded in the respective insulating layers 28 are arranged intermittently along the lamination direction of the insulating layer laminated structure 27. That is, when the insulating layer laminated structure 27 is seen at a cross section, electrode plates 87 which constitute one capacitor 80 do not overlap with electrode plates 87 disposed thereabove and therebelow. For example, as illustrated in FIG. 10, electrode plates 87 which constitute one capacitor 80 may be disposed in a region of a gap of a plurality of electrode plates 87 which constitute capacitors 80 thereabove and therebelow.

Figure 11:
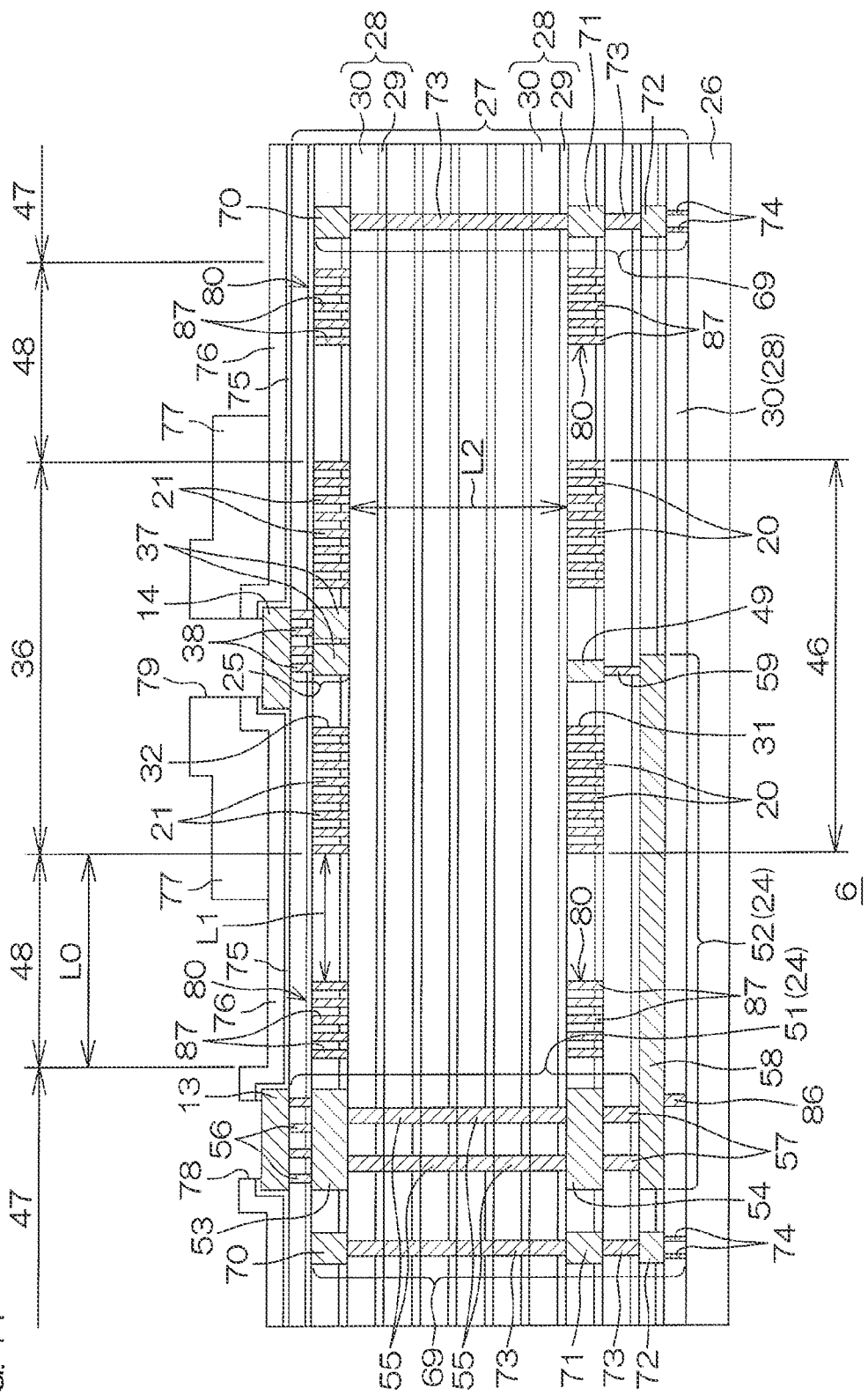
FIG. 11 illustrates a variation regarding the pattern of the capacitor in the transformer chip.

In the structure of FIG. 11, the capacitor 80 is embedded selectively in an insulating layer 28 for the upper coil 21 and an insulating layer 28 for the lower coil 20. That is, the capacitor 80 may be embedded only in insulating layers 28 for the upper coil 21 and the lower coil 20 and not in insulating layers 28 disposed therebetween.

Figure 12:
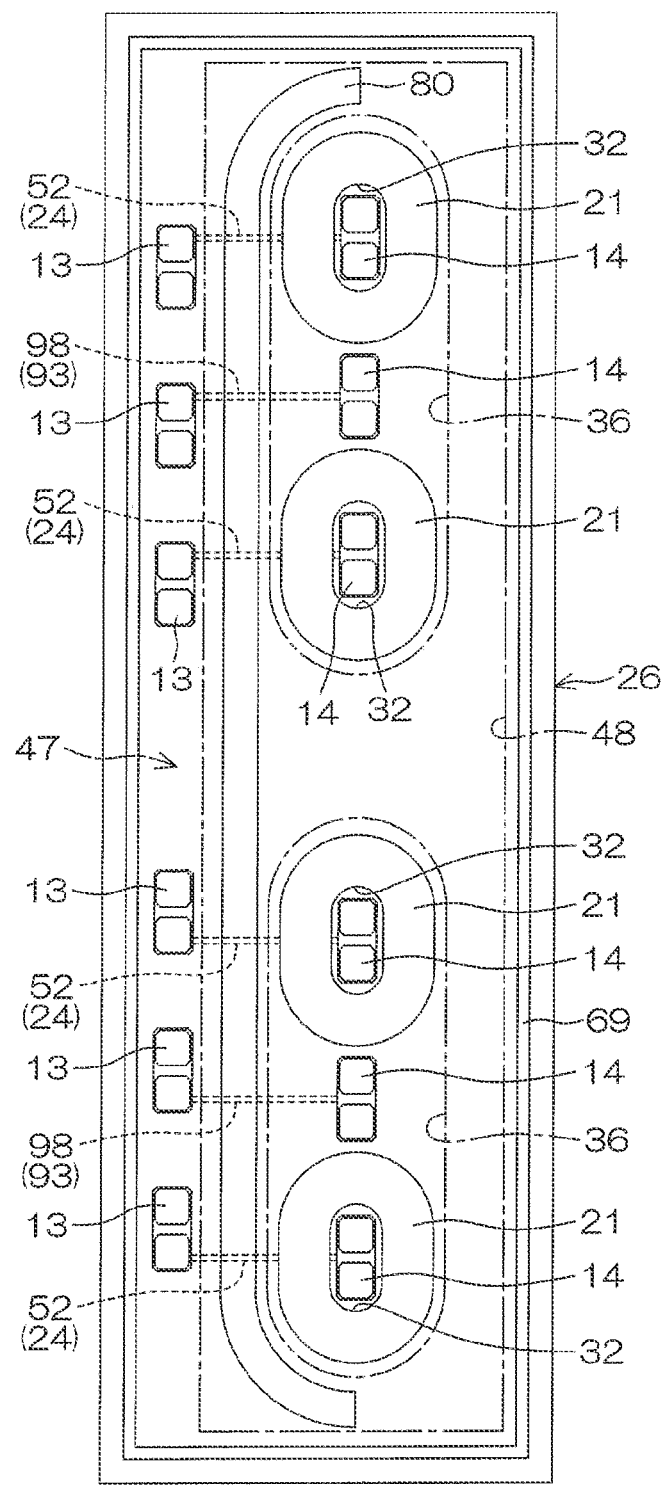
FIG. 12 illustrates a variation regarding the pattern of the capacitor in the transformer chip.
Figure 13:
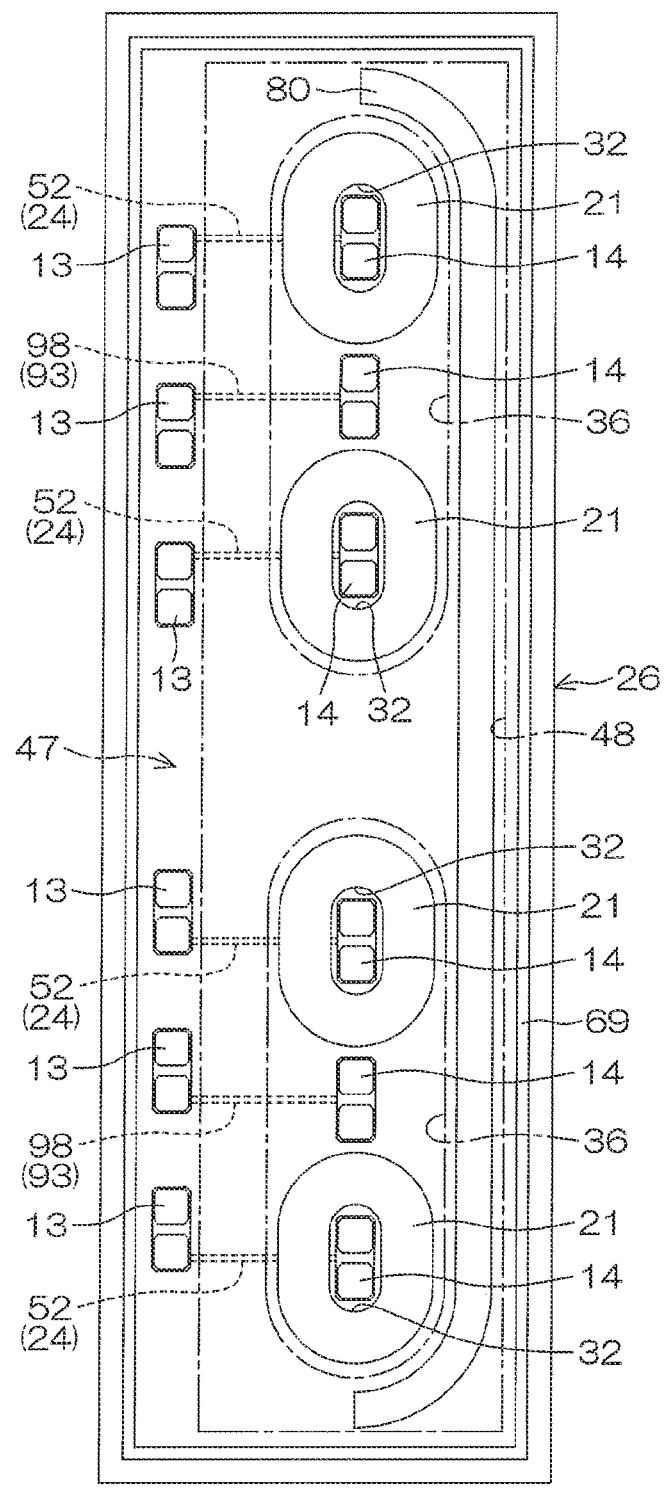
FIG. 13 illustrates a variation regarding the pattern of the capacitor in the transformer chip.

In the structure of FIG. 12, the capacitor 80 is formed selectively between the high voltage region 36 and a region (pad region) where the low voltage pad 13 is disposed in the intermediate region 48 and not in a region at the opposite side of the pad region. Meanwhile, the structure of FIG. 13 is the reverse and the capacitor 80 is formed selectively in a region at the opposite side of the pad region and not in the pad region side.

(2) Variation Having Structure which Replaces Capacitor 80

Figure 14:
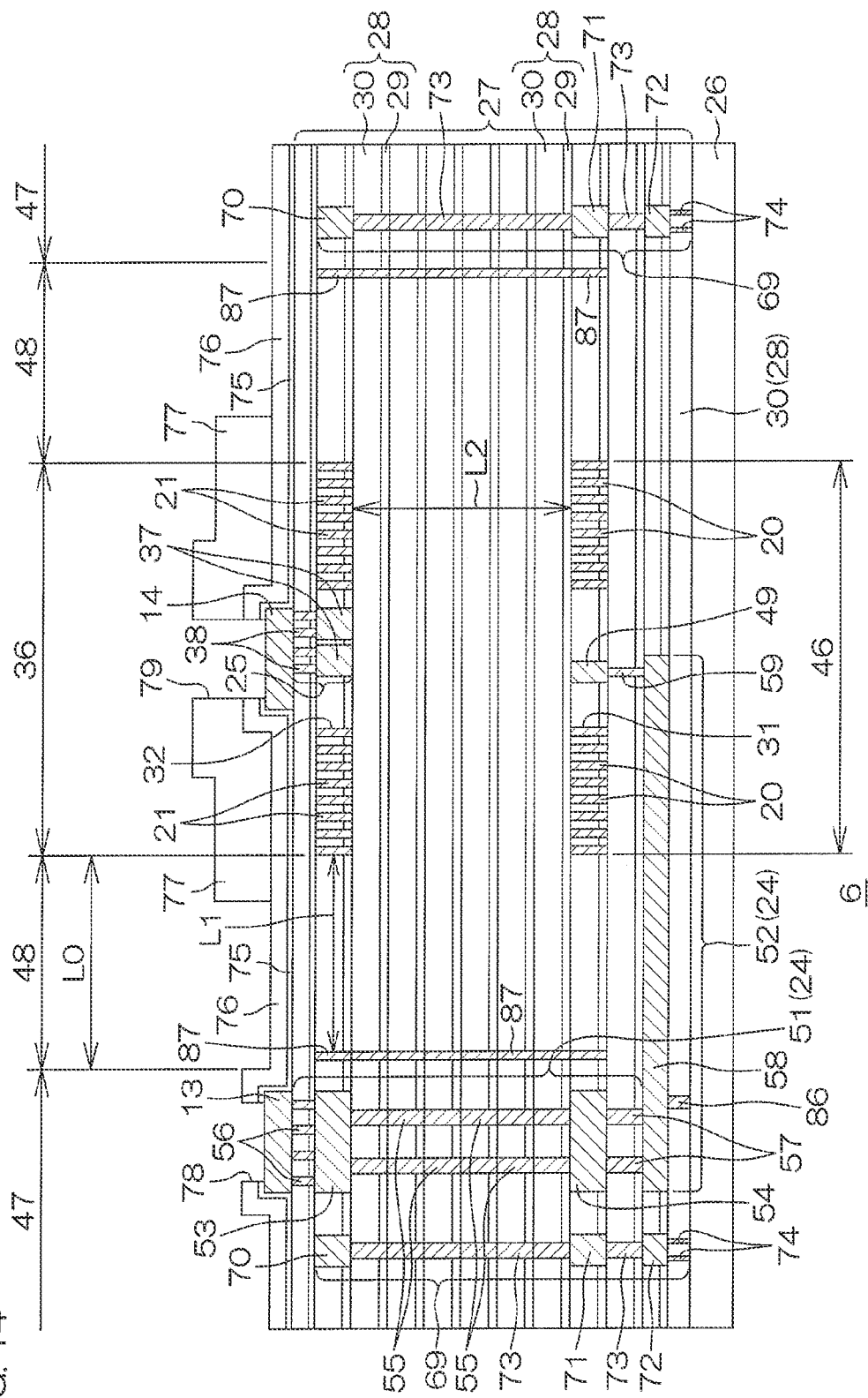
FIG. 14 is a view for explaining the structure of an electrode plate as an example of an electric field shield portion which replaces the capacitor.
Figure 15:
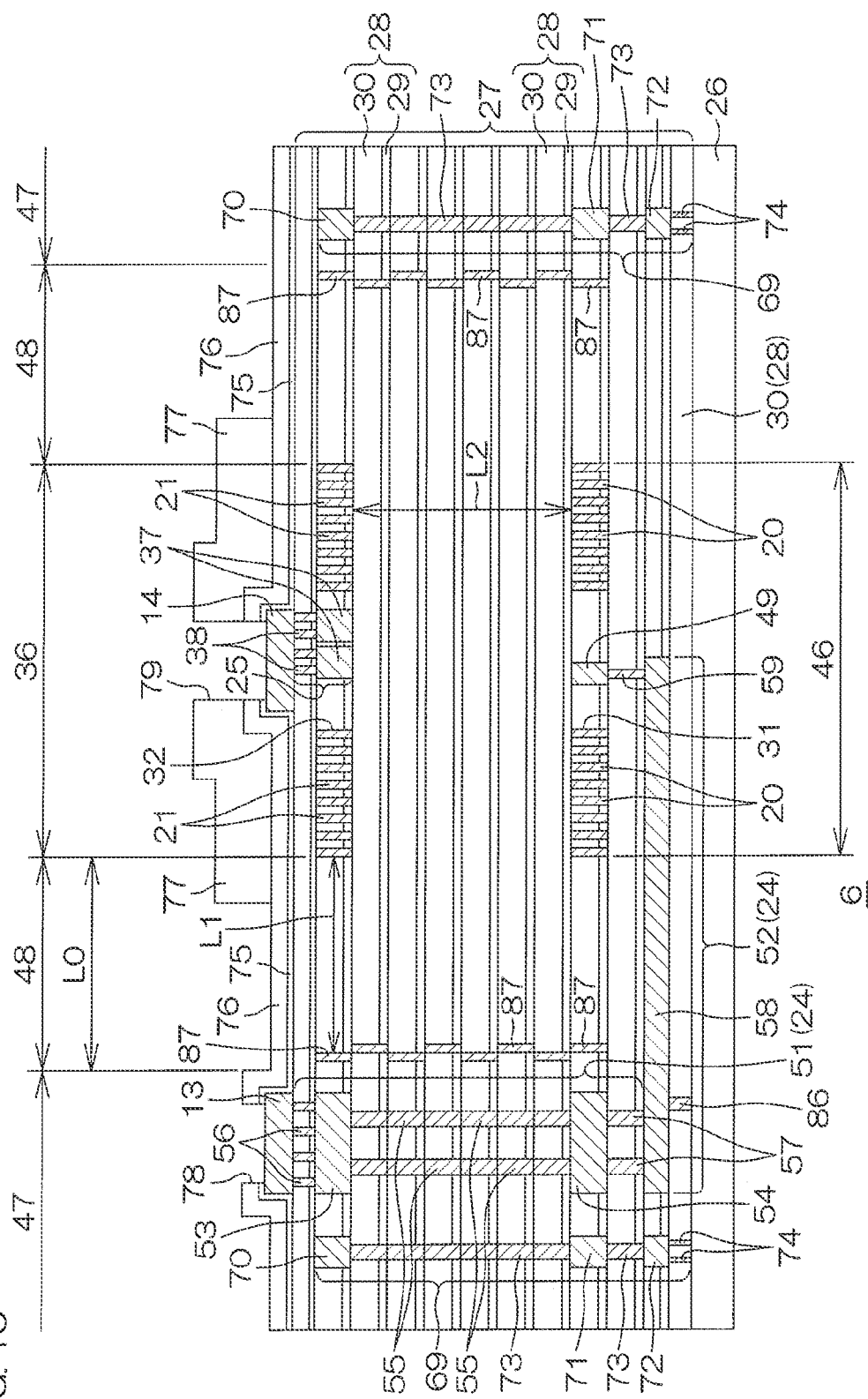
FIG. 15 illustrates a variation regarding the pattern of the electrode plate.
Figure 16:
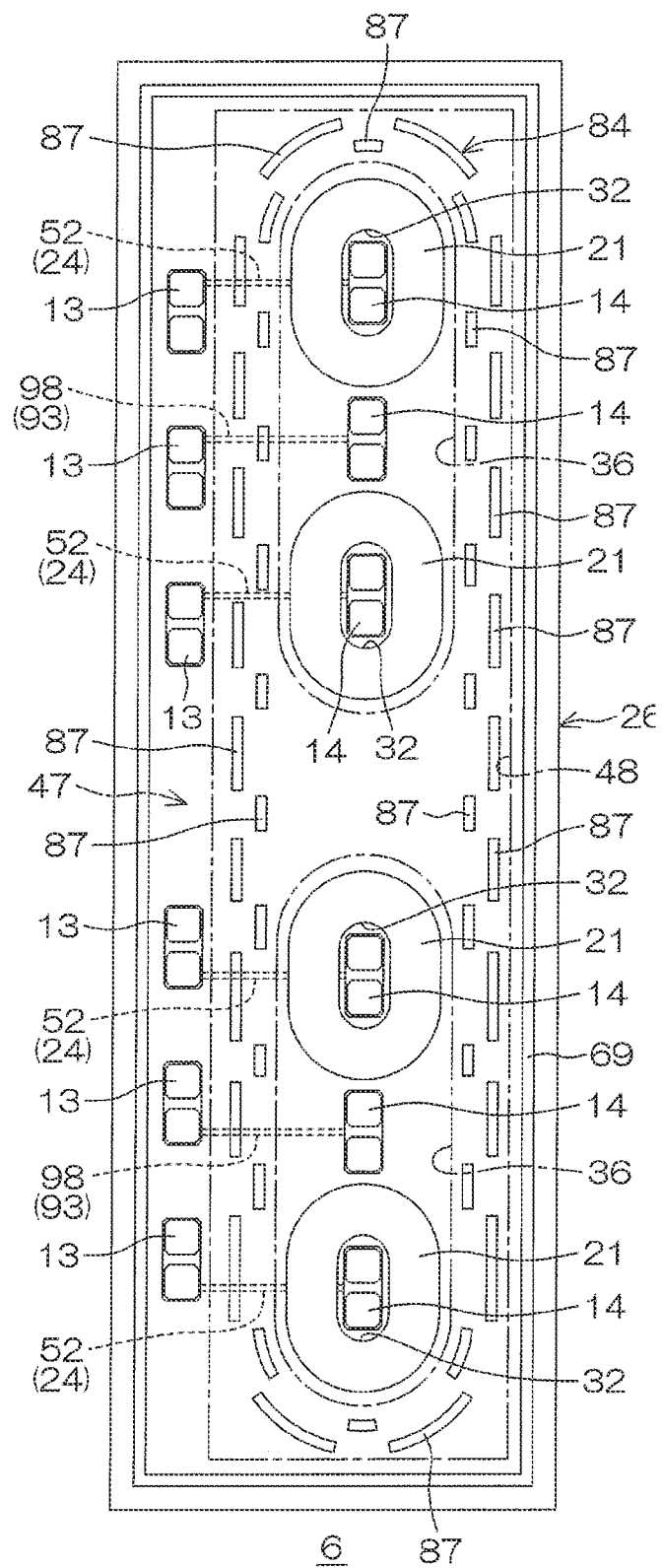
FIG. 16 illustrates a variation regarding the pattern of the electrode plate.

FIGS. 14 to 16 illustrate a variation having a structure which replaces the capacitor 80. Specifically, illustrated is a case where electrode plates 87 are provided independently so as not to overlap in a horizontal direction in the same insulating layer 28 and no capacitor structure is provided in each insulating layer 28.

In the structure of FIG. 14, electrode plates 87 embedded in the respective insulating layers 28 are arranged continuously in the vertical direction. Meanwhile, in the structure of FIG. 15, the electrode plates 87 embedded in the respective insulating layers 28 are arranged intermittently along the lamination direction of the insulating layer laminated structure 27.

It is to be noted that the variation described in this section is to illustrate only the fact that no capacitor structure is formed. Accordingly, a plurality of electrode plates 87 may be provided in the same insulating layer 28 as long as the electrode plates 87 do not overlap in horizontal directions. For example, as illustrated in FIG. 16, a plurality of electrode plates 87 which form a broken line ellipse 84 surrounding a high voltage region 36 may be arranged, and electrode plates 87 may be arranged in an inner region of the broken line ellipse 84 so as to face a region of a gap of the plurality of electrode plates 87 which constitute the broken line ellipse 84.

(3) Variation Regarding Connection State of Semiconductor Substrate 26

Figure 17:
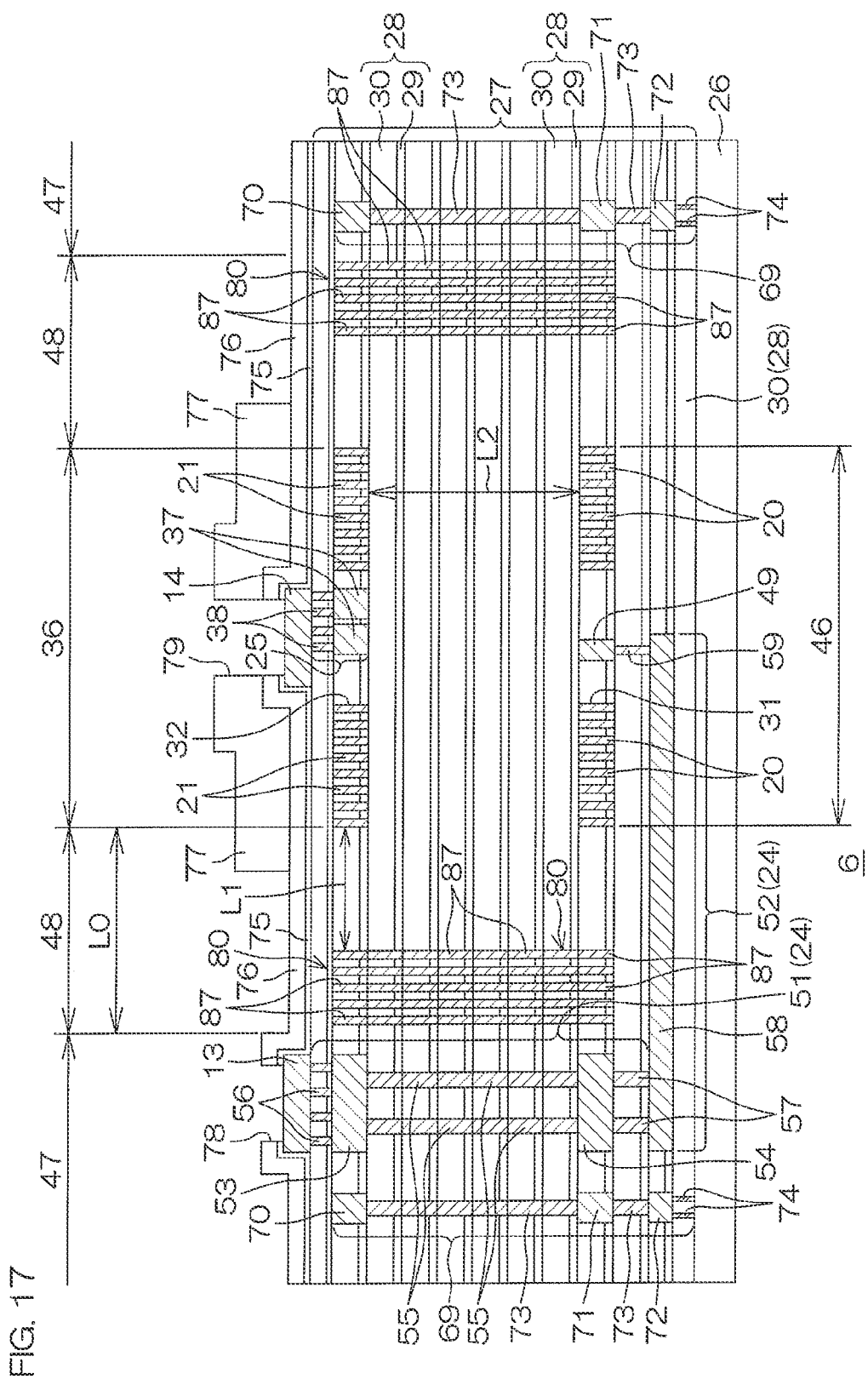
FIG. 17 illustrates a variation regarding the connection state of a substrate of the transformer chip.
Figure 18:
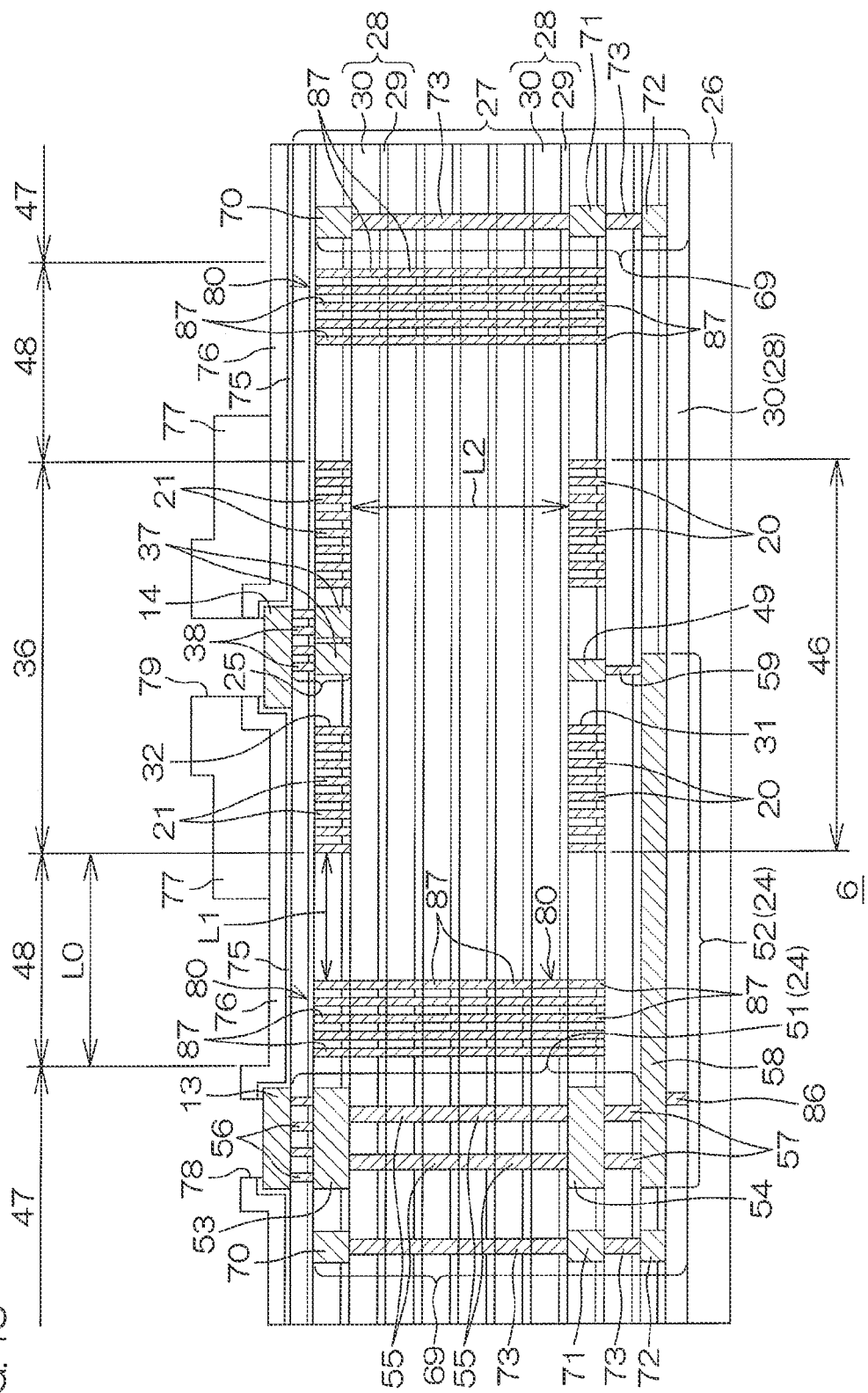
FIG. 18 illustrates a variation regarding the connection state of the substrate of the transformer chip.
Figure 19:
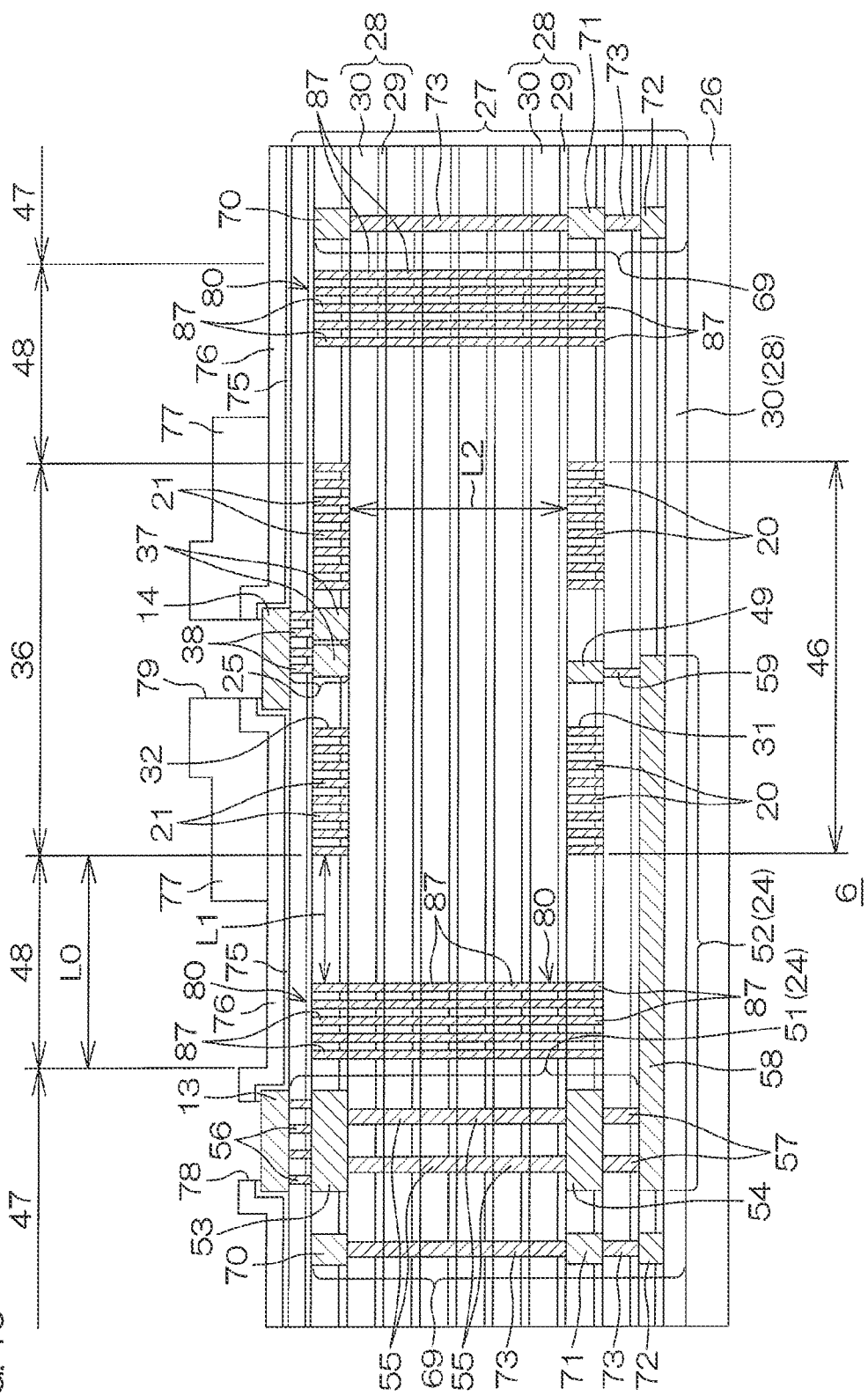
FIG. 19 illustrates a variation regarding the connection state of the substrate of the transformer chip.
Figure 20:
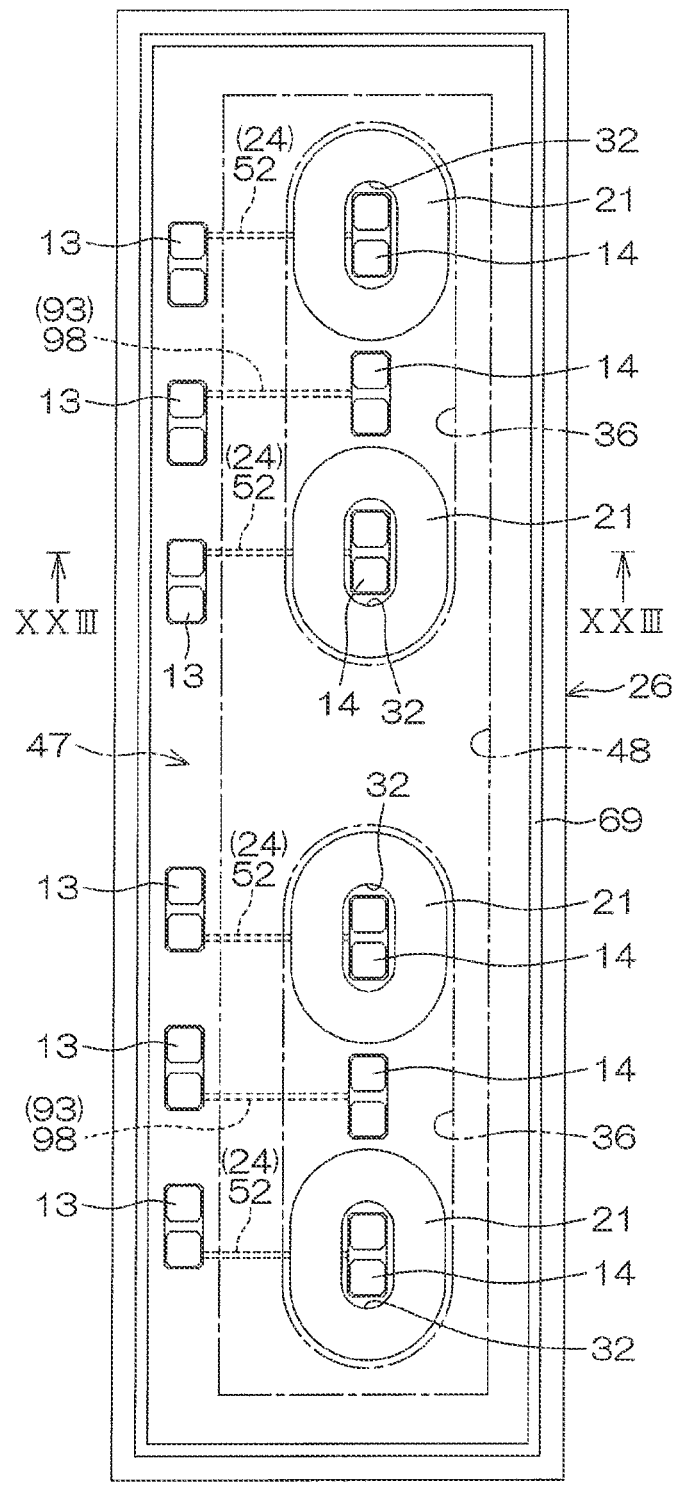
FIG. 20 is a schematic plan view of a transformer chip according to Reference Example 1.
Figure 21:
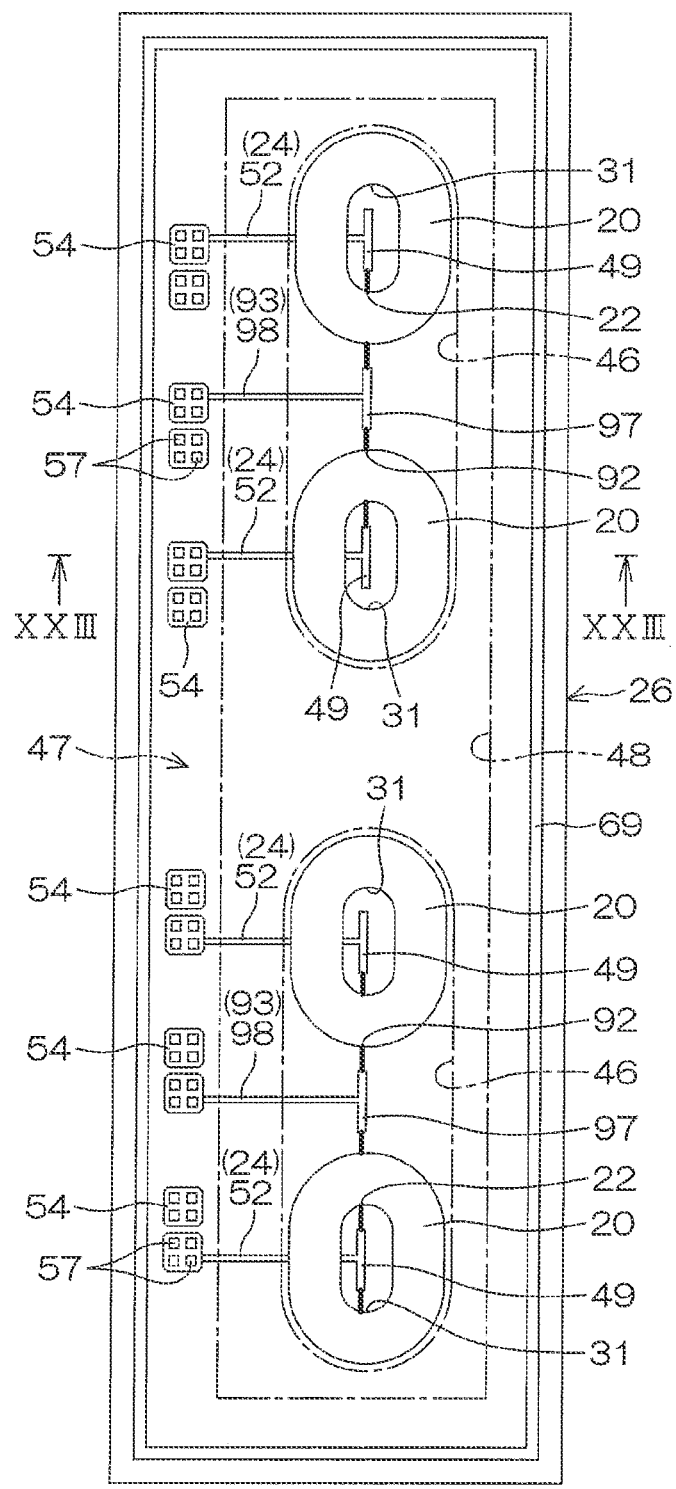
FIG. 21 is a schematic plan view of a layer where a lower coil according to Reference Example 1 is disposed.
Figure 22:
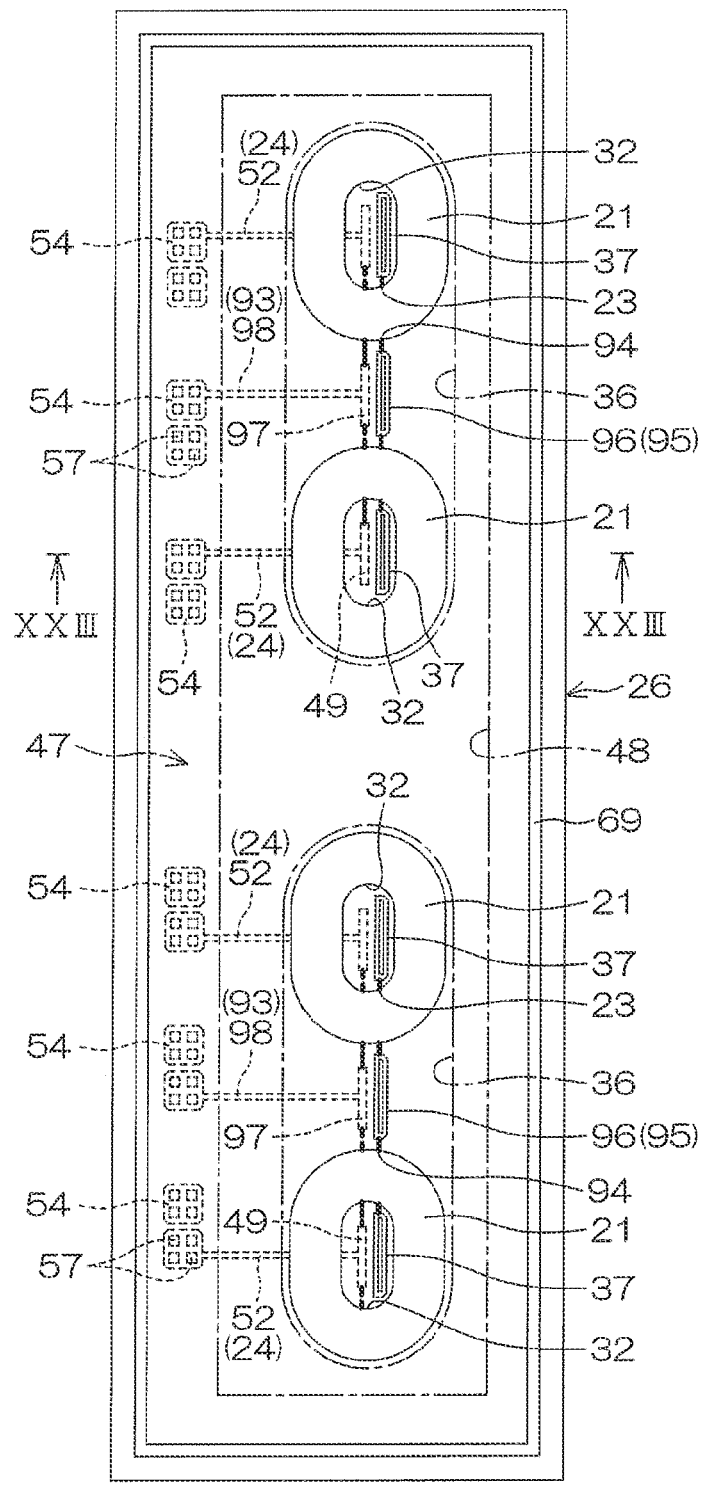
FIG. 22 is a schematic plan view of a layer where an upper coil according to Reference Example 1 is disposed.
Figure 23:
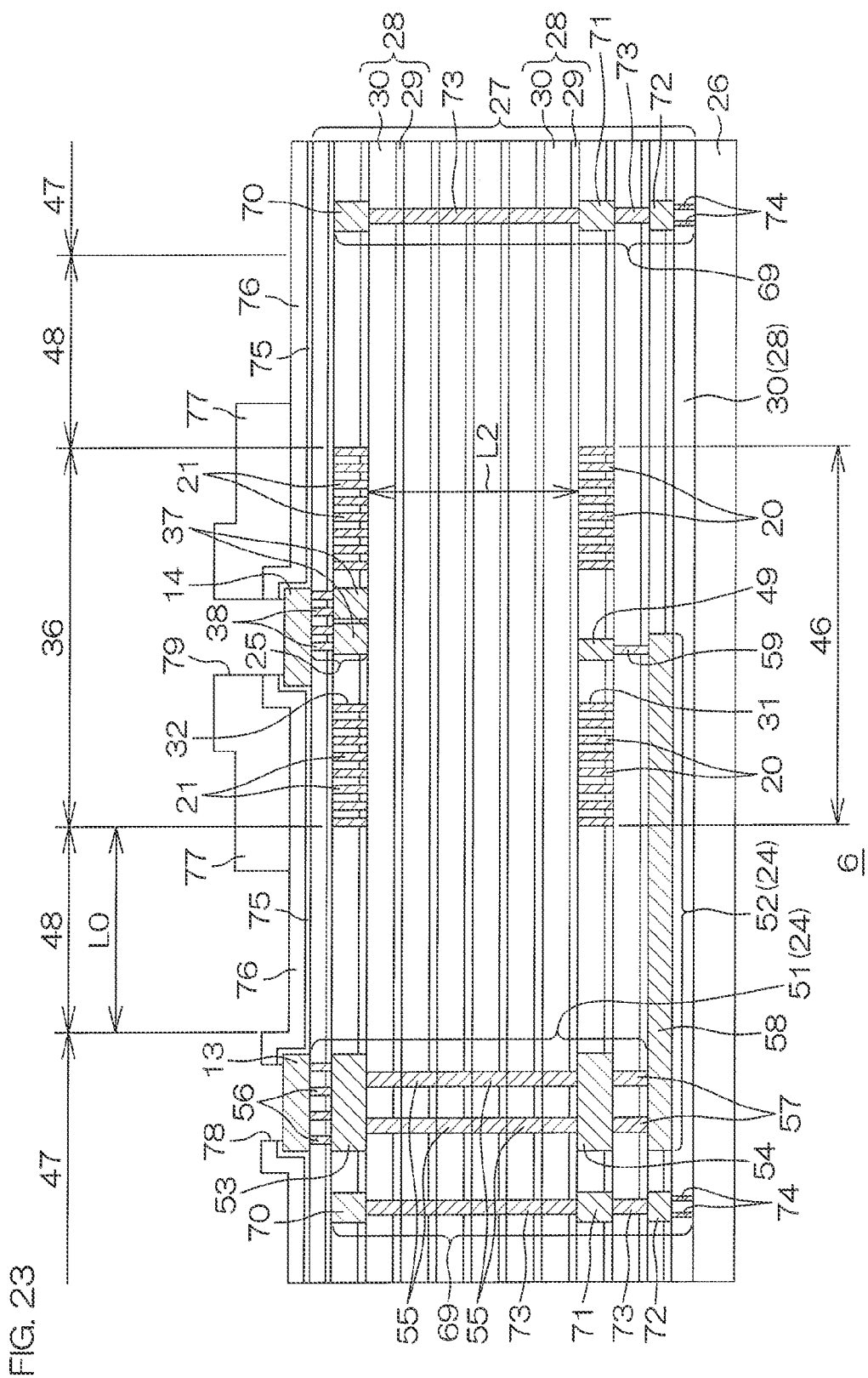
FIG. 23 is a sectional view obtained by cutting the transformer chip by cutting-plane line XXIII-XXIII in FIG. 20.
Figure 24:
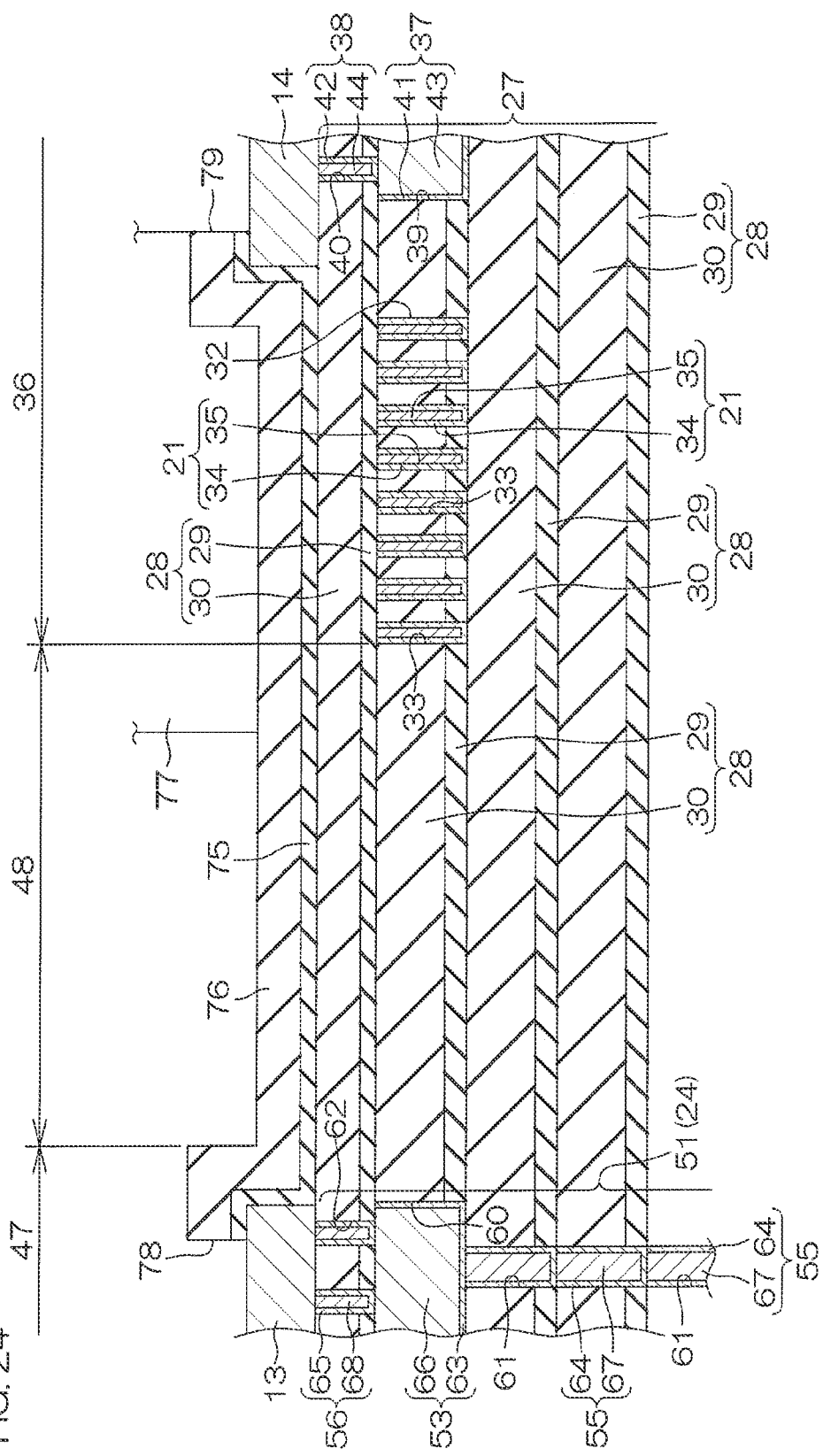
FIG. 24 is an enlarged view of an upper coil and a surrounding area in FIG. 23.

FIGS. 17 to 19 illustrate a variation regarding the connection state of a semiconductor substrate 26.

In the structure of FIG. 17, the via 86 in FIG. 6 is omitted, and low voltage wiring 24 is not fixed to substrate voltage.

In the structure of FIG. 18, the via 74 in FIG. 6 is omitted, and a shield layer 69 is not fixed to substrate voltage.

In the structure of FIG. 19, both of the via 86 and the via 74 in FIG. 6 are omitted, and low voltage wiring 24 and a shield layer 69 are not fixed to substrate voltage.

Various design changes can be made to the present invention within the scope of matters referred to in the clams, though embodiments of the present invention have been described above.

For example, a lower coil 20 may function as a high voltage coil and an upper coil 21 may function as a low voltage coil, though the above embodiment illustrates a case where the upper coil 21 functions as a high voltage coil and the lower coil 20 functions as a low voltage coil.

Moreover, an electric conductor (low potential portion) which is electrically connected with potential lower than a high voltage coil (upper coil 21) may be provided in an insulating layer 28 different from an insulating layer 28 where the upper coil 21 is embedded, though the above embodiment illustrates only a case where the electric conductor is necessarily formed in the same insulating layer 28 as the insulating layer 28 where the upper coil 21 is embedded like the low voltage wiring 24 or the shield layer 69. For example, the present invention can also provide sufficient effect of decreasing surge breakdown in horizontal directions for an electric conductor which is formed in several layers above or below the insulating layer 28 where the upper coil 21 is embedded.

Other various design changes can be made within the scope of matters referred in the claims.

<Reference Example of Above Embodiment>

A problem (see FIG. 8) that breakdown occurs in a horizontal direction when a large potential difference (e.g., several thousands of volts) is generated between the high voltage region 36 and the outer low voltage region 47 can be solved by structures illustrated in the following Reference Example 1 and Reference Example 2.

(1) Reference Example 1

As illustrated in FIGS. 20 to 24, Reference Example 1 is different from the above embodiment in that a capacitor 80 is not provided in an intermediate region 48.

In addition, regarding the problem described with reference to FIG. 8, the present inventors have found that the cause of leakage current which causes breakdown in a horizontal direction is related to the constituent material of an insulating film in contact with an upper coil 21.

Thereupon, in Reference Example 1, a compressive stress film having compressive stress as internal stress is employed as an etching stopper film 29 selectively in an insulating layer 28 where the upper coil 21 is embedded and an insulating layer 28 right above the insulating layer 28, though most insulating layers 28 are formed by overlapping an etching stopper film 29, which is constituted of a tensile stress SiN film (Tensile-SiN), with an interlayer insulating film 30, which is constituted of an SiO$_2$ film having compressive stress as internal stress. Such a compressive stress film preferably has compressive stress of 400 MPa to 800 MPa as internal stress, for example. Specifically, an SiO$_x$ (0<x<2) film having an Si ratio higher than SiO$_2$ is preferable, or an SiN film (Compressive-SiN) having compressive stress may be employed. An SiO$_x$ film can be prepared in the same manufacturing method as an SiO$_2$ film except that an Si composition ratio is changed by adjusting the flow rate of source gas. Meanwhile, a compressive stress SiN film can be prepared by adjusting conditions such as the SiH$_4$ flow rate or N$_2$ flow rate in a manufacturing process of a tensile stress SiN film.

Thus, it is possible to suppress flow of leakage current from the upper coil 21 to low voltage wiring 24 or a shield layer 69 along the surface direction (horizontal direction) of the insulating layer 28. As a result, it is possible to prevent dielectric breakdown due to a potential difference, even when a large potential difference is generated between the upper coil 21 and the low voltage wiring 24 and shield layer 69.

Also, regarding a plurality insulating layers 28 excluding the insulating layer 28 where a compressive stress film is employed as an etching stopper film 29, an interlayer insulating film 30 which is constituted of SiO$_2$ having compressive stress and an etching stopper film 29 which is constituted of a tensile stress SiN film can be arranged alternately, and therefore it is possible to laminate insulating layers 28 while cancelling stress at lamination interfaces of the insulating layer laminated structure 27. As a result, it is possible to prevent generation of large curvature deformation at a semiconductor wafer, which functions as the parent body of a semiconductor substrate 26 arranged to support the insulating layer laminated structure 27, in a manufacturing process of a transformer chip 6.

It is to be noted that an SiC film, an SiCN film etc., may be used as etching stopper films 29 of insulating layers 28 excluding an insulating layer 28 where the upper coil 21 is embedded.

Various design changes can be made in Reference Example 1 described above.

It is to be noted that the following features can be extracted from the content of Reference Example 1 in addition to the invention referred to in the claims.

[Aspect 1]

A semiconductor device including:

an insulating layer laminated structure composed of a plurality of insulating layers which are laminated successively, a high voltage coil and a low voltage coil which are formed in different insulating layers in the insulating layer laminated structure and face each other with one or more insulating layers sandwiched therebetween, and an electric conductor which is formed in an outer region at a lateral side of a high voltage region where the high voltage coil is disposed and is electrically connected with potential lower than the high voltage coil, wherein an insulating layer in contact with the high voltage coil includes a compressive stress film having compressive stress as internal stress in a part in contact with the high voltage coil.

With such a structure, a part of an insulating layer, which is in contact with the high voltage coil, is formed of a compressive stress film, and therefore it is possible to suppress flow of leakage current from the high voltage coil to the electric conductor along the surface direction (horizontal direction) of the insulating layer. Thus, it is possible to prevent dielectric breakdown due to a potential difference even when a large potential difference is generated between the high voltage coil and the electric conductor.

[Aspect 2]

The semiconductor device according to Aspect 1, wherein the high voltage coil includes an embedded coil which is embedded in a coil groove that penetrates one insulating layer from the top face to the bottom face thereof, and an insulating layer in contact with the high voltage coil includes an insulating layer where the high voltage coil is embedded and insulating layers which are arranged thereabove and therebelow and are respectively in contact with the top face and the bottom face of the high voltage coil.

[Aspect 3]

The semiconductor device according to Aspect 1 or 2, wherein the compressive stress film includes an SiO$_x$ (0<x<2) film which has an Si ratio higher than Sift.

With such a structure, the compressive stress film is an SiO$_x$ (0<x<2) film, and therefore a satisfactory effect of decreasing leakage current can be realized.

[Aspect 4]

The semiconductor device according to Aspect 1 or 2, wherein the compressive stress film includes a compressive stress SiN film.

[Aspect 5]

The semiconductor device according to any one of Aspects 1 to 4, wherein the compressive stress film has compressive stress of 400 MPa to 800 MPa as internal stress.

[Aspect 6]

The semiconductor device according to any one of Aspects 1 to 5, wherein each insulating layer includes a laminated structure of a thin film and an interlayer insulating film, which is made of SiO$_2$ and is formed on the thin film, the thin film of the insulating layer in contact with the high voltage coil is selectively formed of the compressive stress film, and the thin films of the insulating layers excluding the insulating layer in contact with the high voltage coil are formed of a tensile stress film having tensile stress as internal stress.

With such a structure, it is required only to selectively change a thin film of an insulating layer in contact with the high voltage coil into a compressive stress film. Thus, regarding a plurality of insulating layers excluding said insulating layer, an interlayer insulating film made of SiO$_2$ having compressive stress and a thin film constituted of a tensile stress film can be arranged alternately, and therefore it is possible to laminate insulating layers while cancelling stress at lamination interfaces. As a result, it is possible to prevent generation of large curvature deformation at a semiconductor substrate in a case where an insulating layer laminated structure is formed on a semiconductor substrate (wafer).

[Aspect 7]

The semiconductor device according to any one of Aspects 1 to 6, wherein the electric conductor includes a conductor layer which is formed in the same insulating layer as the high voltage coil.

[Aspect 8]

The semiconductor device according to any one of Aspects 1 to 7, further including, a high voltage pad which is formed on the surface of the insulating layer laminated structure in the high voltage region, and a low voltage pad which is formed on the surface of the insulating layer laminated structure in the outer region, wherein the high voltage coil is an upper coil which is disposed at a side relatively near to the surface of the insulating layer laminated structure and the low voltage coil is a lower coil which is disposed below the upper coil, and the electric conductor includes low voltage wiring which penetrates the plurality of insulating layers downward in the thickness direction from the low voltage pad and is electrically connected with the lower coil.

With such a structure, since the above voltage resistant structure (dielectric breakdown preventing structure) is formed, it is possible to form the low voltage wiring for contact with the lower coil so that the low voltage wiring penetrates the insulating layer laminated structure. Thus, it is possible to form both of the high voltage pad and the low voltage pad on the surface of the insulating layer laminated structure and easily achieve wire bonding to the pads.

[Aspect 9]

The semiconductor device according to Aspect 8, wherein the low voltage wiring further includes lead-out wiring which is led out from an inner coil end of the lower coil via the insulating layer, which is disposed at a lower position than that of the lower coil, to the outer region.

[Aspect 10]

The semiconductor device according to Aspect 8 or 9, wherein the high voltage pad is disposed above a central portion of the upper coil, and high voltage wiring which penetrates the insulating layer upward in the thickness direction from an inner coil end of the upper coil and is connected with the high voltage pad is further provided.

[Aspect 11]

The semiconductor device according to any one of Aspects 8 to 10, wherein the electric conductor includes a shield layer, which is formed at a side further outside than the low voltage wiring so as to surround the high voltage region and penetrate the plurality of insulating layers downward in the thickness direction.

[Aspect 12]

The semiconductor device according to any one of Aspects 1 to 11, wherein a distance $L0$ between the high voltage coil and the electric conductor is larger than a thickness $L2$ of the insulating layers between the high voltage coil and the low voltage coil.

[Aspect 13]

The semiconductor device according to Aspect 12, wherein the ratio of the distance $L0$ to the thickness $L2$ (distance $L0$/thickness $L2$) is 6/1 to 40/1.

[Aspect 14]

The semiconductor device according to Aspect 12 or 13, wherein the thickness $L2$ is 12.0 μm to 16.8 μm, and the distance $L0$ is 100 μm to 450 μm.

[Aspect 15]

A semiconductor module including a semiconductor device according to any one of Aspects 1 to 14, a low voltage element which is electrically connected with the low voltage coil of the semiconductor device, a high voltage element which is electrically connected with the high voltage coil of the semiconductor device, and a resin package arranged to collectively seal the semiconductor device, the low voltage element and the high voltage element.

With such a structure provided with a semiconductor device according to any one of Aspects 1 to 14, it is possible to realize a highly reliable transformer module in which dielectric breakdown hardly occurs.

(2) Reference Example 2

Regarding the problem described with reference to FIG. 8, the present inventors have found that the cause of leakage current which causes breakdown in a horizontal direction is related to (1) formation of a heterogeneous interface due to contact of different insulating materials at a lateral side of the upper coil 21, and (2) existence of a processed interface damaged by film production such as CVD in a manufacturing process of the insulating layer laminated structure 27.

Figure 25:
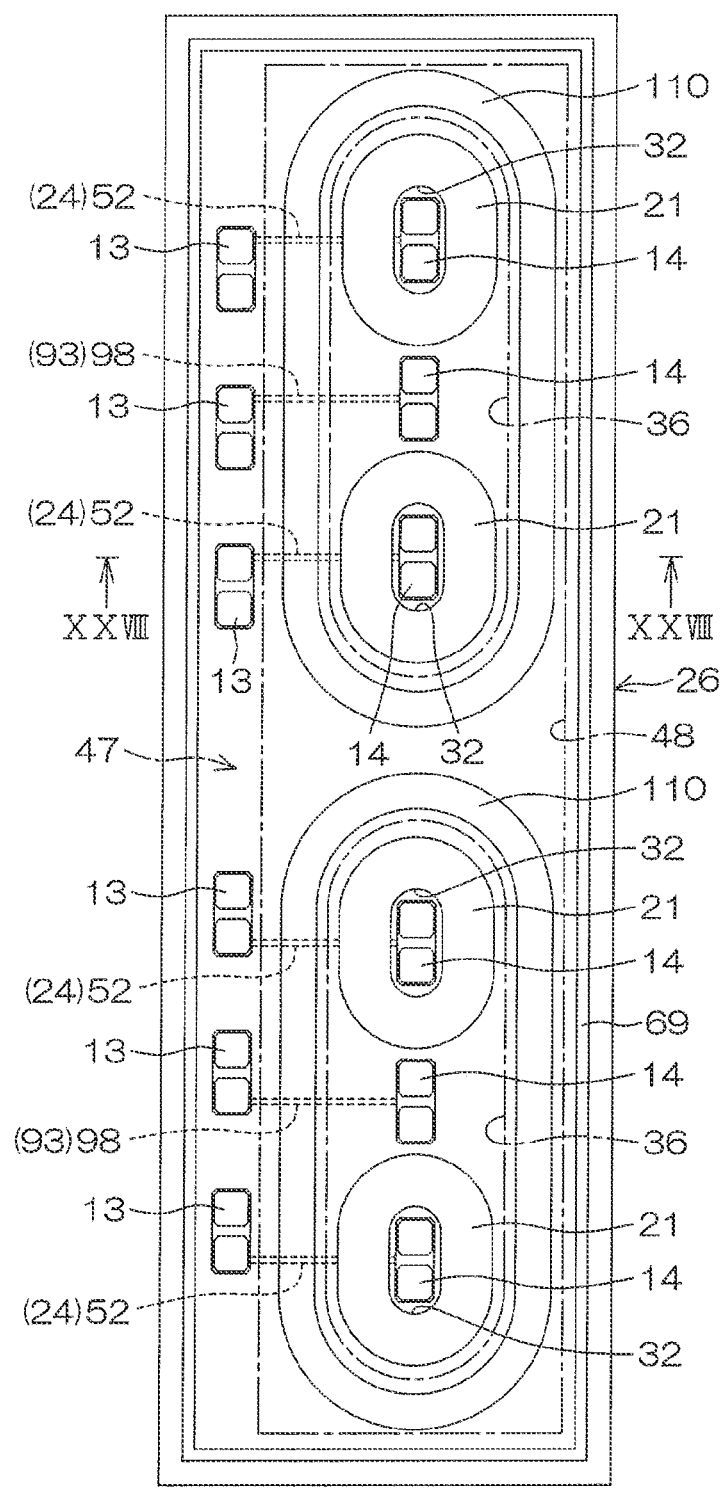
FIG. 25 is a schematic plan view of a transformer chip according to Reference Example 2.
Figure 26:
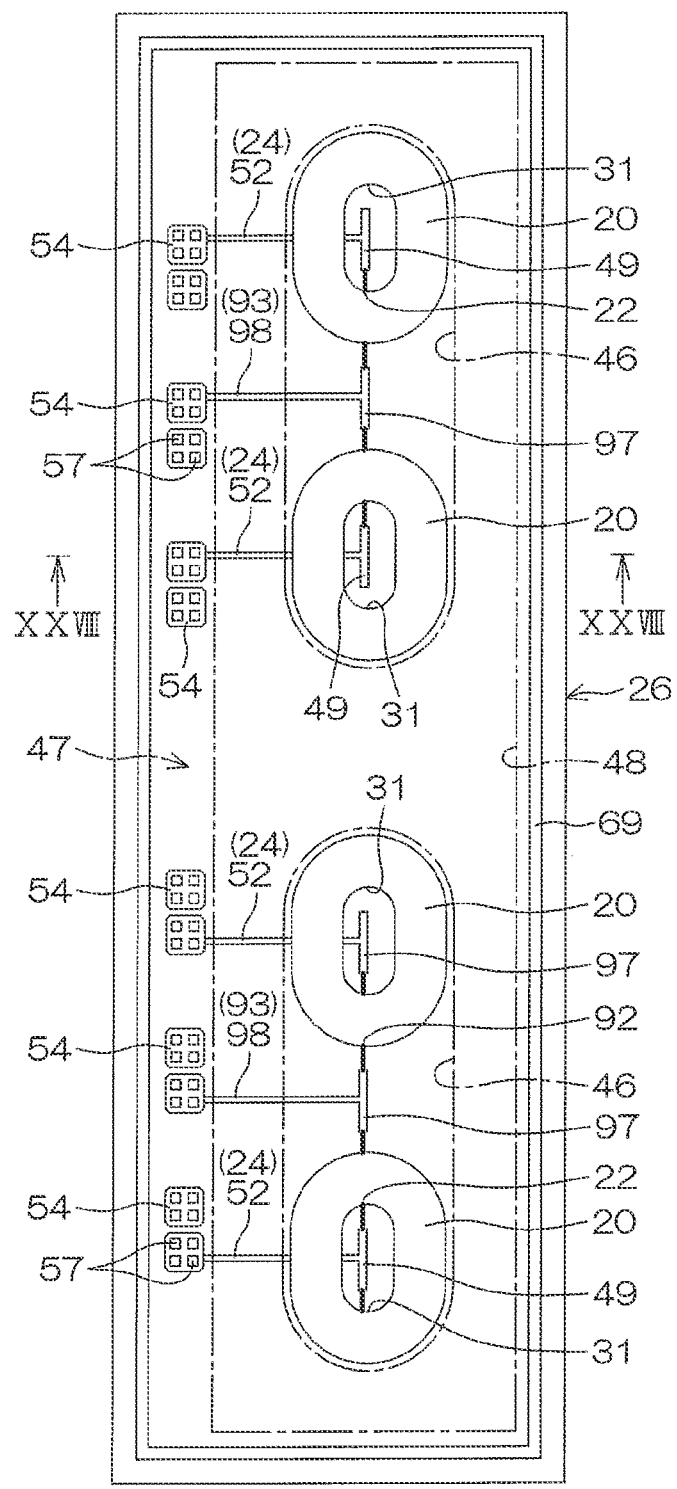
FIG. 26 is a schematic plan view of a layer where a lower coil according to Reference Example 2 is disposed.
Figure 27:
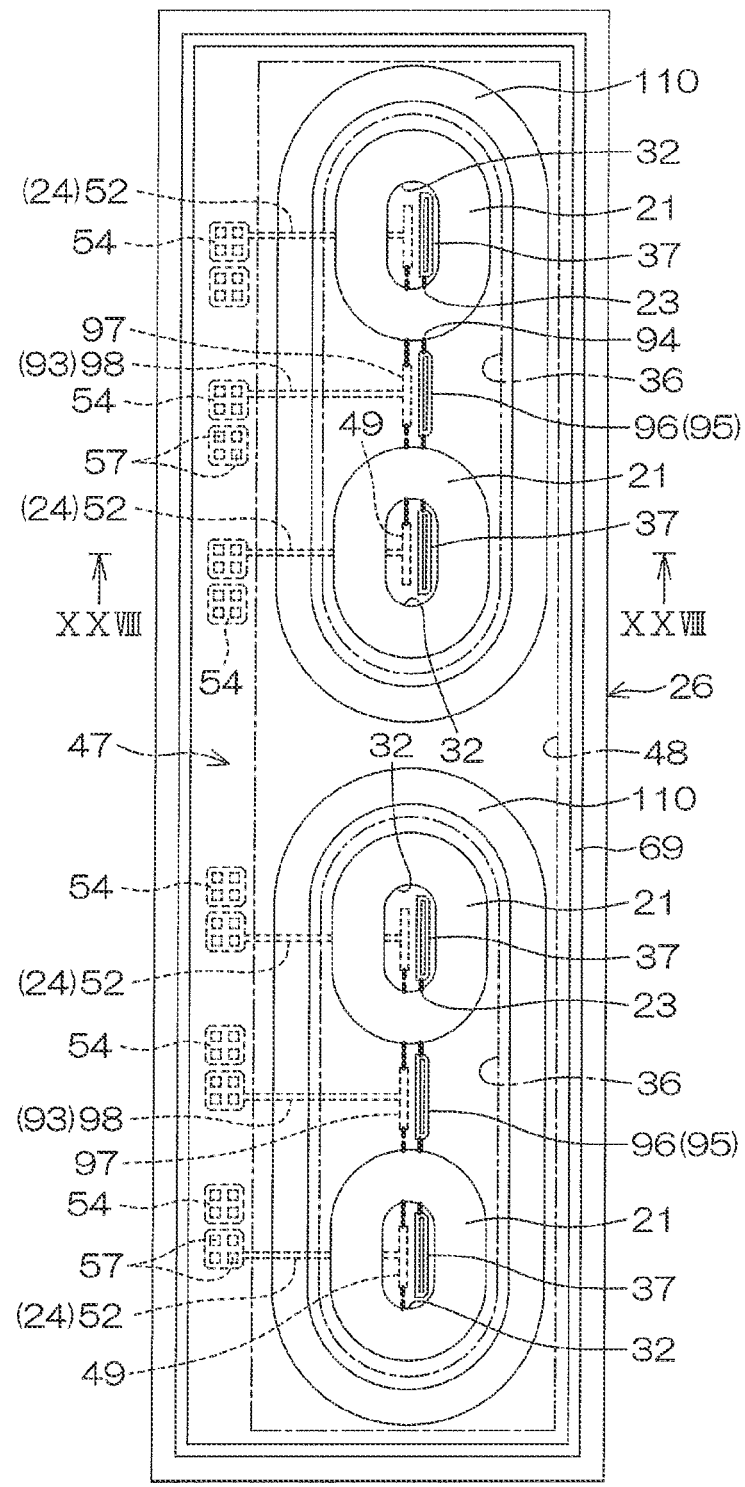
FIG. 27 is a schematic plan view of a layer where an upper coil according to Reference Example 2 is disposed.
Figure 28:
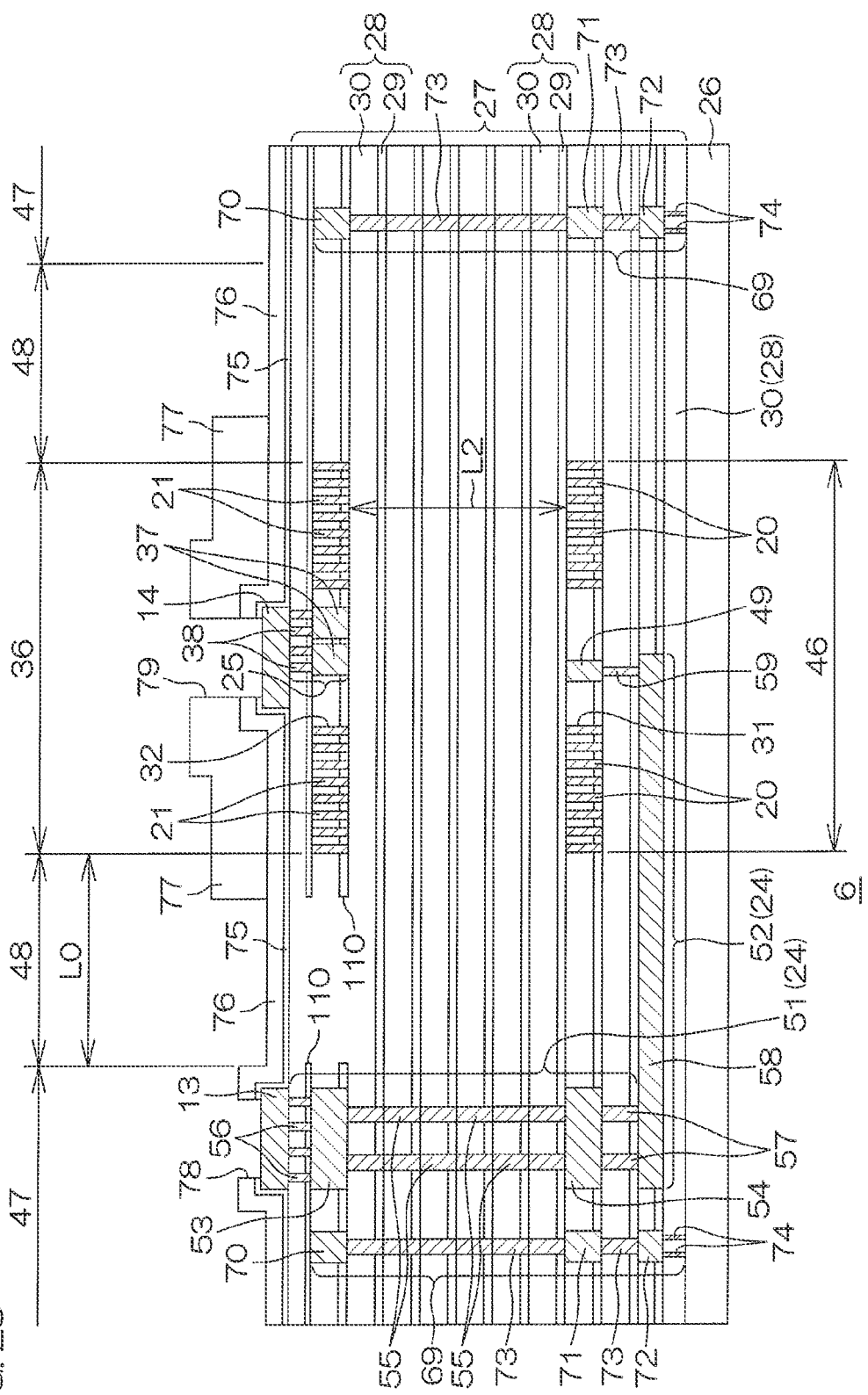
FIG. 28 is a sectional view obtained by cutting the transformer chip by cutting-plane line XXVIII-XXVIII in FIG. 25.

Thereupon, in Reference Example 2, a removal region 110 from which an etching stopper film 29 is selectively removed is formed in an intermediate region 48 of an insulating layer 28 where the upper coil 21 is embedded and an insulating layer 28 right above said insulating layer 28 as illustrated in FIGS. 25, 27, 28 and 29. The removal region 110 is formed in one band shape (e.g., width of 50 μm to 100 μm) surrounding each high voltage region 36 as illustrated in FIGS. 25 and 27. In particular, as illustrated in FIGS. 25 and 27, an electric field hardly concentrates in a case of a rounded shape as a whole having no corner portion (substantially ellipse annular shape in Reference Example 2).

By formation of the removal region 110, an interlayer insulating film 30 ($SiO_2$) disposed at an upper side of the lamination interface 111 comes into contact with an interlayer insulating film 30 ($SiO_2$) at a low side in the intermediate region 48, and a homogeneous interface structure 112 is formed at a lamination interface 111, which is in contact with the upper coil 21, among lamination interfaces of the insulating layer laminated structure 27.

Thus, even when leakage current flows along the surface direction (horizontal direction) of the insulating layer 28 from the upper coil 21 to low voltage wiring 24 or a shield layer 69, it is possible to decrease leakage current by the homogeneous interface structure 112. That is, it is possible to decrease leakage current by eliminating a heterogeneous interface due to contact of different insulating materials (contact between $SiO_2$ and SiN in Reference Example 2) in at least the intermediate region 48. As a result, it is possible to prevent dielectric breakdown due to a potential difference even when a large potential difference is generated between the upper coil 21 and the low voltage wiring 24 and shield layer 69.

Also, in Reference Example 2, a trench 113 having the same pattern as a removal region 110 is further formed in an interlayer insulating film 30 disposed at a lower side of the lamination interface 111 to the middle of the interlayer insulating film 30 in the thickness direction, and the interlayer insulating film 30 at an upper side is embedded in said trench 113 via the removal region 110. Thus, it is possible to extend the distance of the lamination interface 111 from the upper coil 21 to the outer low voltage region 47 by the depth d of the trench 113. As a result, it is possible to lengthen the path of leakage current, and therefore it is possible to decrease leakage current satisfactorily even when a processed interface exists in the lamination interface 111.

FIGS. 30A to 30H are sectional views for explaining processes involved in formation of a homogeneous interface structure 112.

Figure 29:
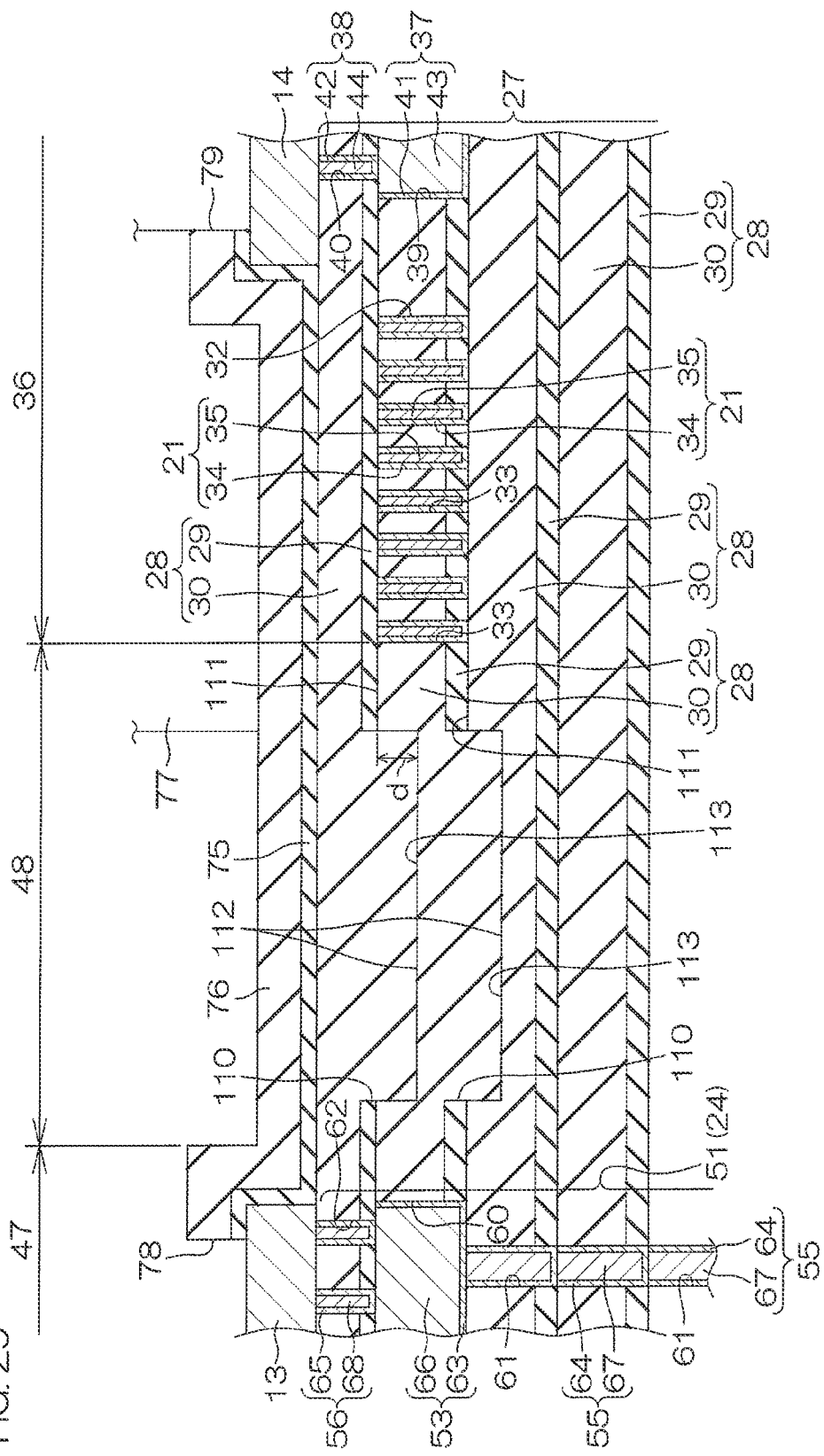
FIG. 29 is an enlarged view of an upper coil and a surrounding area in FIG. 28.

For forming a homogeneous interface structure 112 of an embedded type as illustrated in FIG. 29, a via 55 is formed in an insulating layer 28 disposed below an insulating layer 28 where the upper coil 21 is embedded as illustrated in FIG. 30A, for example.

Next, as illustrated in FIG. 30B, an etching stopper film 29 made of SiN and a USG film 114 are formed successively by a plasma activated CVD method, for example.

Next, as illustrated in FIG. 30C, a photoresist (unillustrated) is formed on the USG film 114, and the USG film 114, the etching stopper film 29 and the interlayer insulating layer 30 are etched successively. Thus, the removal region 110 and the trench 113 are formed simultaneously.

Figure 30D:
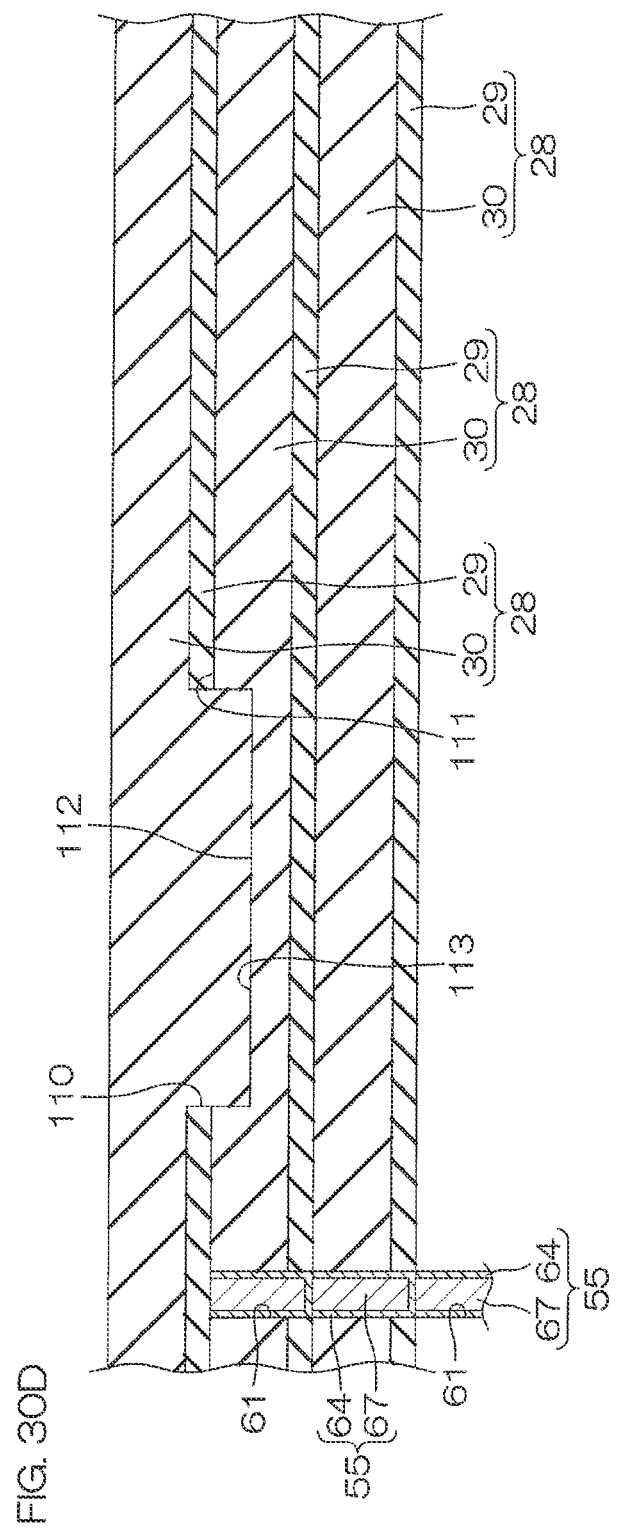

Next, as illustrated in FIG. 30D, the trench 113 is backfilled with SiO$_2$ by high density plasma activated CVD (HDP), and then SiO$_2$ is further deposited by plasma activated CVD. Then, the surface of SiO$_2$ is planarized by CMP. Thus, an insulating layer 28 having a homogeneous interface structure 112 is formed at the trench 113.

Figure 30E:
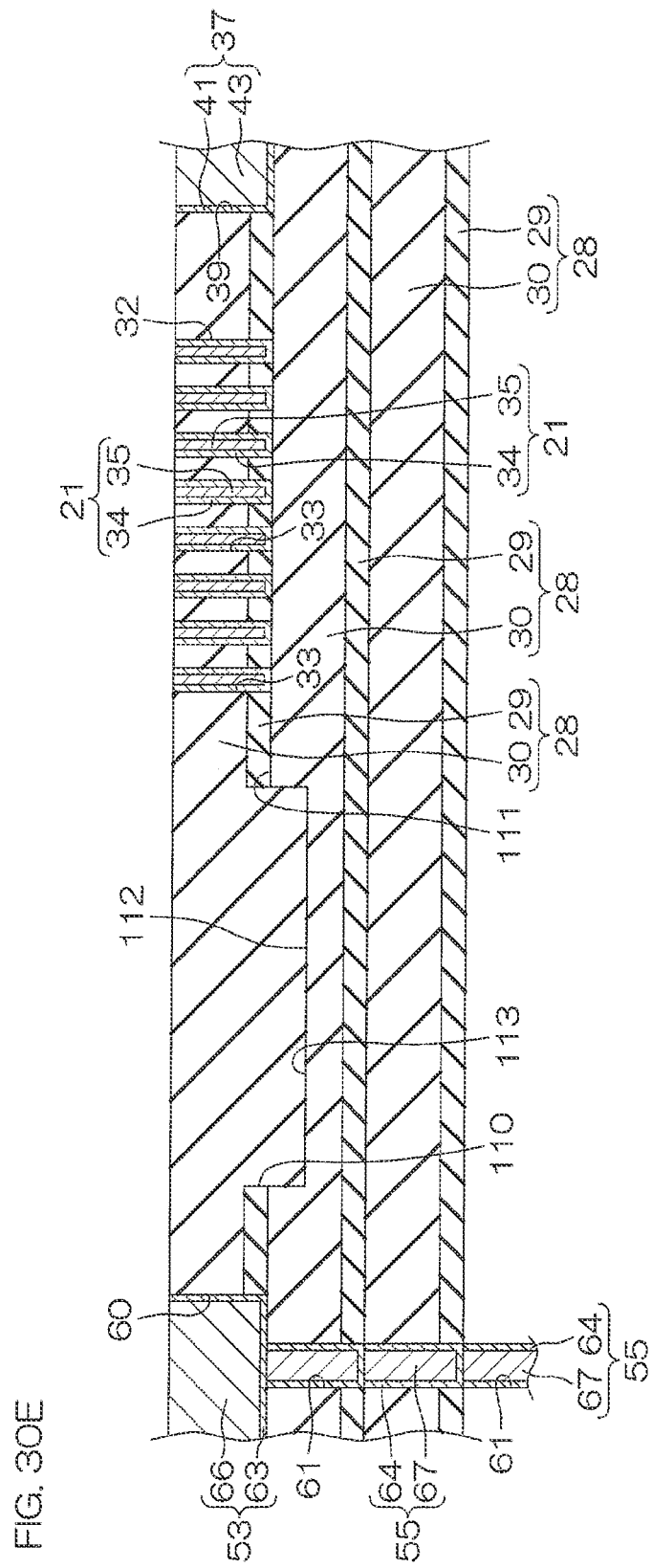

Next, as illustrated in FIG. 30E, an upper coil 21, low voltage layer wiring 53 and inner coil end wiring 37 are formed on an insulating layer 28 which has the homogeneous interface structure 112 between said insulating layer 28 and a lower insulating layer 28.

Figure 30F:
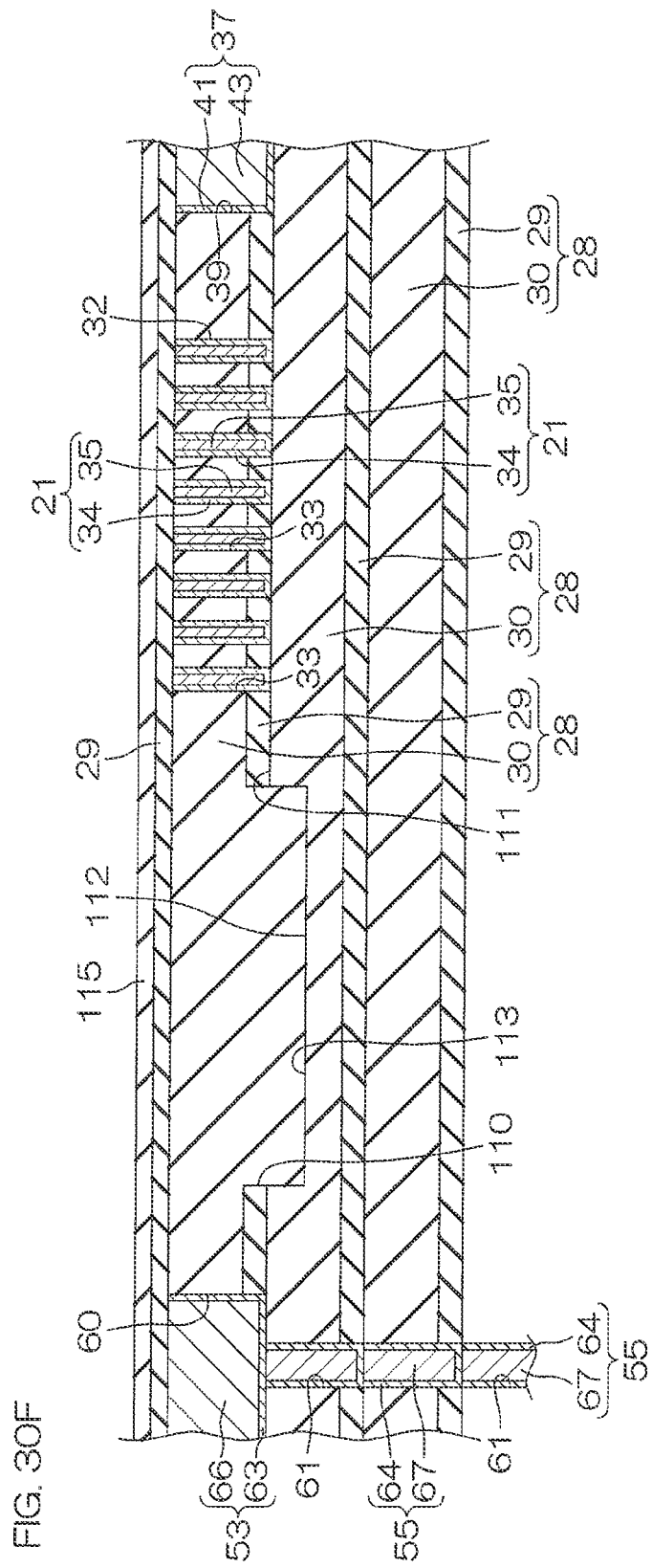

Next, as illustrated in FIG. 30F, an etching stopper film 29 and a USG film 115 are formed successively by a plasma activated CVD method, for example.

Figure 30G:
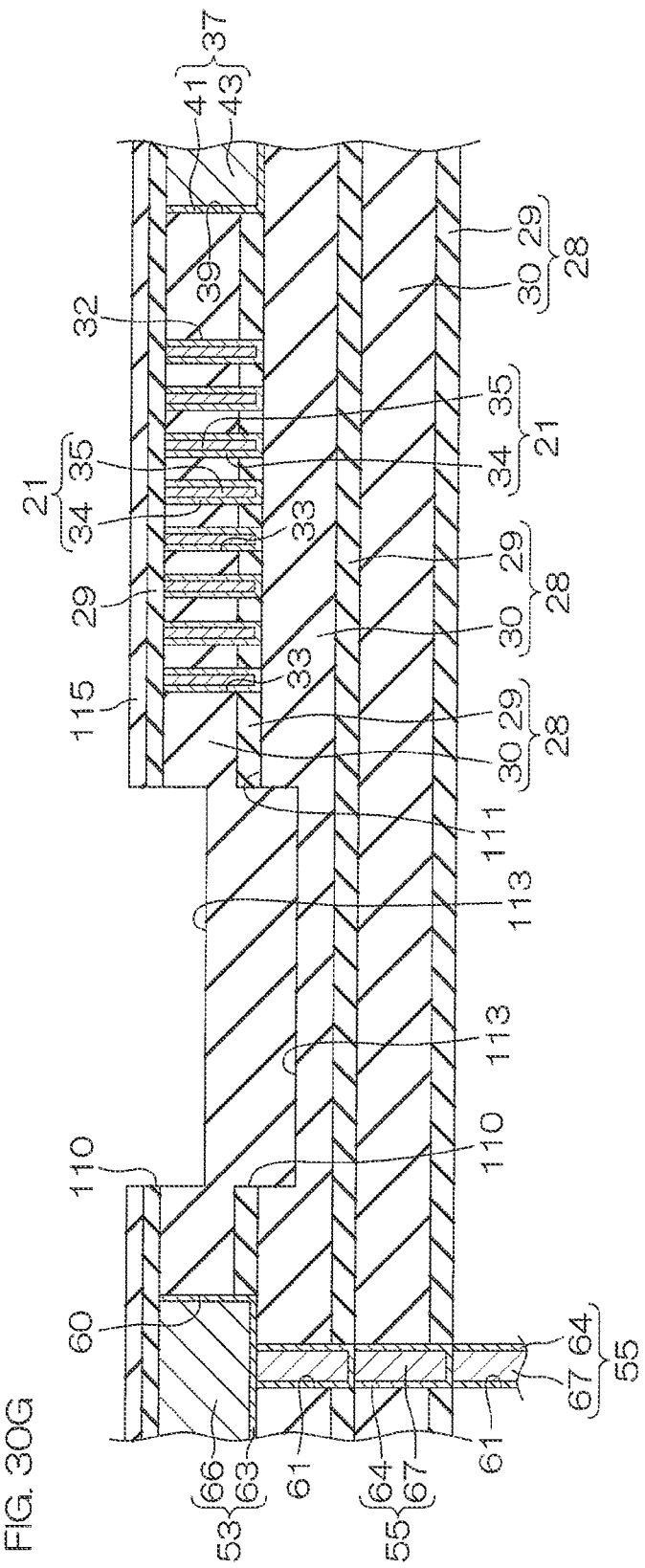

Next, as illustrated in FIG. 30G, a photoresist (unillustrated) is formed on the USG film 115, and the USG film 115, the etching stopper film 29 and the interlayer insulating film 30 are etched successively. Thus, the removal region 110 and the trench 113 are formed simultaneously.

Figure 30H:
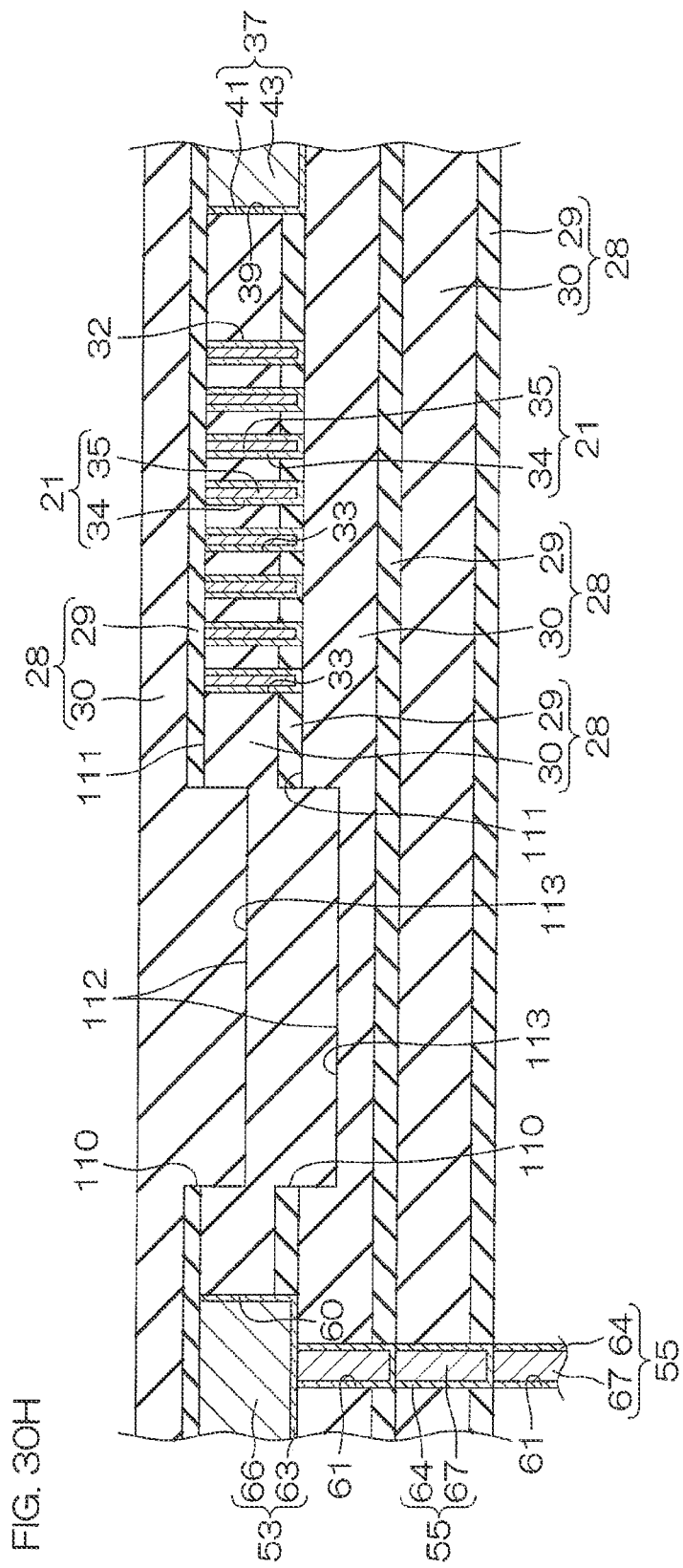

Next, as illustrated in FIG. 30H, the trench 113 is backfield with SiO$_2$ by high density plasma activated CVD (HDP), and then SiO$_2$ is further deposited by plasma activated CVD. Then, the surface of SiO$_2$ is planarized by CMP. Thus, an insulating layer 28 having a homogeneous interface structure 112 is formed at the trench 113.

Various design changes can be made in Reference Example 2 described above.

Figure 31:
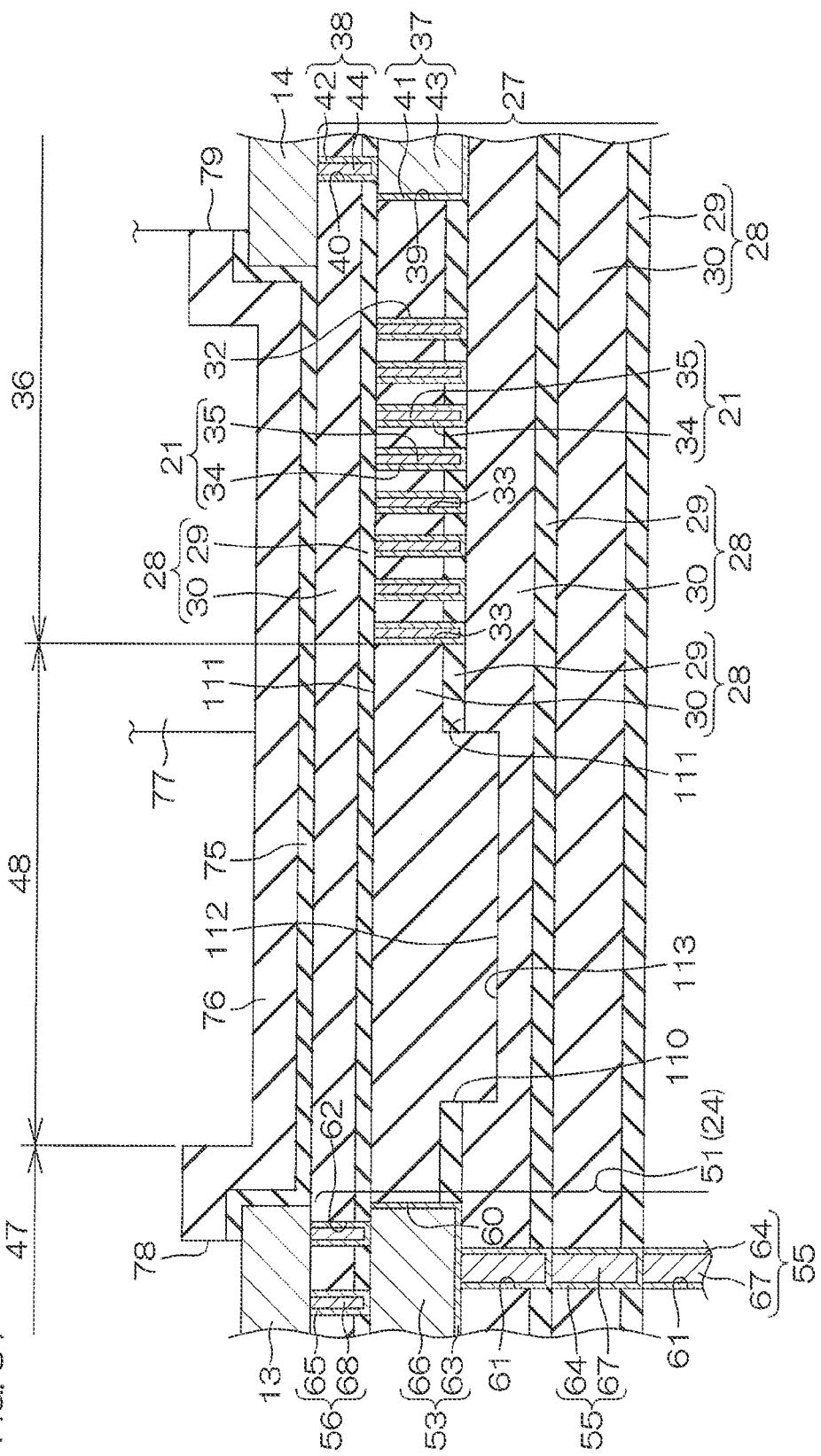
FIGS. 31 to 34 are views illustrating variations of a homogeneous interface structure.
Figure 32:
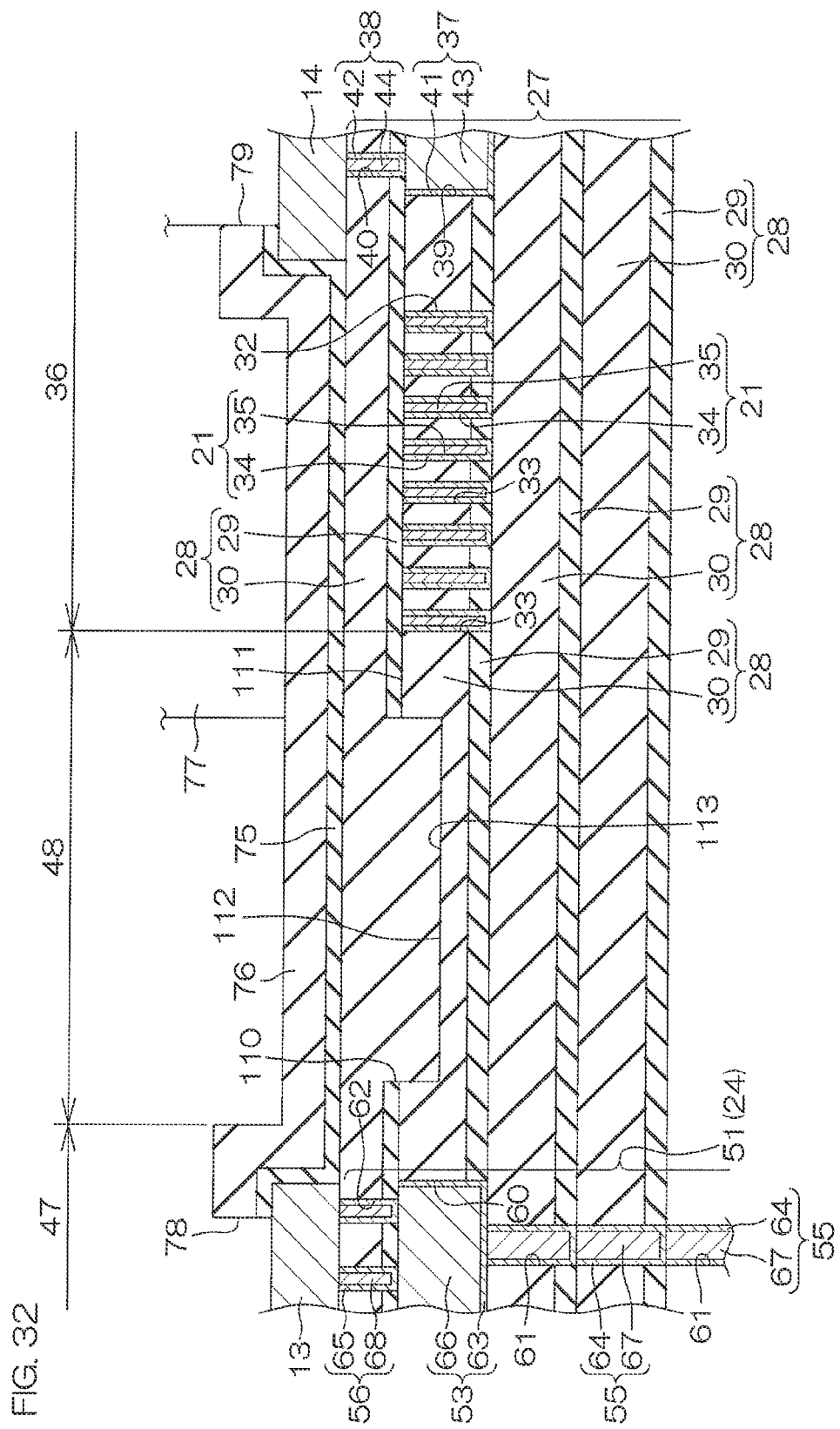

For example, the homogeneous interface structure 112 may be selectively formed only at a lamination interface 111 at the lower side in contact with the bottom face of the upper coil 21 as illustrated in FIG. 31, or may be selectively formed only at a lamination interface 111 at the upper side in contact with the top face of the upper coil 21 as illustrated in FIG. 32.

Figure 33:
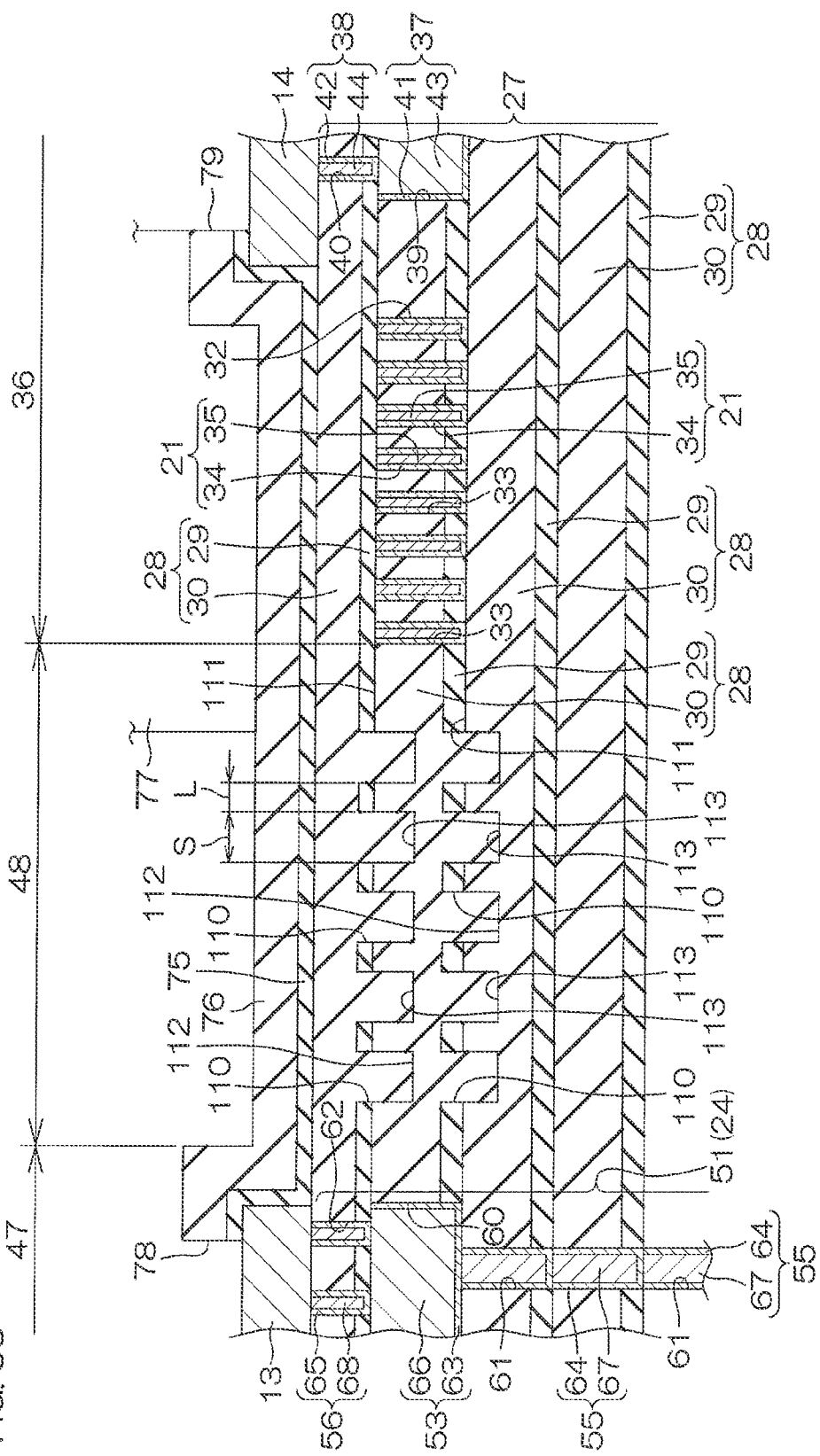

Moreover, as illustrated in FIG. 33, the removal region 110 may be formed in a stripe shape at intervals from each other. The trench 113 is preferably formed also in a stripe structure to match such a removal region 110 in a stripe shape. In such a case, the line-and-space (L/S) of the removal region 110 having a stripe shape is preferably 1 μm/1 μm to 10 μm/10 μm. The removal region 110 in a stripe shape can be formed by using a photoresist pattern for etching in a stripe shape in the above process illustrated in FIGS. 30C and 30G.

Figure 34:
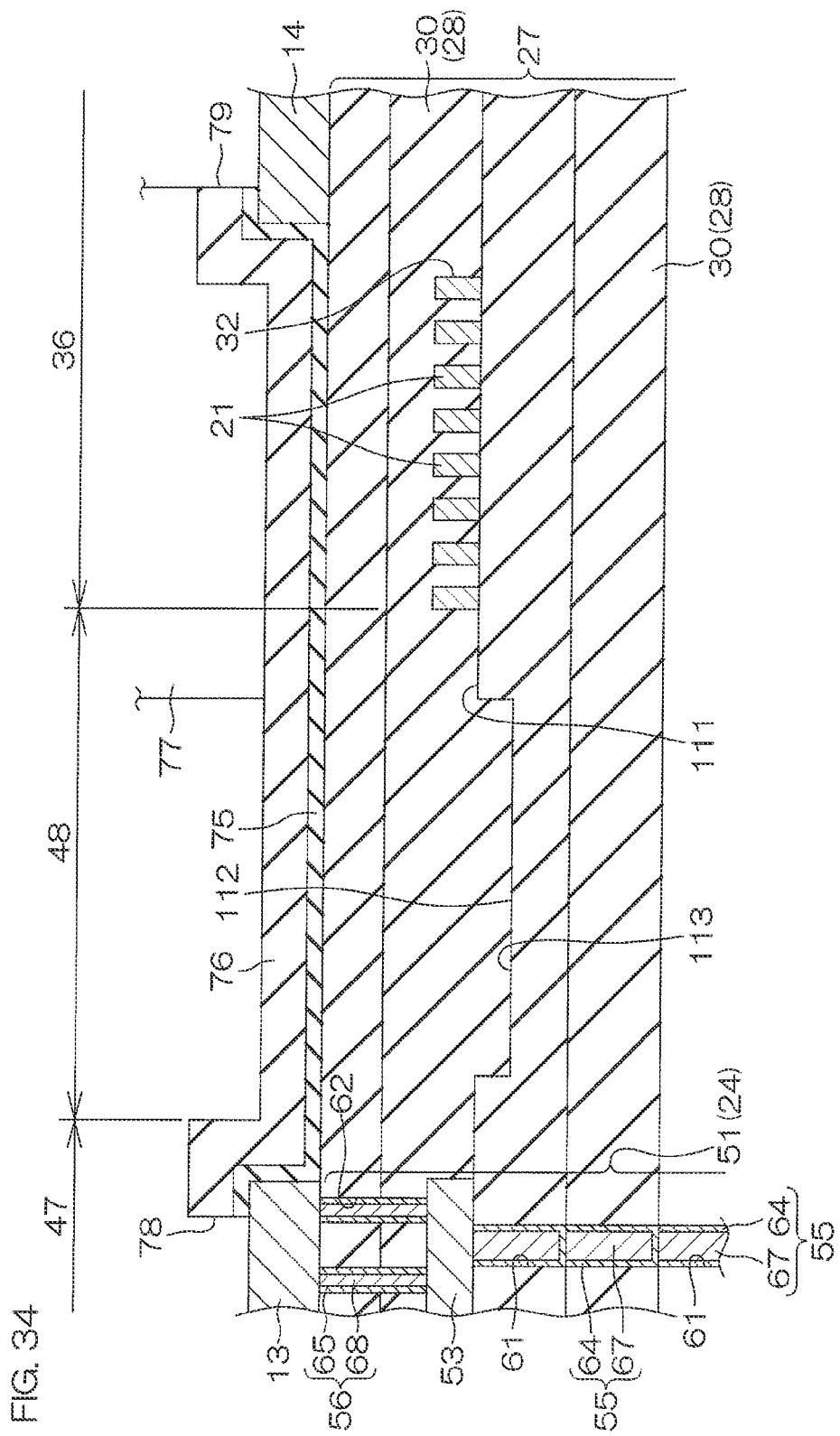

Moreover, as illustrated in FIG. 34, an etching stopper 29 can be omitted and an insulating layer 28 can be formed only from an interlayer insulating film 30 made of Sift in a case where the upper coil 21 is not an embedded coil of Cu wiring material 35 but is formed by patterning of an Al (aluminum) film. In such a structure, a homogeneous interface structure 112 is formed at all lamination interfaces of the insulating layer laminated structure 27, and therefore the effect of decreasing leakage current can be obtained more effectively by forming the above trench 113 and lengthening the path of leakage current.

It is to be noted that the following features can be extracted from the content of Reference Example 2 in addition to the invention referred to in the claims.

[Aspect 1]

A semiconductor device including an insulating layer laminated structure composed of a plurality of insulating layers which are laminated successively, a high voltage coil and a low voltage coil which are formed in different insulating layers in the insulating layer laminated structure and face each other with one or more insulating layers sandwiched therebetween, and an electric conductor which is formed in an outer region at a lateral side of a high voltage region where the high voltage coil is disposed and is electrically connected with potential lower than the high voltage coil, wherein a lamination interface in contact with the high voltage coil among a plurality of lamination interfaces of the insulating layer laminated structure is provided with a homogeneous interface structure which is formed at an intermediate region between the high voltage region and the outer region by contact of the same insulating material of the insulating layers via said lamination interface.

With such a structure, a homogeneous interface structure is formed at least at an intermediate region, and therefore said homogeneous interface structure can decrease leakage current even when leakage current flows from the high voltage coil toward the electric conductor. That is, it is possible to decrease leakage current by eliminating a heterogeneous interface by contact of different insulating materials at least at the intermediate region. Thus, it is possible to prevent dielectric breakdown due to a potential difference even when a large potential difference is generated between the high voltage coil and the electric conductor.

[Aspect 2]

The semiconductor device according to Aspect 1, wherein the high voltage coil includes an embedded coil which is embedded in a coil groove that penetrates one insulating layer from the top face to the bottom face thereof, and a lamination interface in contact with the high voltage coil includes an interface which is formed of an insulating layer where the high voltage coil is embedded and insulating layers, which are disposed thereabove and therebelow and are respectively in contact with the top face and the bottom face of the high voltage coil.

[Aspect 3]

The semiconductor device according to Aspect 1 or 2, wherein a trench is formed in a relatively lower insulating layer in the homogeneous interface structure, and an upper insulating layer in contact with the top face of the lower insulating layer is embedded in the trench.

With such a structure, it is possible to extend the interface distance from the high voltage coil to the outer region by the depth of the trench. Thus, it is possible to lengthen the path of leakage current, and therefore it is possible to further decrease leakage current.

[Aspect 4]

The semiconductor device according to Aspect 1 or 2, wherein each insulating layer of the insulating layer laminated structure includes a laminated structure of a thin film made of first insulating material and an interlayer insulating film, which is formed on the thin film and is made of second insulating material, an insulating layer at an upper side of a lamination interface in contact with the high voltage coil has a removal region where the thin film has been selectively removed in the intermediate region, and an interlayer insulating film of the upper insulating layer is in contact with an interlayer insulating film of an insulating layer at a lower side of the lamination interface via the removal region and forms the homogeneous interface structure.

[Aspect 5]

The semiconductor device according to Aspect 4, wherein a trench having the same pattern as the removal region is formed in an interlayer insulating film in the lower insulating layer in the homogeneous interface structure, and the interlayer insulating film of the upper insulating layer is formed to be embedded in the trench via the removal region.

With such a structure, it is possible to extend the interface distance from the high voltage coil to the outer region by the depth of the trench. Thus, it is possible to lengthen the path of leakage current, and therefore it is possible to further decrease leakage current.

[Aspect 6]

The semiconductor device according to Aspect 4 or 5, wherein the removal region is formed in one strip shape.

[Aspect 7]

The semiconductor device according to Aspect 6, wherein the width of the strip-shaped removal region is 50 µm to 100 µm.

[Aspect 8]

The semiconductor device according to Aspect 4 or 5, wherein the removal region is formed in a stripe shape at intervals from each other.

In particular, in Aspect 8, it is preferable that a stripe trench having the same pattern as the stripe-shaped removal region is formed in the interlayer insulating film of the lower insulating layer in the homogeneous interface structure and the interlayer insulating film of the upper insulating layer is formed to be embedded in the stripe trench via the removal region. Thus, it is possible to further extend the interface distance from the high voltage coil to the outer region, and therefore it is possible to further decrease leakage current.

[Aspect 9]

The semiconductor device according to Aspect 8, wherein the line-and-space (L/S) of the stripe-shaped removal region is 1 µm/1 µm to 10 µm/10 µm.

[Aspect 10]

The semiconductor device according to any one of Aspects 4 to 9, wherein the thin film includes an SiN film and the interlayer insulating film includes an $SiO_2$ film.

[Aspect 11]

The semiconductor device according to any one of Aspects 1 to 10, wherein the electric conductor includes a conductor layer which is formed in the same insulating layer as the high voltage coil.

[Aspect 12]

The semiconductor device according to any one of Aspects 1 to 11, further including a high voltage pad which is formed on the surface of the insulating layer laminated structure in the high voltage region, and a low voltage pad which is formed on the surface of the insulating layer laminated structure in the outer region, wherein the high voltage coil is an upper coil which is disposed at a side relatively near to the surface of the insulating layer laminated structure and the low voltage coil is a lower coil which is disposed below the upper coil, and the electric conductor includes low voltage wiring which penetrates the plurality of insulating layers downward in the thickness direction from the low voltage pad and is electrically connected with the lower coil.

With such a structure, since the above voltage resistant structure (dielectric breakdown preventing structure) is formed, it is possible to form the low voltage wiring for contact with the lower coil so that the low voltage wiring penetrates the insulating layer laminated structure. Thus, it is possible to form both of the high voltage pad and the low voltage pad on the surface of the insulating layer laminated structure and easily achieve wire bonding to the pads.

[Aspect 13]

The semiconductor device according to Aspect 12, wherein the low voltage wiring further includes lead-out wiring which is led out from an inner coil end of the lower coil via the insulating layer, which is disposed at a lower position than the lower coil, to the outer region.

[Aspect 14]

The semiconductor device according to Aspect 12 or 13, wherein the high voltage pad is disposed above a central portion of the upper coil, and high voltage wiring which penetrates the insulating layer upward in the thickness direction from an inner coil end of the upper coil and is connected with the high voltage pad is further provided.

[Aspect 15]

The semiconductor device according to any one of Aspects 12 to 14, wherein the electric conductor includes a shield layer, which is formed at a side further outside than the low voltage wiring so as to surround the high voltage region and penetrate the plurality of insulating layers downward in the thickness direction.

[Aspect 16]

The semiconductor device according to any one of Aspects 1 to 15, wherein a distance L0 between the high voltage coil and the electric conductor is larger than a thickness L2 of the insulating layers between the high voltage coil and the low voltage coil.

[Aspect 17]

The semiconductor device according to Aspect 16, wherein the ratio of the distance L0 to the thickness L2 (distance L0/thickness L2) is 6/1 to 40/1.

[Aspect 18]

The semiconductor device according to Aspect 16 or 17, wherein the thickness L2 is 12.0 µm to 16.8 µm, and the distance L0 is 100 µm to 450 µm.

[Aspect 19]

A semiconductor module including a semiconductor device according to any one of Aspects 1 to 18, a low voltage element which is electrically connected with the low voltage coil of the semiconductor device, a high voltage element which is electrically connected with the high voltage coil of the semiconductor device, and a resin package arranged to collectively seal the semiconductor device, the low voltage element and the high voltage element.

With such a structure provided with a semiconductor device according to any one of Aspects 1 to 18, it is possible to realize a highly reliable transformer module in which dielectric breakdown hardly occurs.

As described above, the above embodiments of the present invention, Reference Example 1 and Reference Example 2 have a common subject to prevent dielectric breakdown between a high voltage region and a low voltage region which are disposed at an interval in a direction (horizontal direction) along the surface of the insulating layer. The forms achieve the subject respectively by providing structures A to C arranged to prevent breakdown between a high voltage region and a low voltage region.

One embodiment of the present invention discloses a capacitor 80 as an example of structure A: an electric field shield portion (the electric field shield is preferably a capacitor composed of a plurality of electrode plates which face each other at intervals in a horizontal direction) constituted of an electrically floated metal member. Reference Example 1 discloses an insulating layer 28 constituted of an $SiO_x$ (0<x<2) film having an Si ratio higher than Sift or an SiN film having compressive stress as an example of structure B: a compressive stress film which is provided in contact with a high voltage region and has compressive stress as internal stress. Reference Example 2 discloses a homogeneous interface structure 112 constituted of Sift/Sift as an example of structure C: a homogeneous interface structure which is formed by contact of insulating layers made of the same insulating material.

The structures A to C may be respectively employed alone or may be combined with each other in order to achieve further high voltage resistance. For example, all of the structures A to C may be provided between the high voltage region and the low voltage region, or a combination of the structure A and B, a combination of the structures A and C, or a combination of the structures A and C may be provided. As an example of a combination of the structures A and B, an etching stopper film 29 (compressive stress film) having compressive stress can be employed selectively for an insulating layer 28 where the upper coil 21 is embedded and an insulating layer 28 right above said insulating layer 28 in FIG. 6. Moreover, as an example of a combination of the structures A and C, a homogeneous interface structure 112 can be provided between the capacitor 80 and the high voltage region 36 or between the outer low voltage region 47 and the capacitor 80 in FIG. 6.

Moreover, components to be understood from disclosure in each of the above figures can be combined with components of another figure.

What is claimed is:

1. A semiconductor device comprising:
a first lead frame;
a first semiconductor chip bonded to the first lead frame;
a second lead frame;
a second semiconductor chip bonded to the second lead frame; and
an inductor chip mounted on the second lead frame, the inductor chip being placed between the first semiconductor chip and the second semiconductor chip in plan view,
wherein the inductor chip comprises:
a substrate;
a lower side inductor wiring formed over the substrate;
an upper side metal wiring layer formed over the lower side inductor wiring in sectional view, the upper side metal wiring layer including inner metal wirings disposed relative to each other with even pitches and an outermost peripheral metal wiring surrounding the lower side inductor wiring and the inner metal wirings in a plan view, wherein a distance between the adjacent wirings forming the inner metal wirings being less than a distance between the outermost peripheral metal wiring and an outermost wiring of the inner metal wirings, and the outermost peripheral metal wiring is not in direct contact with the substrate;
a first insulating material formed over the substrate, the lower side inductor wiring formed within the first insulating material, the outermost peripheral metal wiring being electrically isolated from the substrate by the first insulating material;
an electrode pad formed on the outside the lower side inductor wiring in a plan view, the electrode pad capable of applying an electric potential to the lower side inductor wiring;
a contact portion formed near a central part of the lower side inductor wiring such that the contact portion is in contact with the lower side inductor wiring, the electric potential from the electrode pad being applied to the lower side inductor wiring through the contact portion; and
wherein the outermost wiring of the inner metal wirings is apart from the outermost peripheral metal wiring such that a distance is constant between the outermost wiring and the outermost peripheral metal wiring at a whole part of the outermost wiring having a curvature.

2. The semiconductor device according to claim 1, wherein a second insulating material is disposed between the lower side inductor wiring and the upper side metal wiring layer.

3. The semiconductor device according to claim 2, wherein a coil protective layer is placed over the upper side metal wiring layer.

4. The semiconductor device according to claim 3, wherein the lower side inductor wiring is formed with adjacent wirings wherein the adjacent wirings of the lower side inductor wiring are disposed relative to each other with even pitches.

5. The semiconductor device according to claim 4, wherein a wiring pattern is connected between the electrode pad and the contact portion.

6. The semiconductor device according to claim 5, wherein the upper side metal wiring layer is made of a material including copper.

7. The semiconductor device according to claim 6, wherein the lower side inductor wiring is made of a material including copper.

8. The semiconductor device according to claim 7, wherein a control signal is supplied from the first semiconductor chip to the second semiconductor chip via the inductor chip.

9. The semiconductor device according to claim 8, wherein the first semiconductor chip, the second semiconductor chip, and the inductor chip are molded and formed as a Small Outline Package (SOP) package.

10. The semiconductor device according to claim 9, wherein the coil protective film is made of a material including a polyimide.

11. The semiconductor device according to claim 10, wherein metal wires are connected between the first semiconductor chip and the inductor chip.

12. The semiconductor device according to claim 11, wherein a high output voltage transistor with a high output voltage rating is formed in the second semiconductor chip, which high output voltage rating is higher than an output voltage rating of a low output voltage transistor formed in the first semiconductor chip.

13. The semiconductor device according to claim 12, wherein size of the inductor chip is smaller than the second semiconductor chip in plan view.

14. The semiconductor device according to claim 13, wherein size of the inductor chip is smaller than the first semiconductor chip in plan view.

15. The semiconductor device according to claim 14, wherein the upper side metal wiring layer is formed as including a rounded shape.

16. The semiconductor device according to claim 15, wherein the outermost peripheral metal wiring is separated from the lower side inductor wiring and the inner metal wirings electrically.

17. The semiconductor device according to claim 16, further comprising a second wiring having an upper surface formed between the lower side inductor wiring and the substrate such that the lower surface of the outermost peripheral metal wiring is opposed to the upper surface of the second wiring and is not electrically coupled to the second wiring.

18. The semiconductor device according to claim 17, wherein the second wiring is sandwiched between the lower side inductor wiring and substrate.

19. The semiconductor device according to claim 18, wherein no conductive structure is disposed between the upper surface of the second wiring and the lower surface of the outermost peripheral metal wiring.

20. The semiconductor device according to claim 19, wherein the coil protective film is thicker than a thickness of the upper side metal wiring layer.

21. The semiconductor device according to claim 20, wherein the outermost peripheral metal wiring is a shield wiring.

22. The semiconductor device according to claim 21, wherein the electrode pad is formed as a rectangular shape in plan view.

* * * * *